(12) United States Patent
Freeman et al.

(10) Patent No.: US 9,312,776 B2
(45) Date of Patent: *Apr. 12, 2016

(54) ELECTRICAL CIRCUIT FOR DELIVERING POWER TO CONSUMER ELECTRONIC DEVICES

(71) Applicant: Advanced Charging Technologies, LLC, Tulsa, OK (US)

(72) Inventors: Michael H. Freeman, Tulsa, OK (US); W. J. "Jim" Weaver, Jr., Broken Arrow, OK (US); Mitchael C. Freeman, Sapupla, OK (US); Robert Dieter, Owasso, OK (US); Glenn Noufer, Maintou Springs, CO (US); Randall L. Sandusky, Divide, CO (US); Jim Sesters, Colorado Springs, CO (US); Neaz E. Farooqi, Colorado Springs, CO (US); Jim Devoy, Florissant, CO (US); Jay Cormier, Laguna Niguel, CA (US); Silvia Jaeckel, Divide, CO (US); Andrea Baschirotto, Tortona (IT); Piero Malcovati, Pavia (IT)

(73) Assignee: ADVANCED CHARGING TECHNOLOGIES, LLC, Tulsa, OK (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/681,979

(22) Filed: Apr. 8, 2015

(65) Prior Publication Data

US 2015/0222192 A1 Aug. 6, 2015

Related U.S. Application Data

(63) Continuation of application No. 14/526,464, filed on Oct. 28, 2014, which is a continuation of application No. PCT/US2014/062740, filed on Oct. 28, 2014.

(60) Provisional application No. 62/069,672, filed on Oct. 28, 2014, provisional application No. 61/949,171, filed on Mar. 6, 2014, provisional application No. 61/896,557, filed on Oct. 28, 2013.

(51) Int. Cl.
*G05F 1/00* (2006.01)
*H02M 3/335* (2006.01)
(Continued)

(52) U.S. Cl.
CPC ............ *H02M 3/33538* (2013.01); *H02M 1/08* (2013.01); *H02M 3/07* (2013.01);
(Continued)

(58) Field of Classification Search
CPC ......... H02M 3/28; H02M 3/335; H02M 3/07; H02M 7/103; H02M 3/158; H02M 2001/007; H02M 2001/0045; H02M 3/156; H02M 3/073; H02M 1/08; H02M 3/33515; H02M 3/157; H02M 2001/0012; H02M 2001/0025; H02M 2001/0032; H02M 2001/0009; H02J 1/102; Y02B 70/16
USPC .............. 363/15, 16, 20, 21.01, 21.04–21.06, 363/21.09, 21.1, 59–61, 65, 89, 97; 323/224, 225, 266, 268, 271, 272, 345, 323/350, 351; 307/82, 109–110; 327/56
See application file for complete search history.

(56) References Cited

U.S. PATENT DOCUMENTS 5,717,581 A 2/1998 Canclini
7,436,239 B2 * 10/2008 Masuko et al. ............... 327/536

(Continued)

OTHER PUBLICATIONS

International Search Report and the Written Opinion (PCT/US14/62740); Date of Mailing: Jan. 22, 2015.

(Continued)

*Primary Examiner* — Adolf Berhane
*Assistant Examiner* — Alex Torres-Rivera
(74) *Attorney, Agent, or Firm* — Howard & Howard Attorneys PLLC

(57) ABSTRACT

An electrical circuit for providing electrical power for use in powering electronic devices is described herein. The electrical circuit includes a primary power circuit and a secondary power circuit. The primary power circuit receives an alternating current (AC) input power signal from an electrical power source and generates an intermediate direct current (DC) power signal. The intermediate DC power signal is generated at a first voltage level that is less than a voltage level of the AC input power signal. The secondary power circuit receives the intermediate DC power signal from the primary power circuit and delivers an output DC power signal to an electronic device. The output DC power signal is delivered at an output voltage level that is less than the first voltage level of the intermediate DC power signal.

27 Claims, 38 Drawing Sheets

(51) Int. Cl.
*H02M 1/08* (2006.01)
*H02M 3/07* (2006.01)
*H02M 3/158* (2006.01)
*H02M 3/157* (2006.01)
*H02M 1/00* (2007.01)

(52) U.S. Cl.
CPC ............. *H02M 3/073* (2013.01); *H02M 3/158* (2013.01); *H02M 3/33546* (2013.01); *H02M 3/157* (2013.01); *H02M 3/33515* (2013.01); *H02M 2001/007* (2013.01); *H02M 2001/0009* (2013.01); *H02M 2001/0012* (2013.01); *H02M 2001/0025* (2013.01); *H02M 2001/0032* (2013.01); *H02M 2001/0045* (2013.01); *Y02B 70/16* (2013.01); *Y10T 29/41* (2015.01)

(56) References Cited

U.S. PATENT DOCUMENTS

| | | | | |
|---|---|---|---|---|
| 7,456,677 | B1 * | 11/2008 | Rao et al. | 327/536 |
| 7,557,641 | B2 * | 7/2009 | Georgescu et al. | 327/536 |
| 8,120,931 | B2 * | 2/2012 | Chang | H02M 1/32 363/21.07 |
| 8,692,535 | B1 * | 4/2014 | Sreenivas et al. | 323/285 |
| 2003/0099122 | A1 | 5/2003 | Cho | |
| 2005/0036340 | A1 | 2/2005 | Scarlatescu | |
| 2007/0053211 | A1 | 3/2007 | Lanni | |
| 2007/0263417 | A1 * | 11/2007 | Lin | H02M 1/34 363/21.12 |
| 2009/0315615 | A1 * | 12/2009 | Likhterov | 327/536 |
| 2010/0244935 | A1 | 9/2010 | Kim et al. | |
| 2011/0032731 | A1 | 2/2011 | Coleman et al. | |
| 2012/0062205 | A1 * | 3/2012 | Levesque | H02M 3/1584 323/318 |
| 2013/0147445 | A1 * | 6/2013 | Levesque et al. | 323/271 |
| 2013/0181767 | A1 * | 7/2013 | Nakakuki et al. | 327/536 |
| 2013/0229832 | A1 * | 9/2013 | Patel et al. | 363/21.12 |
| 2013/0229841 | A1 * | 9/2013 | Giuliano | 363/60 |

OTHER PUBLICATIONS

Patent Examiner Report No. 1 (AU 2014334523); Date of Issue: Dec. 1, 2015.

* cited by examiner

| Switch Name | Phase 1 | Phase 2 G=1/2 | Phase 2 G=2/3 | Phase 2 G=1 |
|---|---|---|---|---|
| S1 | On | Off | Off | Off |
| S2 | Off | On | On | On |
| S3 | Off | Off | Off | On |
| S4 | On | Off | Off | Off |
| S5 | Off | On | Off | Off |
| S6 | Off | Off | On | Off |
| S7 | On | Off | Off | On |
| S8 | On | Off | Off | Off |
| S9 | Off | On | On | Off |

Charge Phase (Phi1)          Discharge Phase (Phi2)

Switched Capacitor Gain: 1x

Switched Capacitor Gain: 1/2x

Switched Capacitor Gain: 2/3 x

POR Threshold Voltages

ELECTRICAL CIRCUIT FOR DELIVERING POWER TO CONSUMER ELECTRONIC DEVICES

CROSS-REFERENCES TO RELATED APPLICATIONS

This application is a continuation of U.S. patent application Ser. No. 14/526,464, filed Oct. 28, 2014, which claims priority to U.S. Provisional Patent Application Ser. No. 62/069,672, filed Oct. 28, 2014, claims priority to U.S. Provisional Patent Application Ser. No. 61/949,171, filed Mar. 6, 2014, claims priority to U.S. Provisional Patent Application Ser. No. 61/896,557, filed Oct. 28, 2013, and claims priority to PCT Patent Application No. PCT/US2014/062740, filed Oct. 28, 2014, all of which are hereby incorporated by reference in their entirety for all purposes.

FIELD OF THE INVENTION

The present invention relates generally to electrical power circuits and, more particularly, to an electrical power circuit for providing electrical power for use in charging and/or powering consumer electronic devices.

BACKGROUND OF THE INVENTION

The Energy Crises Requires Demand Side Response That Lowers Current Loads. The Energy Crisis is upon us worldwide. For instance, the U.S. Department of Energy predicts that by 2015 there will not, on the average, be enough electric power to supply average demand in the U.S.

One of the controllable offenders is "Vampire Loads". Also called "Wall Wart Power" or "Standby Power", this electricity waste is estimated by the U.S. Department of Energy (DOE) to be in excess of 100 Billion kW annually, costing over Ten Billion Dollars in wasted energy. Vampire Load producers includes cell phone chargers, lap top chargers, notebook chargers, calculator chargers, small appliances, and other battery powered consumer devices.

The U.S. Department of Energy said in 2008:

"Many appliances continue to draw a small amount of power when they are switched off. These "phantom" loads occur in most appliances that use electricity, such as VCRs, televisions, stereos, computers, and kitchen appliances. This can be avoided by unplugging the appliance or using a power strip and using the switch on the power strip to cut all power to the appliance."

According to the U.S. Department of Energy, the following types of devices consume standby power:

1. Transformers for voltage conversion. (Including cell phone, lap top and notepad, calculators and other battery powered devices that use wall chargers).
2. Wall wart power supplies powering devices which are switched off. (Including cell phone, lap top and notepad, calculator, battery powered drills and tools, all of which have wall chargers and have either completely charged the batteries or are actually disconnected from the device).
3. Many devices with "instant-on" functions which respond immediately to user action without warm-up delay.
4. Electronic and electrical devices in standby mode which can be awakened by a remote control, e.g. some air conditioners, audio-visual equipment such as a television receiver.
5. Electronic and electrical device which can carry out some functions even when switched off, e.g. with an electrically powered timer. Most modern computers consume standby power, allowing them to be awakened remotely (by Wake on LAN, etc.) or at a specified time. These functions are always enabled even if not needed; power can be saved by disconnecting from mains (sometimes by a switch on the back), but only if functionality is not needed.
6. Uninterruptible power supplies (UPS)

All this means that even when a cell phone, lap top or like device is completely charged, current is still flowing, but not accomplishing anything and wasting electricity. More recently manufactured devices and appliances continue to draw current all day, every day—and cost you money and add to the Energy Crisis Worldwide.

The National Institute of Standards and Technology (NIST) (a division of the U.S. Department of Commerce) through its Buildings Technology Research and Development Subcommittee in 2010 stated its goals for reducing "plug loads," stating:

"The impact of plug loads on overall consumption is quite significant. For commercial buildings, plug loads are estimated at 35% of total energy use, for residential 25%, and for schools 10%.

Opportunities for lowering plug loads include:
1) more efficient plugged devices and appliances,
2) automated switching devices that turn off unused appliances and reduce "vampire" loads from transformers and other small but always on appliances, or
3) modifying occupant behaviors."

One of the problems experienced by virtually all modern electronics is that power supplies, whether external or embedded "power modules", are not energy efficient. This is true for a number of reasons, one of which dates back to 1831 when Michael Faraday invented the transformer. Transformers are inherently inefficient because, as an analog device, they can only produce one power output for each specific winding. So if two power outputs are necessary, two secondary windings are necessary. Moreover, there are often over 50 parts and pieces that are necessary to work with a transformer to create a common modern external power supply, the numbers only get somewhat lower with internal or embedded power modules. The number of parts in a power supply is inherently inefficient because current must travel in, around and through the various parts, each with different power dissipation factors; and even the circuit traces cause resistive losses creating energy waste.

Further, the way a transformer works is creating and collapsing a magnetic field. Since all of the electrons cannot be "recaptured" by the magnetic field creation/collapse, those that escape often do so as heat, which is why cell phone, lap top and tablet chargers feel warm or hot to the touch. It is also the primary reason why all consumer electronics create heat, which not only wastes energy/electricity, but causes eventual detrition through heating of other associated electronic parts.

Another inefficiency found in current electronics is the need for multiple internal power supplies to run the different parts. For instance, in the modern world power modules, MOSFETS have become a more and more important part of the "real world" interfaces in circuitry.

Metal-oxide-semiconductor field-effect transistors (MOSFETs) enable switching, motor/solenoid driving, transformer interfacing, and a host of other functions. At the other end of the spectrum is the microprocessor. Microprocessors are characterized by steady reduced operating voltages and currents, which may be 5 volts, 3.3 volts, 2.7 volts or even 1.5 volts. In most systems the MOSFETS and microprocessors are used together or in combination to make the circuitry work. However, most often the microprocessor and the drivers for the MOSFETS operate at different voltages, causing the need for multiple power supplies within a circuit.

A standard high-voltage NMOS MOSFET requires a driver that can deliver a gate voltage of 5-20 volts to successfully turn it on and off. In the case of turn on, there is actually a requirement that the gate driver voltage exceed the rail power to be effective. Specialty drivers using charge pump technology have been devised for this purpose. The other main function of the high-voltage MOSFET gate driver is to have a reduced input drive requirement making it compatible with the output drive capability of modern CMOS processor.

This MOSFET/driver arrangement, common in most external power supplies, like chargers, actually requires three separate power supplies. The first power supply needed is the main power rail, which is normally composed of the rectified Line voltage in the range of 127 VDC to 375 VDC supplied to the MOSFET. The second power supply needed is the 15 volts (or higher) required by the MOSFET drivers. Finally, the microprocessors require another isolated power supply for their many different and varying voltages.

A good example of the current inefficiencies and energy waste is found in a typical television, which requires as many as four to six different power supply modules to run the screen, backlighting, main circuit board, and sound and auxiliary boards. This current system requires multiple transformers and dozens of parts for each power supply needed. The transformers and the parts (including MOSFETS) multiply heat through their duplicated inefficiencies, which is one reason the back of a television is always hot to the touch. In addition, the more transformers that are needed for various power outputs, the more parts are needed, and more causation for energy waste is created.

In addition to the heat problem, the multiple transformer based power supplies all need typically from forty to sixty parts to operate, requiring dozens of parts for a typical transformer based television power supply module which increases costs and total component size while decreasing reliability. With the multiplicity of parts comes increased system resistance which ends up in wasted energy as heat.

The present invention is aimed at one or more of the problems identified above to provide better efficiencies and create more control over electrical inrush currents from rail sources.

SUMMARY OF THE INVENTION

In one aspect of the present invention, an electrical circuit for providing electrical power for use in charging applications and/or powering a constant supply circuit for electronic devices is provided. The electrical circuit includes a primary power circuit that is adapted to be electrically coupled to an electrical power source, and a secondary power circuit that is electrically coupled to the primary power circuit. The primary power circuit is configured to receive an alternating current (AC) input power signal from the electrical power source and generate an intermediate direct current (DC) power signal. In the AC input case, the intermediate DC power signal is generated at a first voltage level that is less than the voltage level of the AC input power signal. The secondary power circuit is configured to receive the intermediate DC power signal from the primary power circuit and deliver an output DC power signal to an electronic device. The output DC power signal is delivered at an output voltage level that is less than the first voltage level of the intermediate DC power signal.

In another aspect of the present invention, a power module for providing electrical power for use in powering electronic devices, like monitors, televisions, white goods, data centers, and telecom circuit boards, is provided. The power module includes a rectifier circuit, a switch capacitor voltage breakdown circuit and controller integrated circuit, and a forward converter circuit. The rectifier circuit receives an AC power input signal from an electrical power source and generates a rectified DC power signal. The switch capacitor voltage breakdown circuit and controller integrated circuit receives the rectified DC power signal and generates an intermediate DC power signal based upon an integrated controller which senses the voltage level of the AC power input signal and adjusts the gain of the switch capacitor voltage breakdown circuit as a function of the sensed voltage level. The forward converter circuit includes a transformer that receives the intermediate DC power signal and generates an output DC power signal that is delivered to the electronic device.

In a further aspect of the present invention, a high-efficiency switch capacitor voltage breakdown circuit for AC-DC and DC-DC conversion is provided. The high-efficiency switch capacitor voltage breakdown circuit includes a pair of flyback capacitors electrically coupled in parallel, and a plurality of switch assemblies that are electrically coupled to each of the pair of flyback capacitors. In one embodiment, the gates between the capacitors are shared. The switch assemblies may be operated to selectively deliver an input DC power signal to each of the pair of flyback capacitors during a charge phase, and to selectively deliver an output DC power signal to an electronic device during a discharge phase that has a lower voltage level than the input DC power signal. At least one switch assembly may include an N-channel MOSFET switch and a level shifter for delivering a control signal to the N-channel MOSFET switch. In addition, a dickson charge pump may be coupled to the level shifter to receive the input DC power signal and generate an output power signal having a higher voltage level than the input DC signal. The output power signal is delivered to the level shifter for use in operating N-channel MOSFET switch (or closing for other types of MOSFETs). In addition, the switch capacitor voltage breakdown circuit may include a control circuit that includes a voltage sensing circuit for sensing a voltage level of the input DC power signal and a gain controller configured to select a gain setting of the switch capacitor voltage breakdown circuit as a function of the sensed voltage level and operate each of the plurality of switch assemblies as a function of the selected gain setting.

The electrical circuit may also includes a vampire load elimination system that is configured to determine when a consumer device has finished charging and/or is disconnected from the power circuit, and operates the power circuit to disconnect the supply of power to the power circuit and/or the electronic device, and also capable of creating a flea powered "stand-by" mode.

In another aspect of the invention, the power circuit is formed on a semiconductor chip that includes analog and digital components on the same chip. A semiconductor process such as a 350V Silicon-on-Insulator (SoI) BCD process could be used for the semiconductor, which would permit the integration on one die of the microcontroller, timer/quartz real-time clock, PID controller and PWM controllers, MOSFETs, and corresponding drivers. In addition, the typical specific capacitance in CMOS technology ranges from 0.1 fF/µm2 (polypoly capacitors) to 5 fF/µm2 (MIM capacitors) or ceramic capacitors can be considered. Moreover, a process like DMOS can be used, or a bi/substrate can be considered, such as a layer of Silicon Carbonate, with Gallium Nitrate or Silicon Dioxide bi/substrata's also can be used. Or alternatively, Gallium Nitrate or Gallium Arsenide and the use of Deep Trench capacitors could be used for construction of the chip rather than silicon. All of these options are necessary because of the capacitance needed with the low $R_{on}$ MOSFETS or transistors.

A BCDMOS process may be used to manufacture the power circuit. BCDMOS includes a process for integrating Bipolar (analog), CMOS (logic) and DMOS (power) functions on a single chip for ultra high voltage (UHV) applications. BCDMOS provides a broad range of UHV applications such as LED lighting, AC-DC conversion and switched mode power supplies. Capable of operating directly "off line" from a 110/220 VAC source, integrated circuits (ICs) implemented with a non-Epi process can deploy optimized 450V/700V DR-LDMOS transistors that specify low on resistance and a breakdown voltage that exceeds 750V. When used in power switching applications, designers can expect lower conduction and switching losses.

BRIEF DESCRIPTION OF THE DRAWINGS

Other advantages of the present invention will be readily appreciated as the same becomes better understood by reference to the following detailed description when considered in connection with the accompanying drawings wherein.

Corresponding reference characters indicate corresponding parts throughout the drawings.

DETAILED DESCRIPTION OF INVENTION

Figure 1:
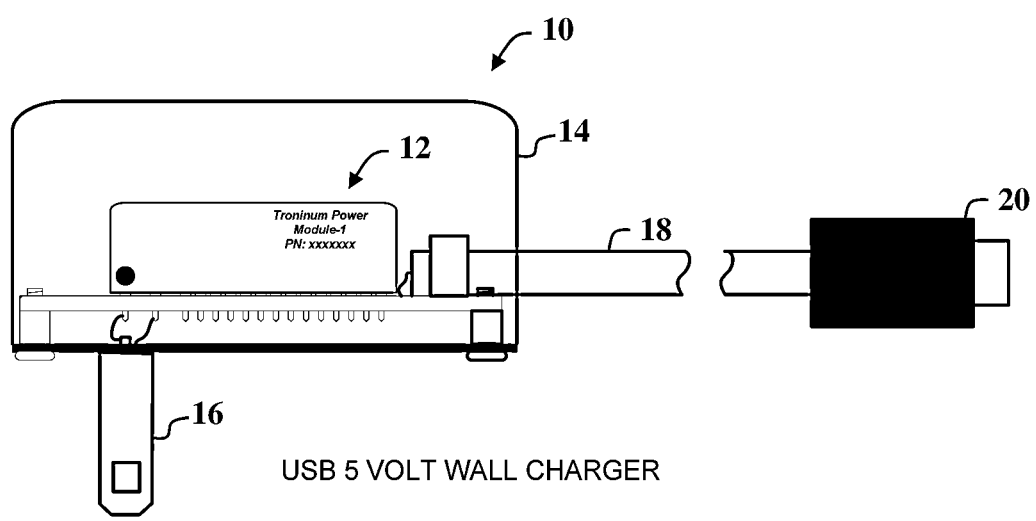
FIG. 1 is a schematic diagram of an electronic charging device for use in providing electrical power to electronic devices, according to an embodiment of the present invention.

With reference to the drawings and in operation, the present invention overcomes at least some of the disadvantages of known power delivery systems by providing a power module that includes a power circuit that provides DC voltage output power to consumer electronic devices from an AC mains supply (typically 120 VAC (US) to 240 VAC[EU/Asia]). The power circuit is configured to provide electrical power to charge electronic storage devices and/or power consumer electronic products including, but not limited to, a cell phone, a smartphone, a tablet computer, a laptop, and/or any suitable electronic device that may benefit from this invention due to extremely high efficiencies and very low stand-by power requirements. In general, the power circuit includes a primary power circuit and a secondary power circuit for receiving high voltage AC power from an electrical power source and delivering a low voltage DC power signal to one or more electronic devices. The primary power circuit receives the AC power signal from an AC power supply and generates an intermediate direct current (DC) power signal at a reduced voltage level. The secondary power circuit receives the intermediate DC power signal from the primary power circuit and generates and delivers an output DC power signal having a voltage level suitable for use in powering and/or charging consumer electronic devices.

The primary power circuit includes a rectification circuit for receiving the AC power signal and generating a rectified DC power signal, and a switch capacitor voltage breakdown circuit for dividing the rectified DC voltage to a reduced voltage for use by the secondary power circuit. The switch capacitor voltage breakdown circuit includes fly-back capacitors to maximize power efficiency and a hold capacitor to minimize the voltage ripple. In one embodiment, the switch capacitor voltage breakdown circuit is configured to deliver up to 50 mA and maintain ≥95% efficiency across the range of load currents from 50 mA to less than 1 mA under light load conditions. The primary power circuit may also include a switch-mode buck regulator that is connected in parallel with the switch capacitor voltage breakdown circuit for handling large current loads, for example, up to 430 mA of current. The buck regulator may include a P-channel MOSFET switch, a high voltage buck diode, and a buck energy storage inductor. In addition, the buck regulator may also include a pulse-width modulator (PWM) controller for generating a pulse width modulated signal to control the on/off time of the buck regulator PMOSFET, which may also be expressed as an NMOSFET with the appropriate gate drivers.

The secondary power circuit includes a forward converter power circuit that includes a transformer for receiving the intermediate DC power signal from the primary power circuit and generating the output DC power signal. The forward converter also includes a MOSFET connected to the primary side of the transformer and a control circuit to operate the MOSFET to regulate the voltage at the output of the forward converter as load current is drawn from the secondary-side of the transformer. For example, the forward converter control loop may be configured to regulate the output voltage under heavy fluctuation (4.5 nA to 4.5 A) of load current without triggering any instability.

In the modern world, the MOSFET has become a more and more important part of "Real World" interfaces. It enables motor/solenoid driving, transformer interfacing, and a host of other functions. At the other end of the spectrum is the Microprocessor. It is characterized by steadily reduced operating voltages and currents. In many systems these parts are used together. A standard high-voltage MOSFET requires a driver that can deliver on the order of a 5v to 20v volt swing to the FET gate in order to successfully turn the FET on or off. In the case of turn-on for an NMOSFET, it is actually required that this gate drive voltage exceed the power rail voltage. Specialty drivers using charge pump technology have been devised for this purpose, but they are typically discrete parts and increase the number of power rails needed on a circuit. The FET driver's other main function is to have a reduced input voltage requirement making it compatible with the output port capability of a modern CMOS microprocessor. This arrangement is costly in terms of power and typically requires three power supplies. First is the main power rail. It is composed of a voltage in the range of 100 to 600 volts supplied to the MOSFET. The second supply is the 5-20 volts required by the driver and finally is the supply required by the microprocessor. This present invention combines all these rails within the chip, such that the power and parts normally associated with the circuit are minimized and therefore efficiencies increased.

In many circumstances, the power supplies constitute a significant percentage of both the parts count and cost in a small system. A consolidated part can substantially alter this equation. This new part would consist of a combination of a high power MOSFET as the base part to which is added the appropriate driver with an included charge pump. Also added is the power supply required for the driver derived from the main rail supply internally. A final addition is an output pin to supply power for the microprocessor from this internal supply. In many modest systems the complete parts list would consist of this new device, the microprocessor, and the main power rail parts. This would allow the next generation of low cost/low assembly count microprocessor subsystems.

The power module includes the advanced power supply system on a chip (Tronium PSSoC), which is the subject of this present invention, including a controller application specific integrated circuit (ASIC) to provide a low-cost, highly efficient means to convert the AC line voltage present at a typical home or business electrical outlet to a reduced regulated DC voltage for consumer electronic applications. Typical applications include, but are not limited to, charging systems for cell-phones, tablets or other handheld devices, USB power conversion, power supplies for consumer, medical and industrial devices, and many other possible uses.

The Tronium PSSoC is configured for use in two primary power module applications including an Autonomous Power Module and a Universal Power Module. The Autonomous Power Module operates in an autonomous mode of operation that is based upon an analog feedback approach for reduced cost. The Universal Power Module operates in a universal mode of operation that utilizes a microprocessor (µP) controller to provide feedback for regulation of the final output voltage, which can be one power rail which is controlled/monitored or more. Some key features of the Tronium PSSoC include, but are not limited to, 90 VAC to 264 VAC Line Voltage Operation (other input voltage either AC or DC may be used), Programmable Output Voltage, Hybrid switch capacitor voltage breakdown circuit & Switch-Mode Buck Regulator (which is synchronously rectified for efficiency) for DC-DC Conversion, PID Regulation Control Loop for High Accuracy, Digital State Machines for Current and Temperature Monitoring, Ultra-Low Power Dissipation for Idle (Vampire) Mode of Operation, Opto-Isolated Microprocessor Interface for Configuration and Control, I2C Slave Port for Manufacturing Test, auto-detect input voltage range: 127 VDC to 373 VDC (world-wide voltages 110 VAC-260 VAC), featured Out Power: 22.5 W (any wattage possible), hybrid voltage converter for high-efficiency operation, stacked Switch Capacitor Voltage Breakdown Modules, PID regulation loops with PWM gate drivers, power scaling function for high efficiency at multiple load levels and flea power Stand-by Mode, thermal sensing and shut-off, short circuit and over-current protection, adjustable no-load/light load shut-off with restart and control logic, selectable analog or digital control, minimal or no external circuitry part count and discrete device size, and optional digital interface for bi-directional communication.

In addition, the Switch Mode Buck Regulator circuit may include a what is typically know as a Buck/Boost circuit; or the Buck/Boost may be replaced with a SEPIC, Cúk, or Push Pull or other topologies. These will have synchronous rectification for efficiency and may either use a fly-back or forward convertor typologies.

The Tronium PSSoC is an advanced power controller integrated circuit that is configured to provide output voltage regulation with high-efficiency and high accuracy. The advanced features of the Tronium PSSoC provide the user with a multi-purpose device which can be used in a large variety of applications in either a "charger" mode or "constant supply" mode. Programmable output voltages (1.7V to 48V or higher) are possible with the Tronium PSSoC, with little or no loss of efficiency across a variety of current load conditions, which feature is called the "Dial-a-Voltage" feature. In addition, multiple output currents may be created by the combination of the Hybrid Circuit, or the Switch Capacitor Circuit by itself, so as to create multiple voltage/current combinations ranging typically from 1.7V to 48V, which is sufficient to power most electronic devices. This "Dial-a-Voltage" feature, is factory programmable or programmable by a customer with a proper code, so that the same chip may be used for a 1.7V output or a 48V output, with only nominal changes in any external components like the transformer winding and the FETs which drives the transformer.

The Tronium Power Supply System on a Chip (PSSoC) ASIC is an advanced power control device that enables high efficiencies across a very wide range of output power. While typical 'high efficiency' power supply controllers boast ~50% efficiencies down to 10% of full load, the Tronium device is intended to provide >90% efficiency down to and below 1% of full load.

The Tronium PSSoC provides a revolutionary topology for high voltage power conversion by implementing an intermediary voltage rail, allowing the power capabilities of the system to scale with the load demand. It also shrinks parts into the ASIC, minimizing external parts needed; and enables a wider range of transformer options for enhanced optimization of power with lower coil losses. The Tronium PSSoC also provides a PID switching controller with which to drive the primary side of a transformer if isolation is required, or other topologies of conversion and regulation. It also features either secondary or primary side control/feedback.

In one embodiment, the Tronium PSSoC uses a proprietary high-voltage intermediate voltage capacitor voltage breakdown conversion scheme, which can be used alone, or in combination with a switch-mode buck regulator to maintain high-efficiency regardless of the load voltage or current. When no current is being drawn by the load, the device will enter a low-current mode of operation of approximately ½ milliwatt in order to minimize and virtually eliminate the traditional 'vampire' current required to stay awake.

The Tronium PSSoC may include the following major circuit blocks: Intermediate Capacitor Voltage Break-Down Converter Module (CVBD Module) (can be one or more stages for desired current output); High-Voltage Single-Stage or Two-Stage switch capacitor voltage breakdown circuit; Proportional to Integral and Differential (PID) Regulator Control Block for PWM Control of Forward Converter; Switch-Mode Buck Regulator PID Controller (optional Hybrid typology for voltage output); Buck Regulator Switch Driver; Current and Temperature Sense Blocks; 12-bit ADC for Voltage and Current Monitoring; 10-bit DAC's for Feedback Control; Digital Control Block for Current Monitoring State Machine; Serial Input for Opto-Isolator Communications Interface; I2C Serial Interface Port for Test, Evaluation, Repair and Communication; Oscillators for generation of internal clock signals; Power Manager for On-Chip Voltage and Current Generation; Adapted for use with or without a microcontroller which can be embedded into the chip or external; Primary Side Sensing or Secondary Side Sensing Capabilities; and Synchronous forward convertor.

The power module may also include a Tronium PSSoC that includes both analog and digital control in order to optimize performance and efficiency. In order to enable not only analog control but also digital control the proper inputs and outputs must be available on the Tronium PSSoC. Given these availabilities, and coupled with power loop control from an internal clock—control of the clock can be driven and controlled with external signals. The novel approach is that these signals can be driven from the secondary side while the Tronium PSSoC sits on the primary side of the transformer.

Digital control is commonly accomplished on the same side of the isolation barrier. However, given that the Tronium PSSoC is inherently an isolated system, and end to end efficiency optimization is required, control from primary side or secondary back to primary side may be utilized. This is accomplished in a number of different ways given the Tronium implementation. This can be done with optocouplers transmitting the digital control signal from a microcontroller as well as analog signals from a current sense circuit. Furthermore, this can be accomplished by using a third winding on the isolation transformer.

Some or all of the circuits and/or electrical devices include in the power circuit may be integrated onto the chip using either a silicon process, Gallium nitride (GaN) or Gallium Arsenide (GaA), or by using Deep Trench Capacitors, or other available processes which provides high efficiency parts, if high efficiency is desired. Thus, one or all of these parts may be embedded in the ASIC rather than be external discretes, even the transformer, using the known transformer in silicon (or GaN-GaA) techniques. In addition, the use of MIM and MOM capacitors along with low $RDS_{ON}$ MOSFETS, integrated decoupling capacitors and/or flying capacitors ($C_{FLY}$), for ripple reduction, which in turn decreases the size of needed capacitors may be used where capacitors or FETS are called for herein. Also, the introduction of integrated inductors on chip helps achieve the highest efficiencies. Alternatively, the highest efficiency parts, like GaA, GaN or Schottky diode parts are to be used.

In addition, the capacitors may be nano-capacitors, and may be based upon ferroelectric and core-shell materials as well as those based on nanowires, nanopillars, nanotubes, and nanoporous materials.

The substrata for the Tronium PSSoC could be made from customary films currently used in capacitors (if external) or within semiconductor substrates such as high or low Ohmic silicon substrate, polysilicon, gallium nitride, gallium arsenide, silicon germanium or substances like silicon carbide or indium phosphide.

They key is on-board ASIC integration of as many discretes as possible where the process permits, and if efficiency is key then identification of low RDSon values, high efficient parts, and sufficient voltage break-down parts. Another key is to run the Switch Buck Module at higher frequencies, so that parts become smaller, and sufficiently smaller to become on-board chip devices.

A selected embodiment of the present invention will now be explained with reference to the drawings. It will be apparent to those skilled in the art from this disclosure that the following description of the embodiment of the present invention is provided for illustration only and not for the purpose of limiting the invention as defined by the appended claims and their equivalents.

Figure 2:
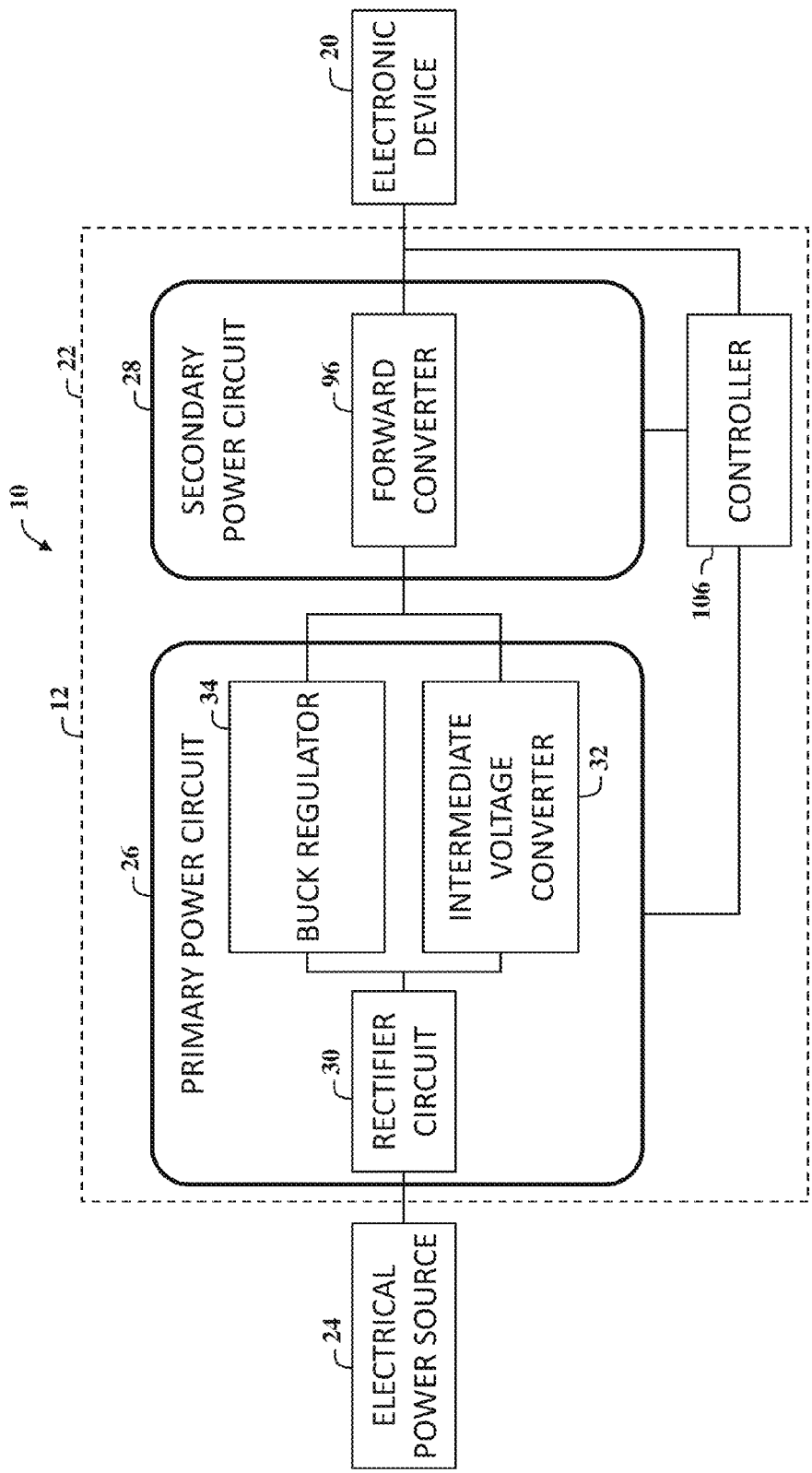
FIG. 2 is a block diagram of a power circuit that may be used with the charging device shown in FIG. 1, for use in providing electrical power to electronic devices, according to an embodiment of the present invention.

FIG. 1 is a schematic diagram of an electronic charging device 10 for use in providing electrical power to electronic devices. FIG. 2 is a block diagram of a power module 12 that may be used with the electronic charging device 10. In the illustrated embodiment, the electronic charging device 10 includes a housing 14, a pair of power prongs 16 extending outwardly from the housing 14 and a device connection assembly 18 that is adapted to connect to an electronic device 20 to deliver electric power from the charging device 10 to the electronic device. The electronic charging device 10 also includes the power module 12 that includes a power circuit 22 that is configured to receive power from an electrical power source 24 and deliver power to the electronic device 20 such as, for example, portable consumer electronic devices including, but not limited to, a cell phone, a smartphone, a tablet computer, a laptop, and/or any suitable electronic device. In addition, the power circuit 22 may deliver power for use in charging electronic storage devices such as, for example, mobile phone/laptop/tablet power storage batteries. In one embodiment, the power circuit 22 may be configured to provide low voltage DC output (typically 5 VDC) from an AC mains supply typically 120 VAC (US) to 264 VAC[EU/Asia].

In the illustrated embodiment, the power circuit 22 includes a primary power circuit 26 and a secondary power circuit 28. The primary power circuit 26 is adapted to be electrically coupled to the electrical power source 24 and is configured to receive an AC (or DC) input power signal from the electrical power source 24 and generate an intermediate direct current (DC) power signal. The intermediate DC power signal being generated at a first voltage level that is less than a voltage level of the AC input power signal. The secondary power circuit 28 is electrically coupled to the primary power circuit 26 and is configured to receive the intermediate DC power signal from the primary power circuit 26 and deliver an output DC power signal to the electronic device 20. The output DC power signal is delivered at an output voltage level that is less than the first voltage level of the intermediate DC power signal. For example, in one embodiment, the primary power circuit 26 is configured to receive the AC input signal having a voltage level between a range of 127 volts to 375 volts AC and to deliver the intermediate DC power signal at a voltage level of approximately 110 volts DC. The secondary power circuit 28 is configured to receive the intermediate DC power signal and deliver the output DC power signal at approximately 5 volts DC.

Figure 13:
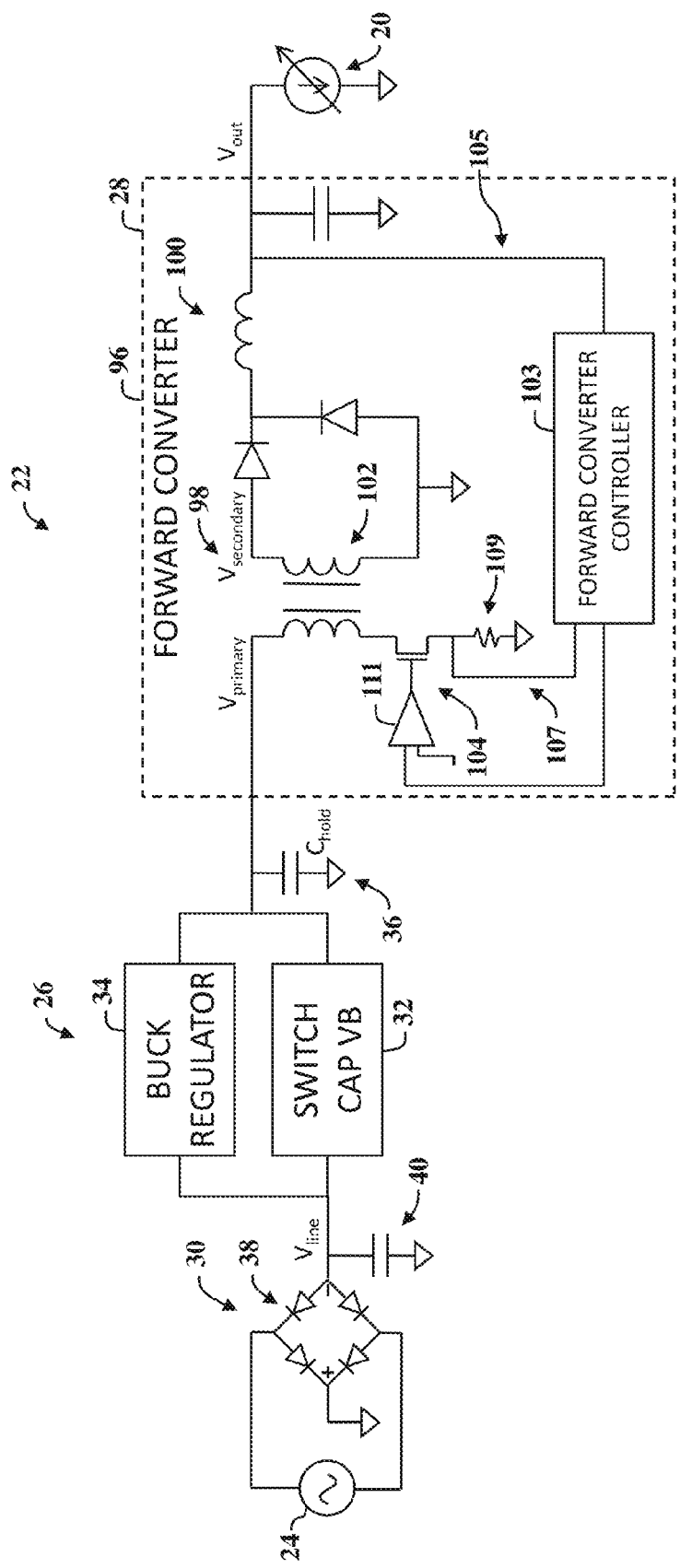
FIG. 13 is a schematic diagram of a forward converter circuit that may be used with the power circuit shown in FIG. 2, according to an embodiment of the present invention.
Figure 14:
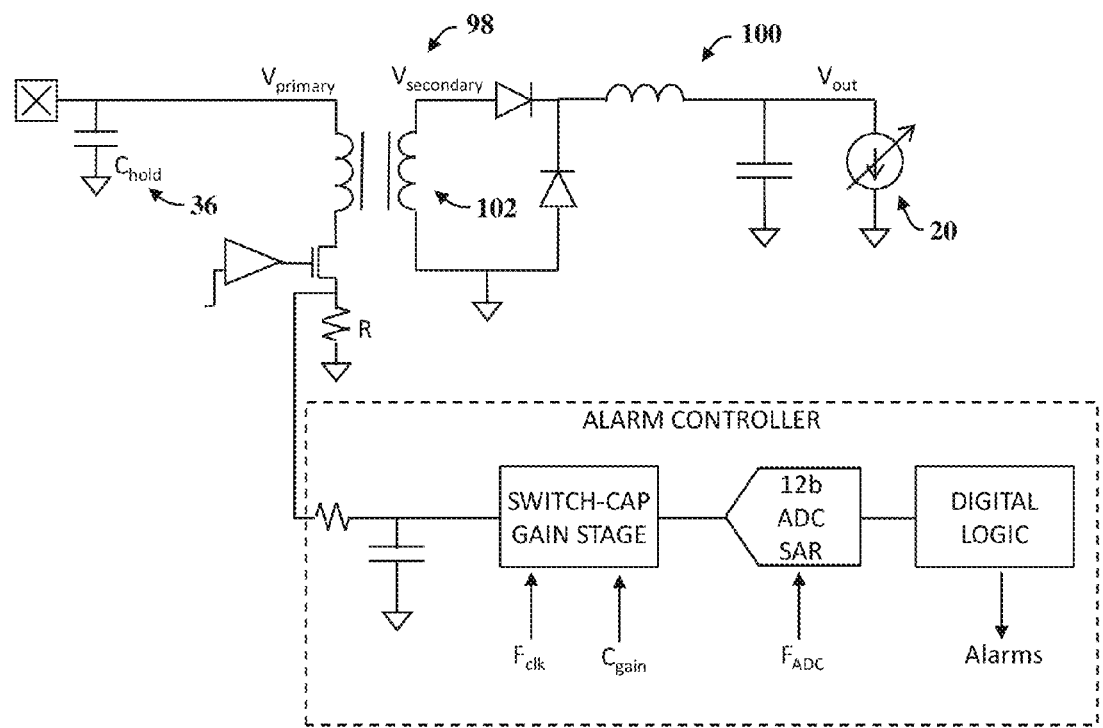
FIG. 14 is a schematic diagram of an alarm control circuit that may be used with the power circuit shown in FIG. 2, according to an embodiment of the present invention.

In the illustrated AC-DC embodiment, the primary power circuit includes a rectifier circuit 30, an intermediate voltage converter 32, a buck regulator 34, and a hold capacitor 36 that is electrically coupled to the intermediate voltage converter 32 and the buck regulator 34. The intermediate voltage converter 32 and the buck regulator 34 are coupled in parallel between the rectifier circuit 30 and the secondary power circuit 28. The rectifier circuit 30 is configured receive the AC power input signal from the electrical power source 24 and generate a rectified DC power signal that is delivered to the intermediate voltage converter 32 and the buck regulator 34. In one embodiment, the rectified DC power signal is delivered having a voltage level that is approximately equal to the voltage level of the AC input power signal. As shown in FIGS. 13 and 15, in the illustrated embodiment, the rectifier circuit 30 includes a plurality of diodes 38 that are arranged in a full-wave bridge rectifier having first and second input terminals coupled to the high and low sides of the electrical power source 24 for producing a DC power signal from an AC input power signal. In one embodiment, the rectifier circuit 30 may also include a filter capacitor 40 that is coupled to the full-wave bridge rectifier. In yet another embodiment, the rectifier circuit 30 does not include the filter capacitor 40. In another embodiment, the rectifier circuit 30 may include a half-bridge rectifier (not shown).

Figure 3:
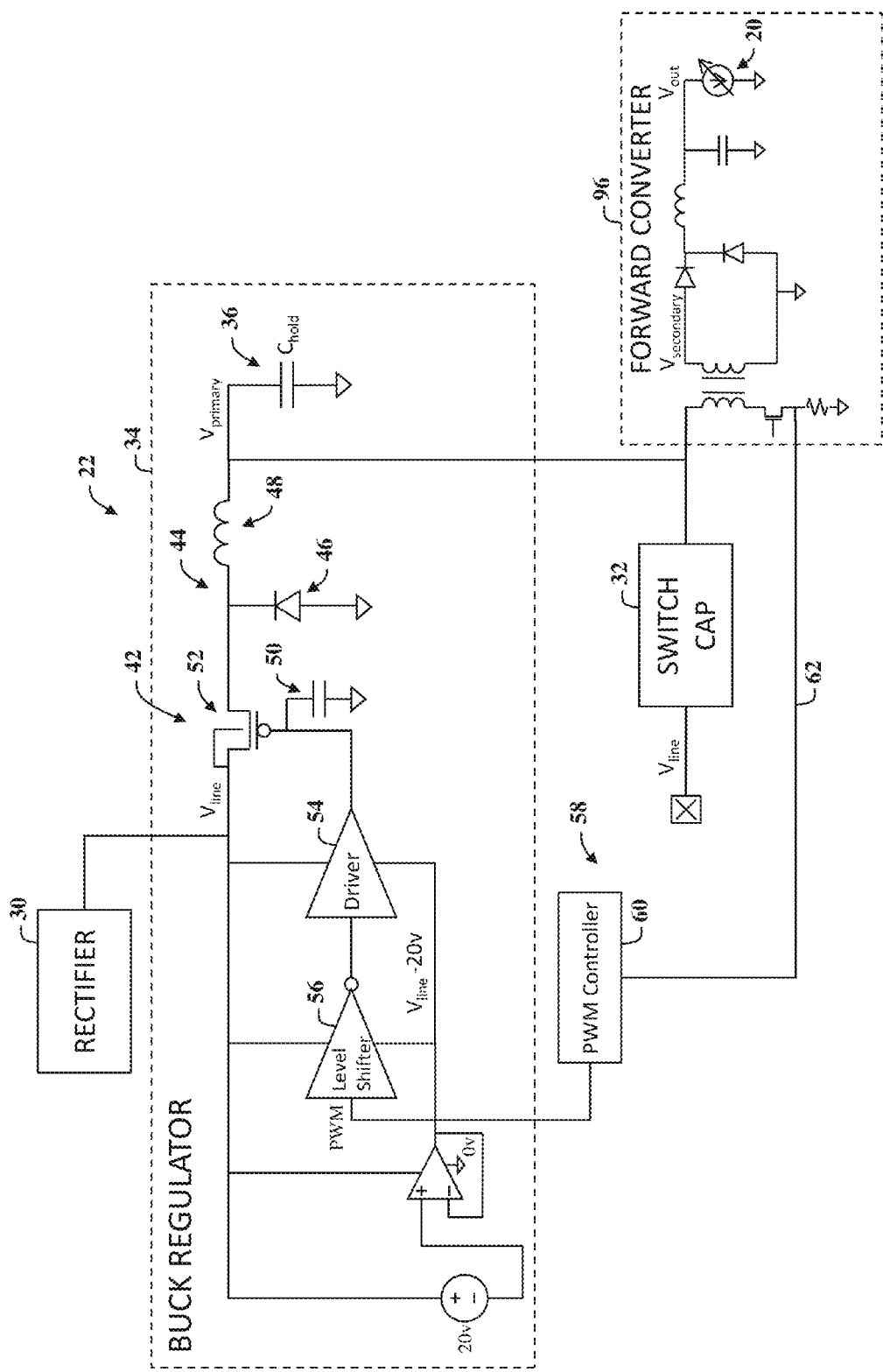
FIG. 3 is a schematic diagram of a buck regulator circuit that may be used with the power circuit creating a "Hybrid" voltage break-down circuit as shown in FIG. 2, according to an embodiment of the present invention.

FIG. 3 is a schematic diagram of the buck regulator circuit 34 that may be used with the power circuit 22. In the illustrated embodiment, the buck regulator circuit 34 includes a regulator switch assembly 42 that is coupled to a voltage reduction circuit 44. The voltage reduction circuit 44 includes a high voltage buck diode 46, a buck energy storage inductor 48, and a capacitor 50. The regulator switch assembly 42 is operated to selectively deliver the rectified DC power signal to the voltage reduction circuit 44. In the illustrated embodiment, the regulator switch assembly 42 includes a P-channel MOSFET 52, a driver circuit 54 that is coupled to the P-channel MOSFET 52, and a level shifter 56 that is coupled to the driver circuit 54. In one embodiment the regulator switch assembly 42 may include an N-channel MOSFET and/or a P-channel MOSFET. In the illustrated embodiment, the buck regulator 34 also includes a regulator control circuit 58 that includes a regulator PWM controller 60 (also shown in FIGS. 16, 17A, and 17B) for generating a pulse width modulated signal to control P-channel MOSFET 52. In one embodiment, the control circuit 58 may also include a voltage sensing circuit 62 that is connected to the primary side of the forward converter transformer for sensing the voltage level of the intermediate DC power signal being delivered to the secondary power circuit 28. The regulator PWM controller 60 may generate a pulse-width modulated control signal as a function of the sensed first voltage level to adjust a duty cycle of the PWM control signal being delivered to the P-channel MOSFET 52 to maintain the voltage level of the intermediate DC power signal. The Buck Regulator servo loop 58 is voltage controlled and the Vprimary is sensed and used to modulate the duty cycle of the driver 54.

In one embodiment, the sensing circuit 62 includes one or more Hall Effect sensors that are coupled to the primary side of the forward converter transformer for sensing a magnetic field being generated within the transformer. The Hall Effect sensors facilitate determining a zero-crossing of the transformer by directly sensing the magnetic field being generated by the transformer during operation. In one embodiment, the sensing circuit 62 includes a primary side Hall Effect sensor coupled to the primary side of the transformer. The primary side Hall Effect sensor is connected to the PWM controller 60 for transmitting a signal to the PWM controller 60 for use in determining when the transformer nears the "zero-crossing". In another embodiment, the sensing circuit 62 includes a secondary side Hall Effect sensor that is coupled to the secondary side of the transformer, and is connected to the forward converter controller (shown in FIG. 13) for transmitting a signal indicative of the transformer magnetic field for use in determining the time at which the transformer reaches the "zero-crossing".

Figure 11:
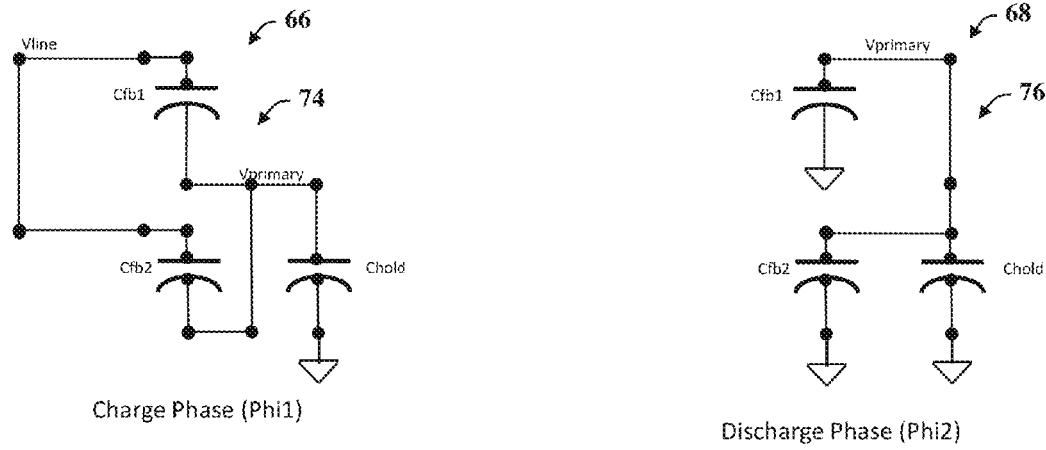
Figure 12:
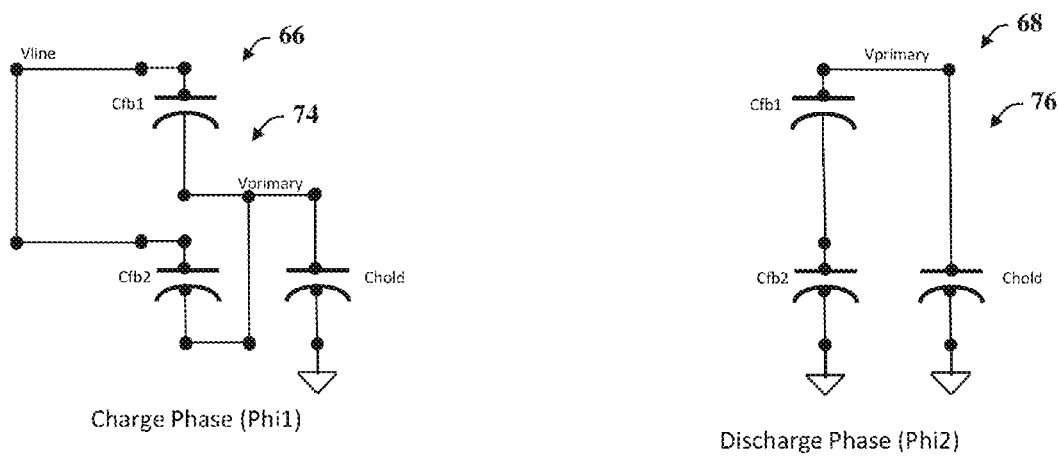

FIGS. 4-8 are schematic diagrams of the intermediate voltage converter 32. FIG. 9 is a table illustrating gain settings that may be used with the intermediate voltage converter 32. FIGS. 10-12 are schematic illustrations of the intermediate voltage converter 32 in a charge phase mode 66 and a discharge phase mode 68 for each of the gain settings shown in FIG. 9. In the illustrated embodiment, the intermediate voltage converter 32 includes a single-stage switch capacitor voltage breakdown circuit that is coupled to the hold capacitor 36 and the secondary power circuit 28. The switch capacitor voltage breakdown circuit includes a pair of flyback capacitors 70 that are electrically coupled in parallel and a plurality of switch assemblies 72 that are electrically coupled to each of the flyback capacitors 70. The switch assemblies 72 are selectively operated between the charge phase mode 66 and the discharge phase mode 68. During the charge phase mode 66 the switch assemblies 72 are operated to form a charging circuit 74 to connect the flyback capacitors 70 to the rectifier circuit 30 to deliver the rectified DC power signal to each of the flyback capacitors 70. During the discharge phase mode 68, the switch assemblies 72 are operated to form a discharging circuit 76 to connect the flyback capacitors 70 to the secondary power circuit 28 to deliver the intermediate DC power signal to the hold capacitor 36.

Figure 8:
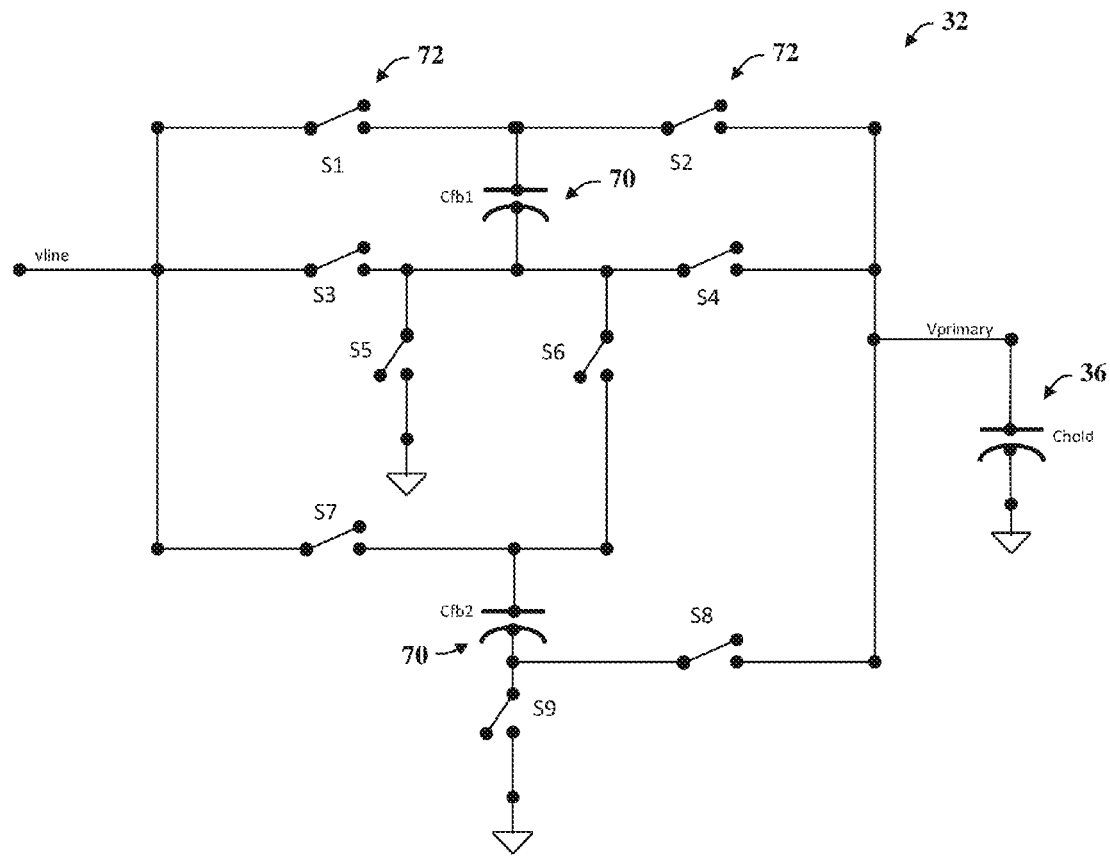
FIG. 8 is a schematic diagram of a portion of the switch capacitor voltage breakdown circuit shown in FIG. 4, according to an embodiment of the present invention.
Figures 9, 10:
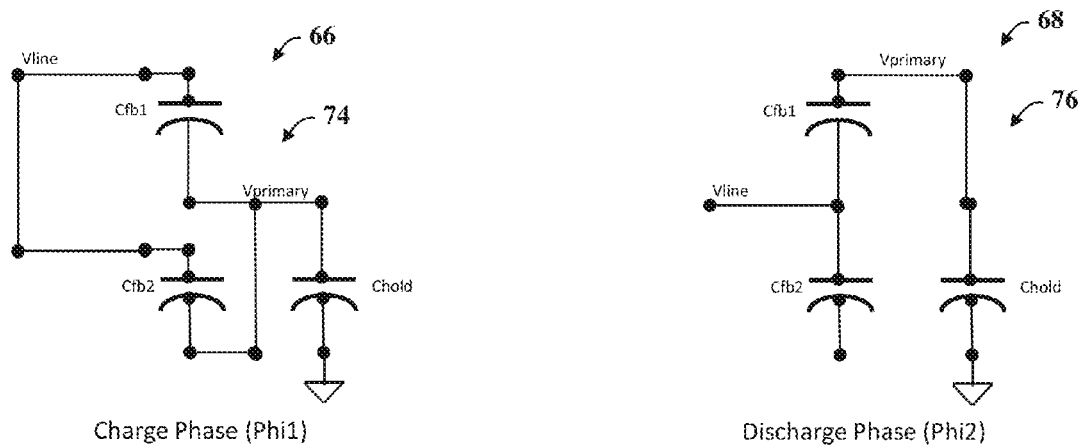
FIG. 9 is a table illustrating gain settings for use with the switch capacitor voltage breakdown circuit shown in FIG. 8, according to an embodiment of the present invention.
FIGS. 10-12 are schematic illustrations of the switch capacitor voltage breakdown circuit shown in FIG. 8 in a charge phase mode and a discharge phase mode associated with each of the gain settings shown in FIG. 9, according to an embodiment of the present invention.

In one embodiment, as shown in FIG. 8, the single-stage switch capacitor voltage breakdown circuit 32 may include a first flyback capacitor Cfb1 and a second flyback capacitor Cfb2, and nine switch assemblies S1, S2, S3, S4, S5, S6, S7, S8, and S9. In addition, two of the switch assemblies S3 and S9 are coupled to ground. During operation, the gain setting of the switch capacitor voltage breakdown circuit may be adjusted by selectively operating the switch assemblies according to the gain setting table shown in FIG. 9. For example, during the charge phase mode 66 (Phase 1), switches S1, S4, S7, and S8 are turned on and moved to a closed position and switch assemblies S2, S3, S5, S6, and S9 are turned off and moved to an open position to form the charging circuit 74 to connect the flyback capacitors Cfb1 and Cfb2 to the rectifier circuit 30. As shown in FIG. 10-12, in the charging circuit 74 the top plate of each flyback capacitor Cfb1 and Cfb2 are connected to the rectifier circuit 30 line voltage, Vline. For a gain setting equal to G=1×, during the discharge phase mode 68 (Phase 2), switch assemblies S2, S3, and S7 are turned on and switch assemblies S1, S4, S5, S6, S8, and S9 are turned off to form a discharging circuit 76 shown in FIG. 10 that includes the top plate of capacitor Cfb1 connected to the hold capacitor 36 and the top plate of capacitor Cfb2 connected to the bottom plate of capacitor Cfb1. With reference to FIGS. 9 and 11, for a gain setting equal to G=1/2×, during the discharge phase mode 68 (Phase 2), switch assemblies S2, S5, and S9 are turned on and switch assemblies S1, S3, S4, S6, S7 and S8 are turned off to form a discharging circuit 76 that includes the top plate of capacitor Cfb1 connected to the hold capacitor 36, the bottom plate of capacitor Cfb1 connected to ground, and the top plate of capacitor Cfb2 connected to the hold capacitor 36, the bottom plate of capacitor Cfb2 connected to ground. Referring to FIGS. 9 and 12, for example, a gain setting equal to G=2/3×, during the discharge phase mode 68 (Phase 2), switch assemblies S2, S6, and S9 are turned on and switch assemblies S1, S3, S4, S5, S7 and S8 are turned off to form a discharging circuit 76 that includes the top plate of capacitor Cfb1 connected to the hold capacitor 36, top plate of capacitor Cfb2 connected to the bottom plate of capacitor Cfb1, and bottom plate of capacitor Cfb2 connected to ground.

In one embodiment, multiple "stages" of the switch capacitor circuits, as explained herein, are linked together, which may be used to gain additional current output, with or without the need for the addition of the Hybrid power conversion/regulation circuits.

Figure 7:
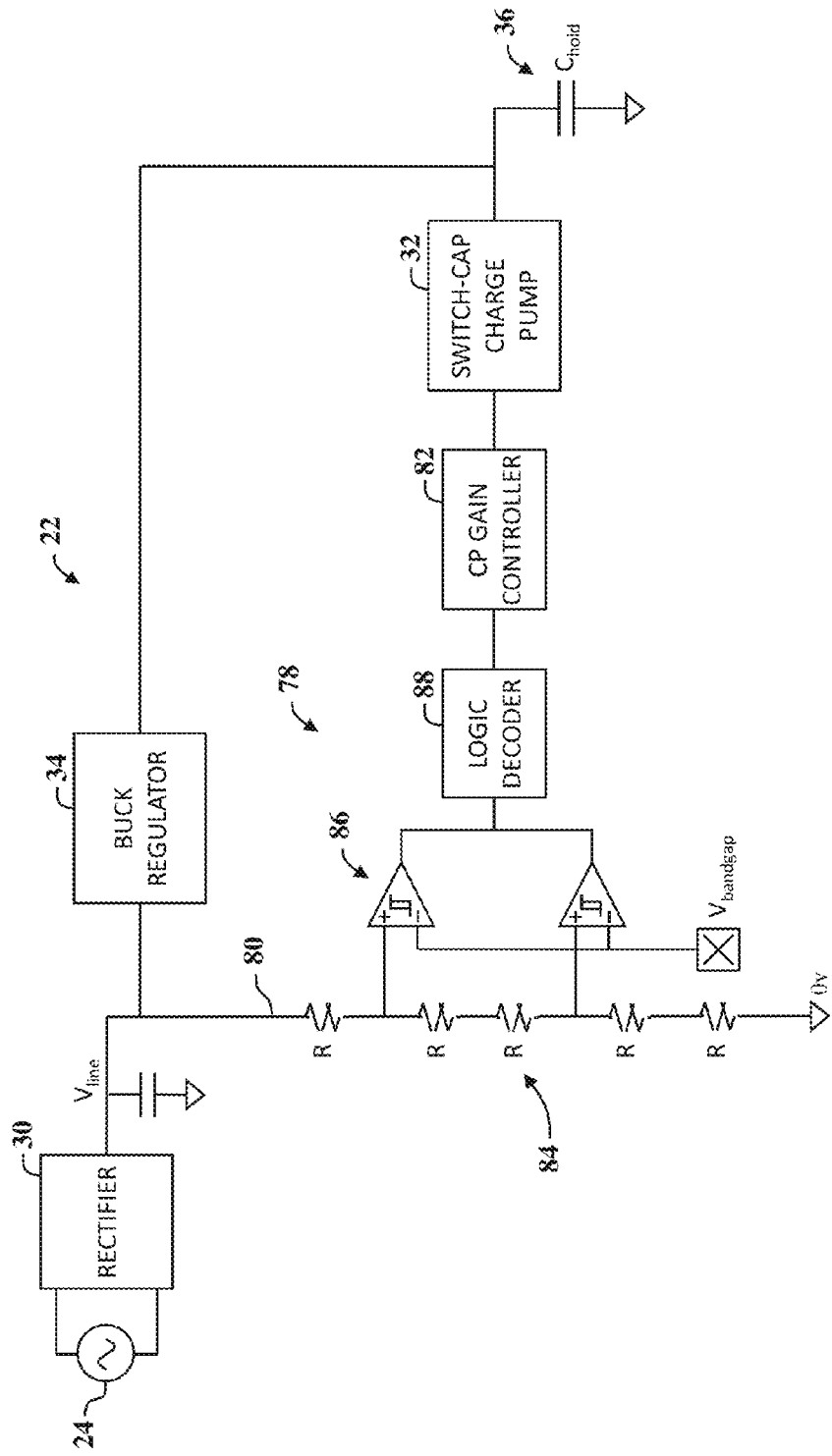

Referring to FIG. 7, in the illustrated embodiment, the switch capacitor voltage breakdown circuit 32 also includes a control circuit 78 that is coupled to each of the switch assemblies 72 to operate the switch capacitor voltage breakdown circuit 32. The control circuit 78 includes a voltage sensing circuit 80 for sensing a voltage level of the rectified DC power signal being received from the rectifier circuit 30 and a gain controller 82 that is configured to select a gain setting of the switch capacitor voltage breakdown circuit 32 as a function of the sensed voltage level and operate each of the plurality of switch assemblies as a function of the selected gain setting. By providing a control circuit 78 that selects the gain setting of the switch capacitor voltage breakdown circuit 32 as a function of the sensed input voltage level, the switch capacitor voltage breakdown circuit 32 is able to adjust the operation of the switch capacitor voltage breakdown circuit 32 to account for variations of AC voltage levels in different countries and/or power grids and deliver the intermediate DC output signal at a predefined voltage level and maintain optimum power efficiency. In the illustrated embodiment, the control circuit 78 includes a resistor divider 84, a pair of comparators 86, a logic decoder 88, and a gain controller 82. The negative input of the comparators 86 is connected to a bandgap generator and the positive inputs are connected to the rectifier circuit 30 line voltage, Vline.

Figure 4:
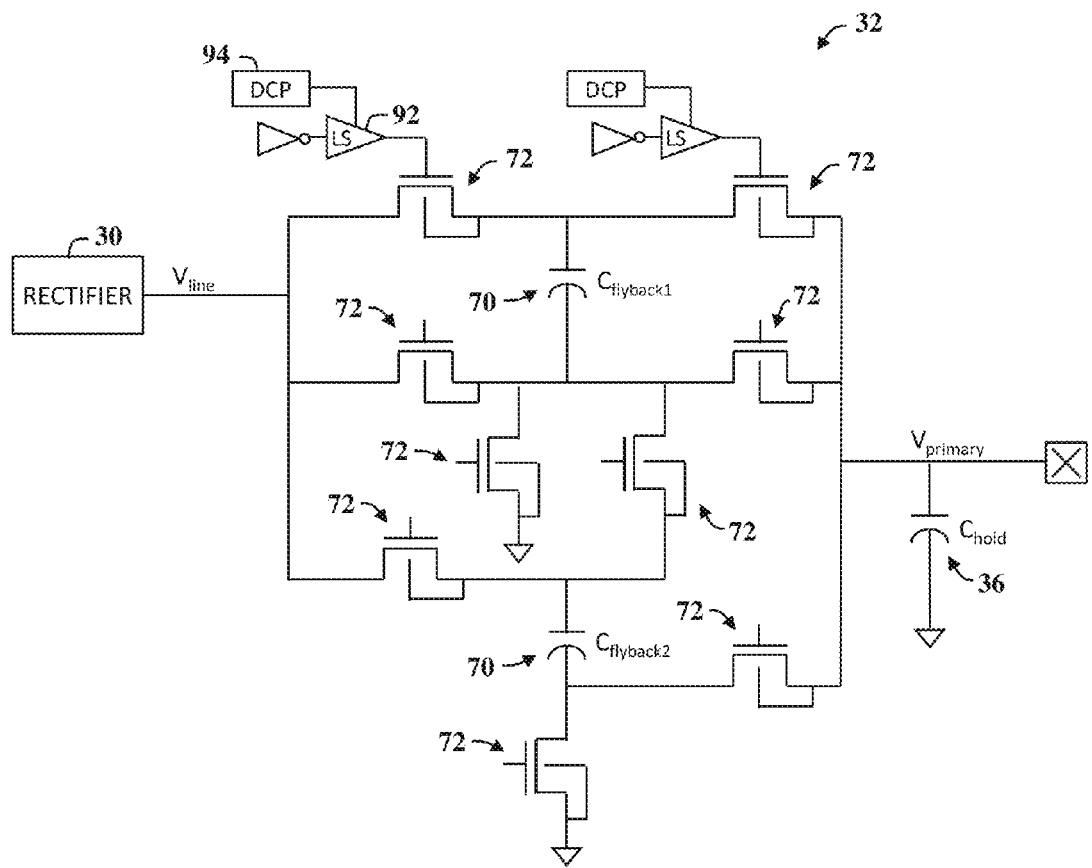
FIGS. 4-7 are schematic diagrams of a switch capacitor voltage breakdown circuit that may be used with the power circuit shown in FIG. 2, including the sharing of gates between capacitors for further reducing $RDS_{ON}$ losses, according to an embodiment of the present invention.
Figure 5:
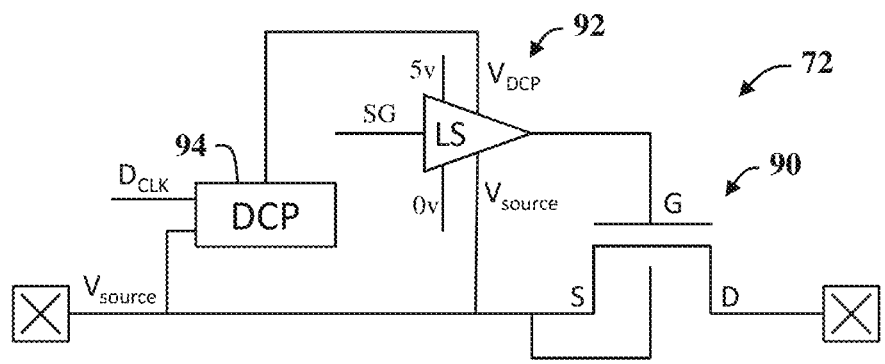
Figure 6:
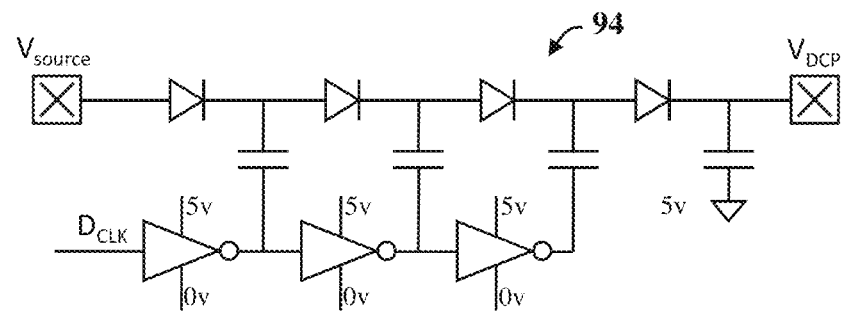

Referring to FIGS. 4-6, in the illustrated embodiment, one or more switch assemblies includes an N-channel MOSFET switch 90, and a level shifter 92 that is connected to the N-channel MOSFET switch 90 for delivering a control signal to the N-channel MOSFET switch 90 to facilitate operating the N-channel MOSFET 90. In addition, one or more switch assemblies 72 include a Dickson charge pump 94 that is connected to the level shifter 92 to provide a high-voltage signal required to close the N-channel gate during operation. The Dickson charge pump 94 is configured to generate an output power signal having a voltage level that is greater than a switch assembly source voltage to enable the level shifter 92 to operate the N-channel MOSFET switch 90. In one embodiment, each of the switch assemblies 72 includes an N-channel MOSFET 90, a level shifter 92 coupled to the N-channel MOSFET 90, and a Dickson charge pump 94 coupled to the level shifter 92. In another embodiment, two of more level shifters 92 may be connected to a single Dickson charge pump 94. Wherever in this specification the term NMOS is used, it could be substituted with a PMOS and vice versa.

In the illustrated embodiment, at least one switch assembly 72 includes a level shifter 92 that is connected to an N-channel MOSFET switch 90. In addition, a Dickson charge pump 94 is connected to the level shifter 92 to provide a power signal sufficient to close the gate of the N-channel MOSFET switch 90. In the illustrated embodiment, the Dickson charge pump 94 is connected to the source voltage, Vsource, of the N-channel MOSFET and is configured to deliver an output signal to the level shifter 92 that has a voltage level that is greater than the voltage level of the source voltage, Vsource in the case of using an NMOS. In one embodiment, the Dickson charge pump 94 is configured to deliver an output power signal, $V_{DCP}$, having a voltage level that is approximately 15-20 volts greater than the source voltage, Vsource in order to assure proper gate operation. The gain controller 82 is connected to the level shifter 92 for providing a low voltage control signal to the level shifter 92. The level shifter 92 is connected to the source voltage, Vsource, and to the Dickson charge pump 94, and is configured to deliver the control signal to the N-channel MOSFET 90 having a voltage level sufficient to operate the switch assembly 72 as a function of the received control signal.

FIG. 13 is a schematic diagram of the secondary power circuit 28 including a forward converter circuit 96. In the illustrated embodiment, the forward converter circuit 96 includes a primary voltage reduction circuit 98 and a secondary voltage reduction circuit 100. The primary voltage reduction circuit 98 is configured to receive the intermediate DC power signal from the primary power circuit 26 and deliver a secondary DC power signal to the secondary voltage reduction circuit 100. The secondary DC power signal has a voltage level that is less than the voltage level of the intermediate DC power signal. The secondary voltage reduction circuit 100 is configured to receive the secondary DC power signal and generate the output DC power signal being delivered to the electronic device 20.

Figure 37:
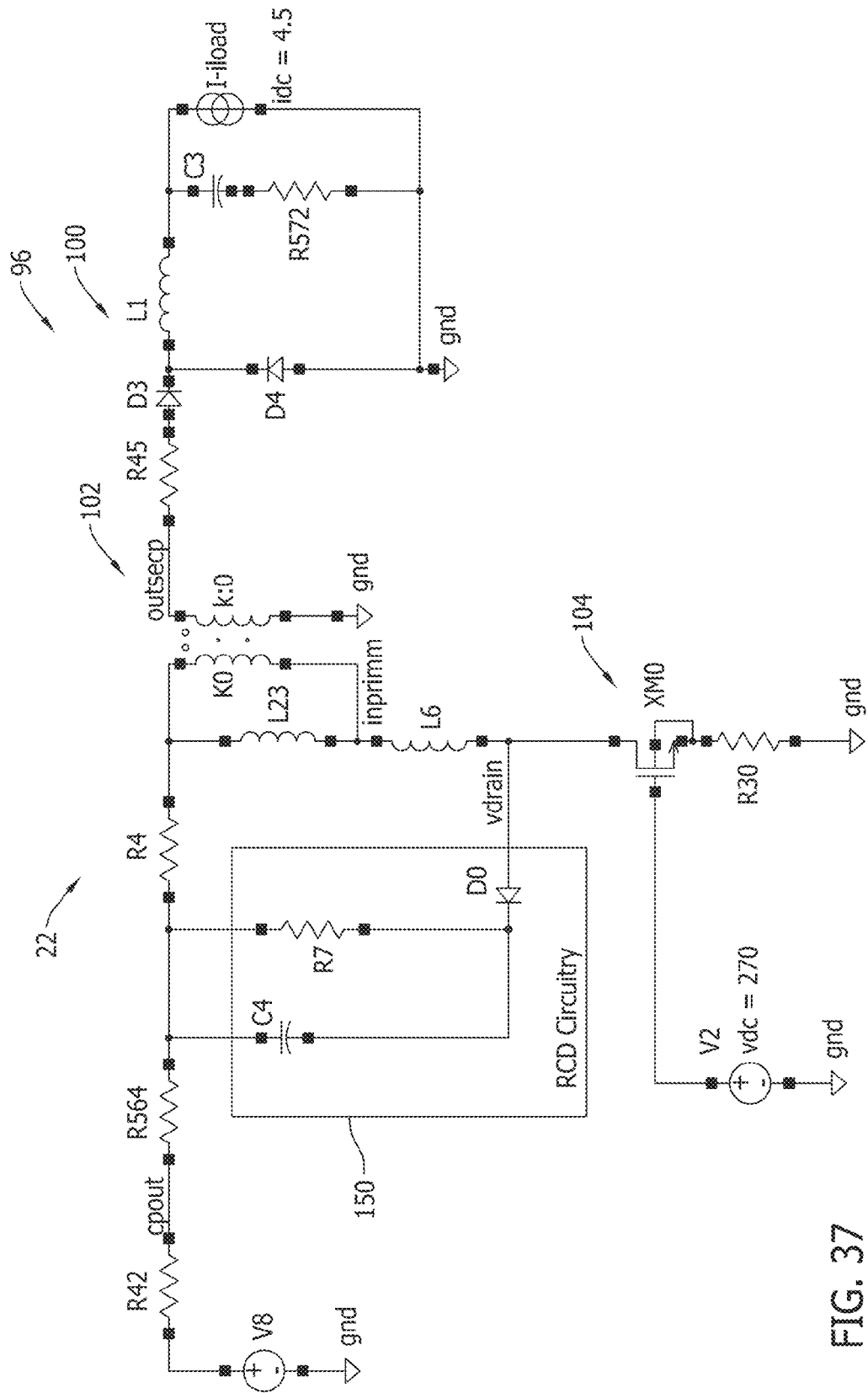
FIG. 37 is a schematic illustration of an RCD circuit that may be used with the forward converter circuit shown in FIG. 13, according to an embodiment of the present invention.

In the illustrated embodiment, the primary voltage reduction circuit 98 includes a transformer 102. The primary side of the transformer 102 is connected to the primary power circuit 26 and the secondary side of the transformer 102 is connected to the secondary voltage reduction circuit 100. In one embodiment, the primary voltage reduction circuit 98 may include a switch assembly 104 including a FET that is coupled to the transformer primary side, and a control circuit 103 that is coupled to the switch assembly 104 for selectively operating the switch assembly 104 to adjust a voltage level of the secondary DC power signal. The transformer control circuit 103 may include a primary side voltage sensing circuit 105 for sensing voltage and current level of the DC output signal and operate the transformer switch assembly 104 to maintain the voltage level of the DC output signal at a predefined output voltage level and required current level. In this fashion at least five parts are removed from the equation, which are normally needed with a secondary side sense controller, including an opto-coupler, opamp, an inductor, diode and a capacitor. The secondary voltage reduction circuit 100 includes a pair of diodes, an inductor, and a capacitor. The forward converter 96 may also include a resistor, capacitor, diode (RCD) circuit 150 (shown in FIG. 37). The RCD circuit 150 is configured to perform a transformer reset when the primary side switch 104 is off to avoid saturating the transformer 102. The forward converter 96 is a pulsed based step down converter. A duty cycle modulated digital pulse is applied to the primary side switch 104 to convert the incoming DC voltage to an AC voltage. The transformer winding ratio provides the step down. In this case, the step down is from 11:1. The secondary side sees an ac voltage on its terminals. This AC voltage is rectified by the secondary voltage reduction circuit 100 diodes and filtered by the LC filter to produce a stepped down DC voltage on the output. The duty cycle is modulated by either an analog or a digital servo loop. This servo loop looks at the dc voltage on the output side, compares it with a response to produce an error signal. This error signal is used to drive a comparator which converts this error in a pulse width modulated DC pulse. This DC pulse when applied to the primary side switch gate 104 corrects the error on the output and maintains regulation for various load levels.

In one embodiment, the transformer control circuit 103 may include a primary side current sense circuit 107 that is connected to the primary side of the transformer 102 to sense the load current and the load voltage to facilitate regulating the DC output signal to within 5% of a predefined load voltage. The control circuit 103 uses a current sense resistor 109 and measures across the primary winding. In the illustrated embodiment, the transformer control circuit 103 includes a comparator 111 that drives the FET 104. In one embodiment, the resistor 109 is a 0.10 ohm resistor. The control circuit 103 is configured to sense the load current on a pulse by pulse basis and sense the peek current. For example, in one embodiment, the control circuit 103 senses the voltage across the resistor 109 and provides the sense current in a voltage format when the switch 104 is on. When the switch 104 is off, the control circuit 103 senses the differential voltage across the primary side of the transformer 102 which may be approximately equal to Vprimary minus the drain of the off transistor 104. When the transistor 104 is off, there is a drain voltage across it so that is also a sawtooth signal. Both the voltage and the current are sampled using a switch capacitor sample and hold circuit that is scaled down to low voltages and includes resistor dividers to set the differential voltage part of the primary winding and bring the voltage into the sample and hold circuit. The differential voltage is equal to the $\Delta V$ across the winding including Vprimary and the bottom of the Vprimary. The sample and hold circuit and the resistor dividers take the primary voltage down to less than 5 volts and then takes the deferential that gets the $\Delta V$ out. The sample and hold circuit drives the comparator 111. The other input of the comparator 111 is a sample and held peek current voltage that we sense across the 0.1 ohm resistor 109. The inputs into the comparator 111 are scaled and gained up and offset so that the inputs are under steady state, and the comparator 111 drives a set-reset flow clock. The FET 104 includes an AND-gate that is driven by the comparator 111. A clock off the comparator 111 adjusts the duty cycle of the AND-gate. The AND-gate also has a high duty cycle driven by a high pulse width clock, which is a sawtooth signal. The other input of the AND-gate is the output of the comparator 111 so then the comparator 111 modulates that duty cycle to small duty cycle or to a large duty cycle. In one embodiment, the clock is the 100 KHz clock for the forward converter servo loop.

A tertiary winding from the transformer is not needed as a supply for the sensor. The supply is available from the primary side because the sensing circuit is on the primary side and supply is not needed from the secondary side. The voltage across the primary side inductor and the current that is going to the primary side FET 104 is used to determine the output voltage of the system. In one embodiment, the FET 104 includes a 200 volt Philips part device having a 2-volt threshold, which may use a 5v signal to drive the FET 104 to turn it on without level shifting. In another embodiment, a 10 volt LDO or 20 volt LDO may be used with a level shifter to go from 5 volts to 10 volts, or 5 volts to 20 volts to operate the FET 104.

In the illustrated embodiment, the control circuit 103 uses the sense resistor 109 that is in the drain path of the MOSFET 104 to implement a gated approach in which a sample and hold circuit obtains the peek voltage right when the switch 104 is on between each square wave in the PWM cycle. The gating arrangement samples when the switch is on, because when the switch is off there is no information available at that time.

In the illustrated embodiment, the power circuit 22 is configured accommodate different transformers having different turn ratios to generate a DC output signal having various current and/or voltage requirements.

In one embodiment, the power circuit 22 may not include the full wave bridge 38, rectifier circuit 30, and input capacitor, 40, such that VLINE is DC and thus the circuit can receive a direct current (DC) if the use case requires, and then conduct the voltage break down as further explained herein using the regulated buck circuit 34 and switch cap VB 32 are still used. However, in some use cases, especially with low DC to DC voltage breakdown, the buck regulator 34 would not be needed, and only the switch cap VB 32 would be used, whether one stage (as shown in FIGS. 2-12) only would be used. In this case, one could eliminate the control signal 105 from the output, and rely solely on the current sense resistor 109 and still maintain a tightly regulated voltage.

In another embodiment, for DC input variation of the circuit, the use case may not require a transformer (if the transformer is not needed for the voltage/current conversion, or if isolation is not needed) like in the case of an internal part, such as is found in smart phones. In this instance, the transformer is not necessary and may be removed from the circuit together with the FET that drives the transformer. In this case the entire forward convertor controller circuit 96, 28 can be removed, and the $C_{hold}$ capacitor 36 would be replaced with the sense resistor circuit segment 109. Further, if an AC circuit does not need to be rectified or isolated, than this circuit can work with AC as well as DC.

Figure 15A:
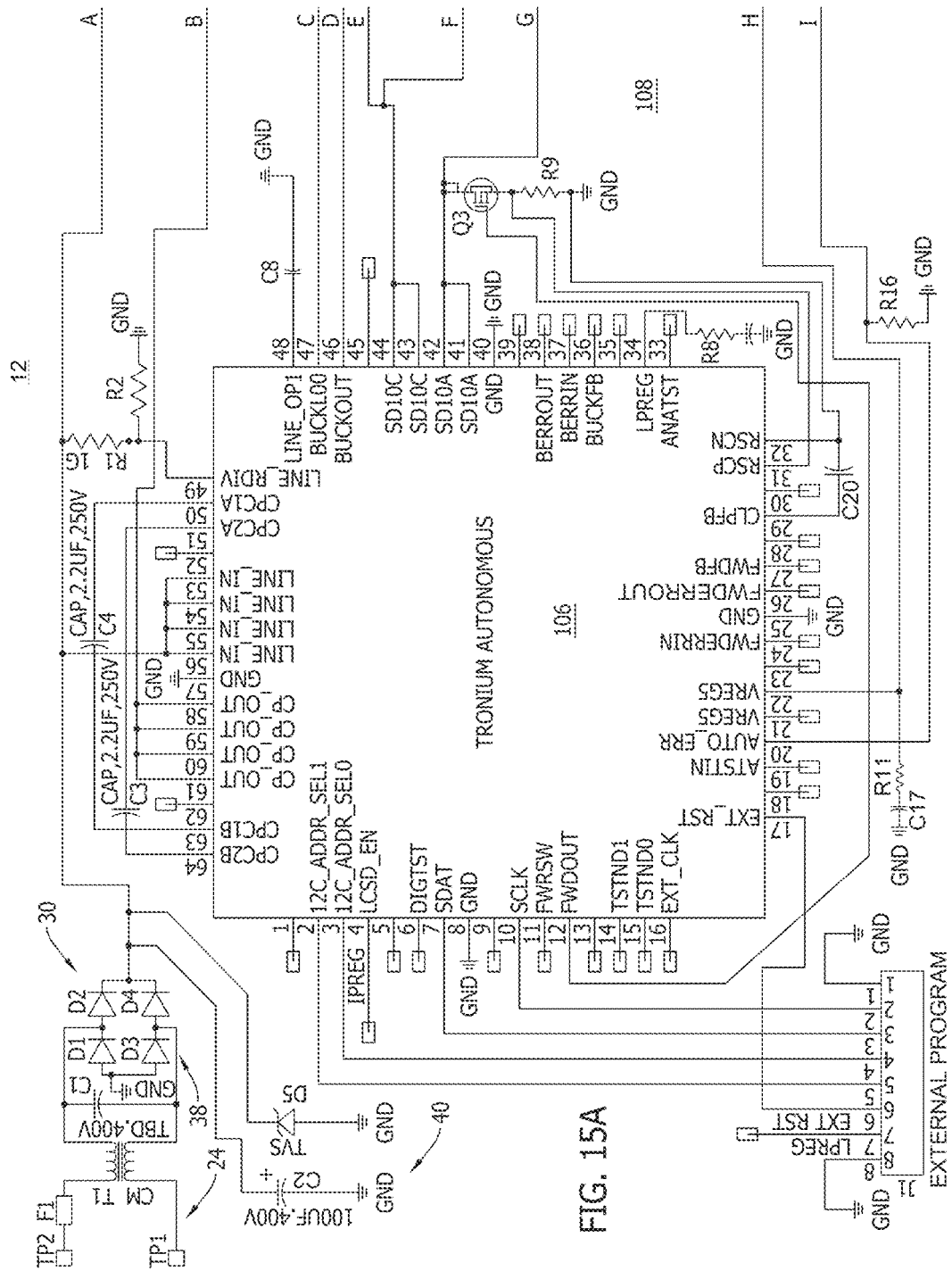
FIGS. 15A and 15B are schematic diagrams of the power circuit shown in FIG. 2, including a power controller integrated circuit, according to an embodiment of the present invention.
Figure 15B:
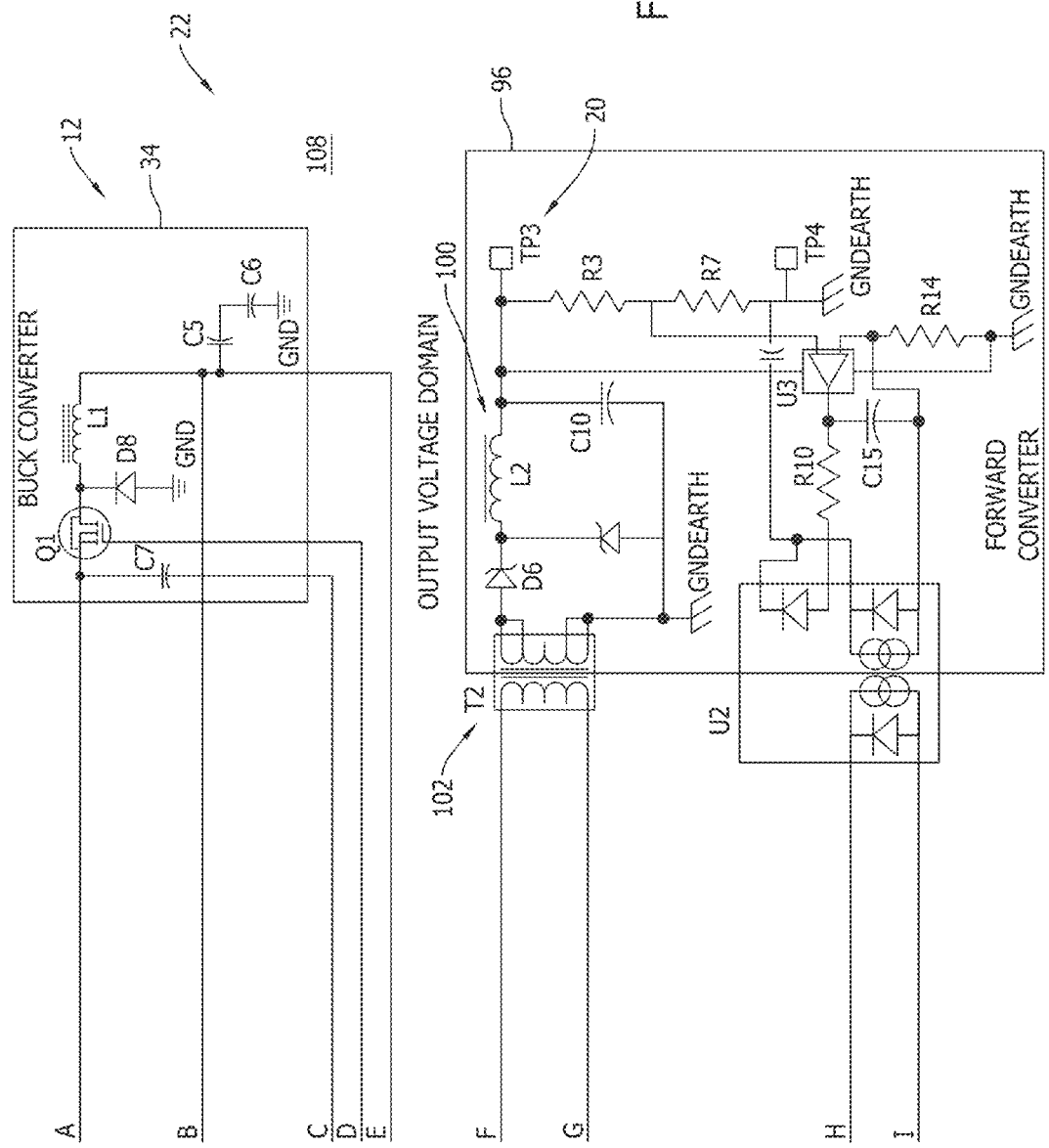
Figure 16:
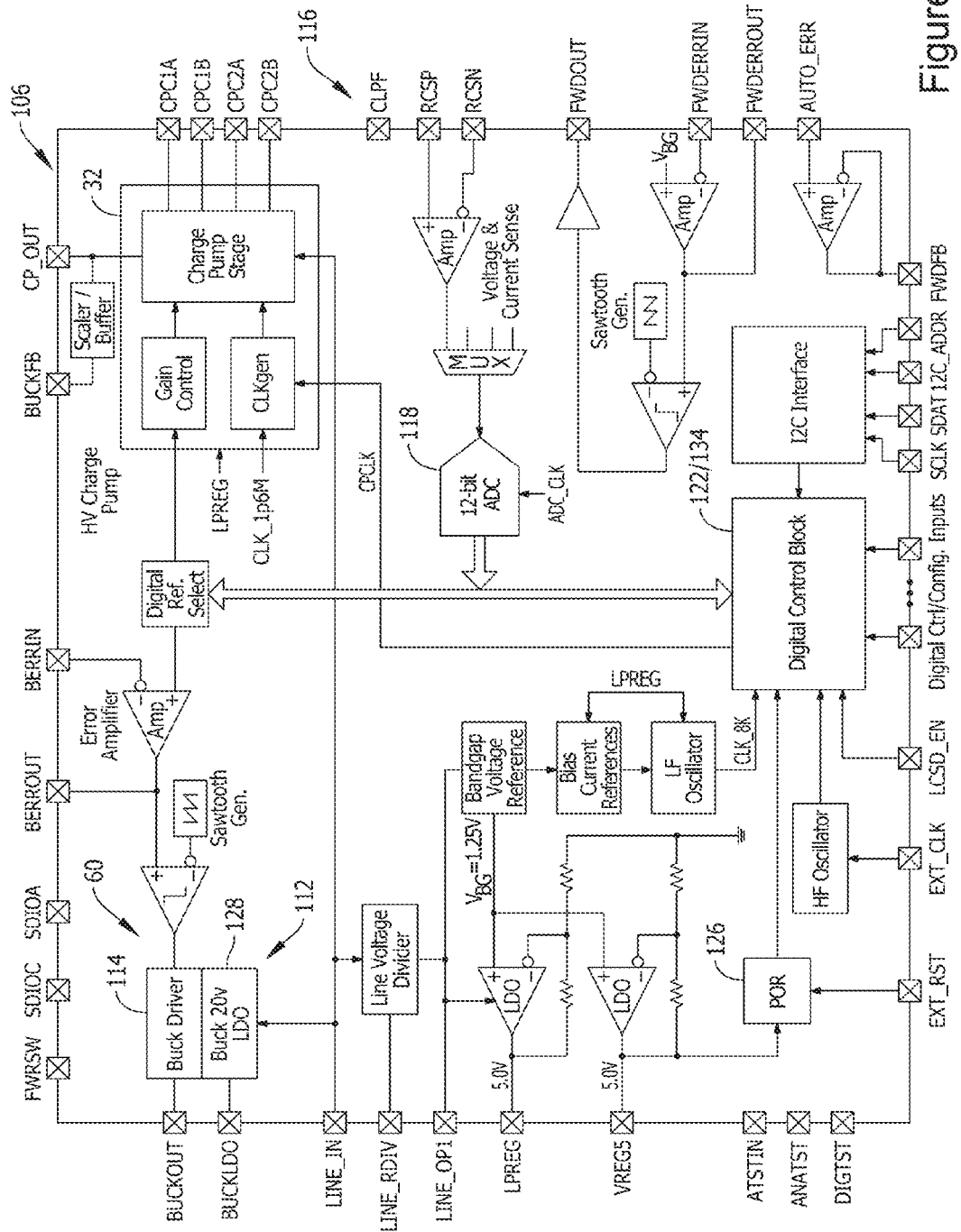
FIGS. 16, 17A, and 17B are block diagrams of the power controller integrated circuit shown in FIG. 10, according to embodiments of the present invention.
Figure 17A:
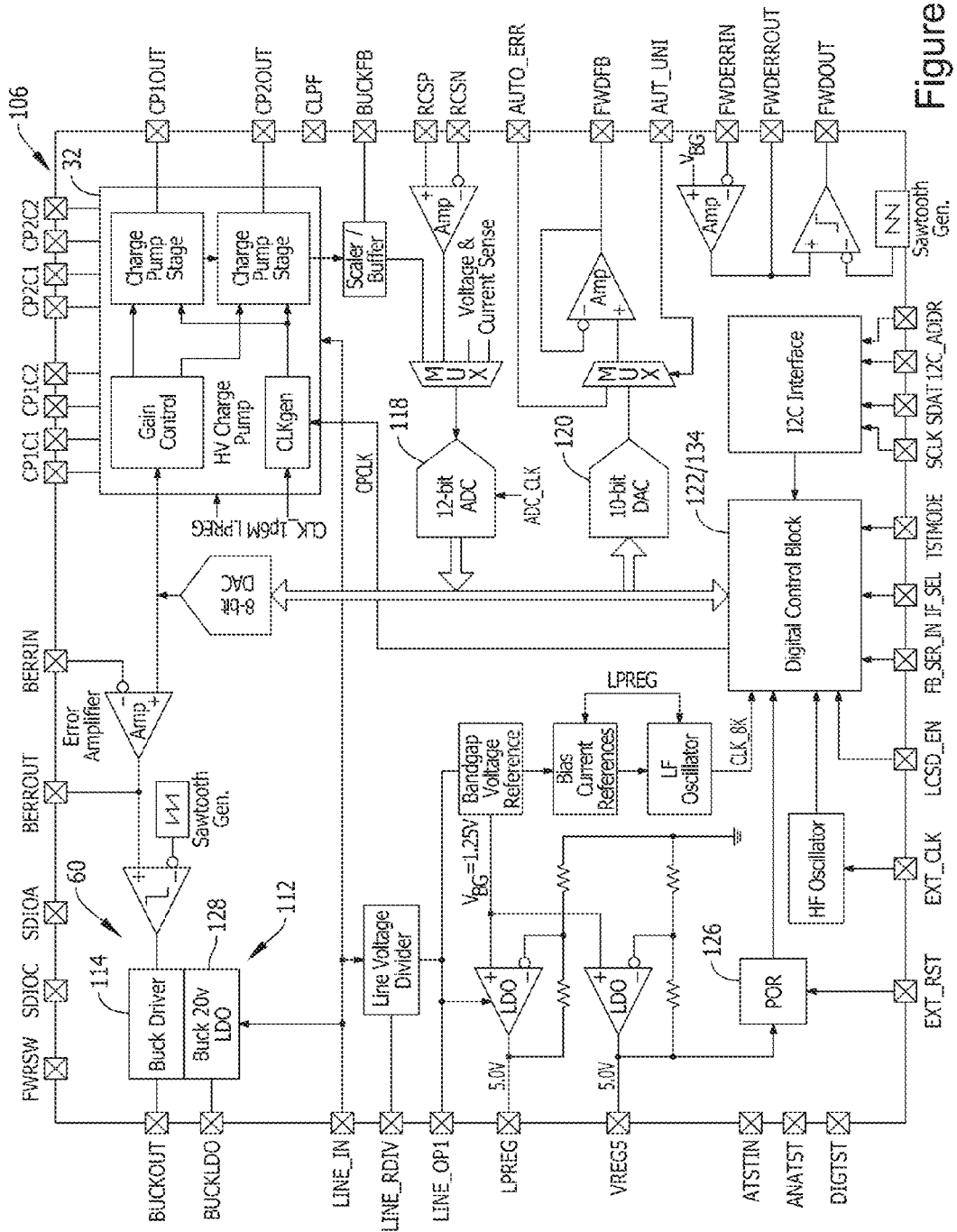
Figure 17B:
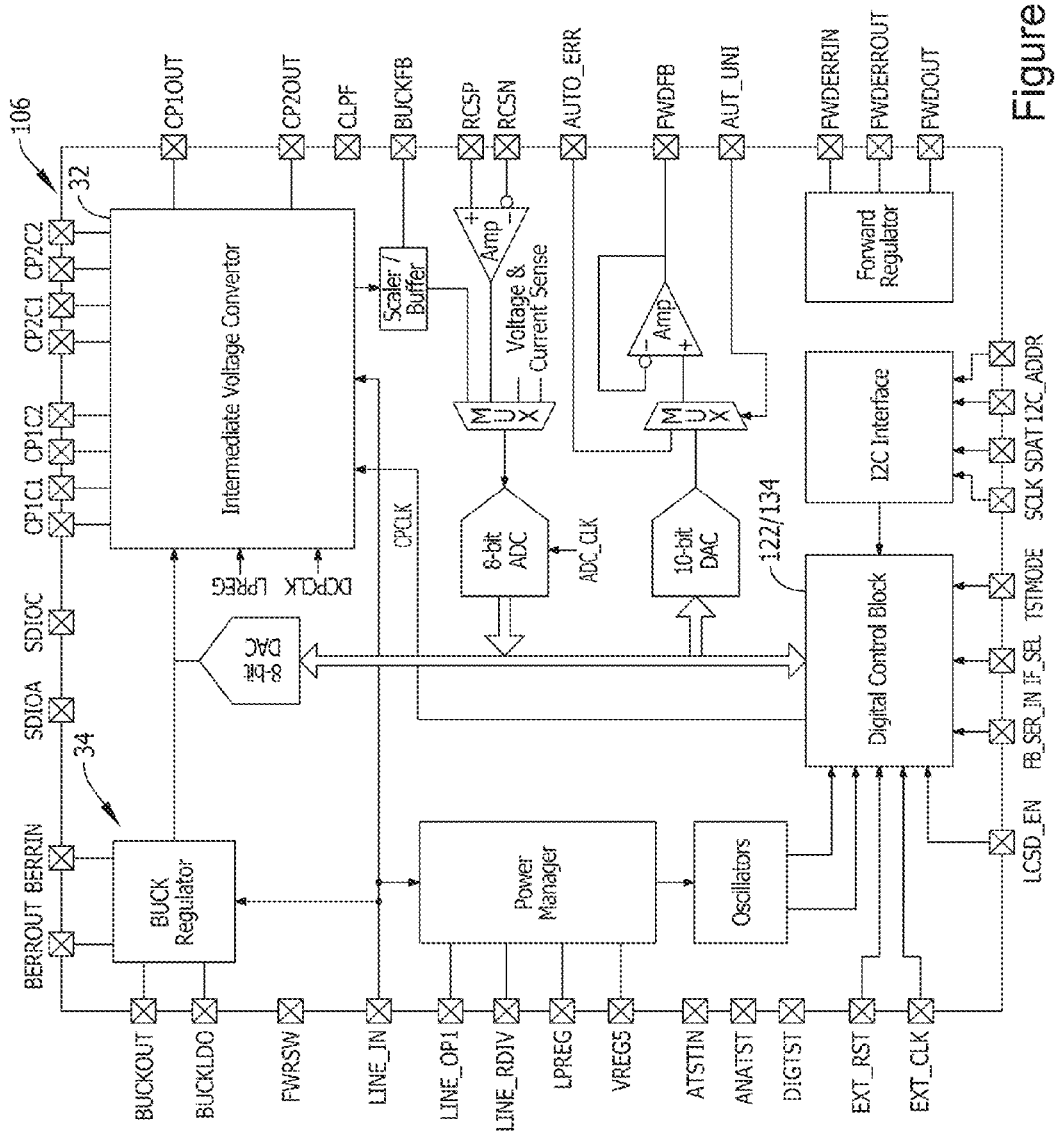
Figure 28:
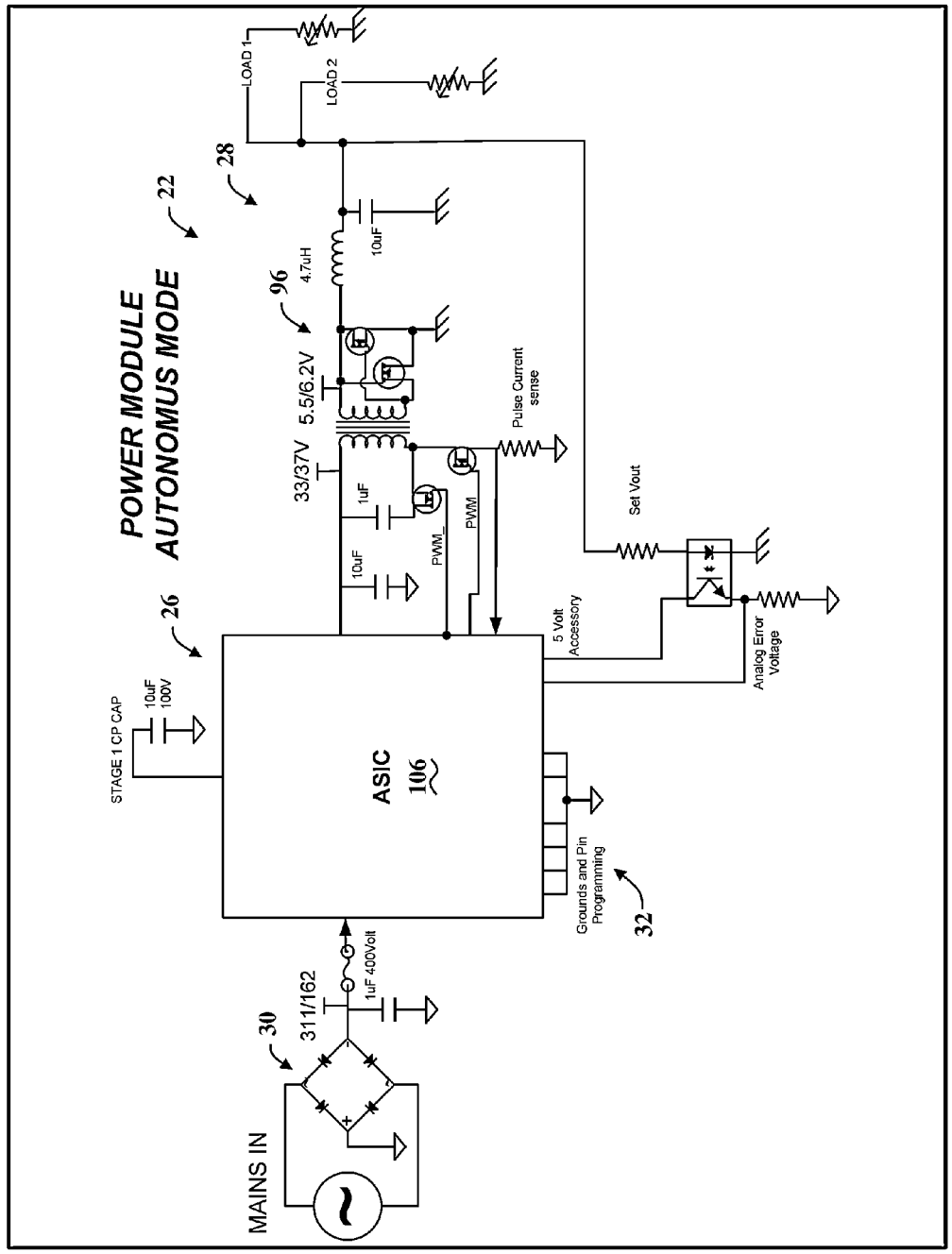
FIGS. 28 and 29 are schematic illustrations of the power circuit shown in FIG. 2, according to an embodiment of the present invention.
Figure 29:
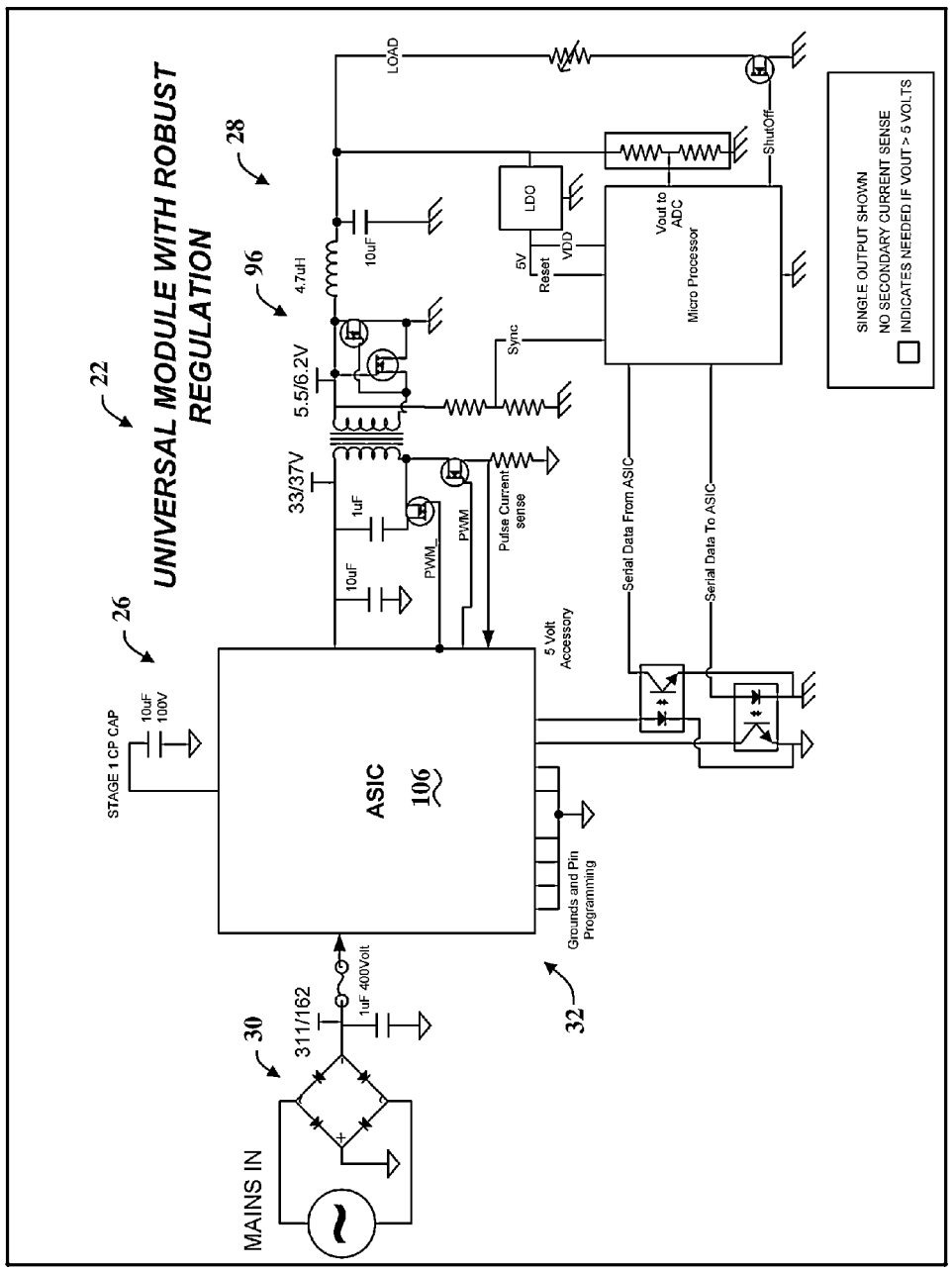

FIGS. 15A and 15B are schematic diagrams of the power module 12 including a power controller integrated circuit (Tronium PSSoC) 106 that may be used with the electrical power circuit 22. FIGS. 16, 17A, and 17B are block diagrams of the Tronium PSSoC 106. In the illustrated embodiment, the power module 12 includes a printed circuit board 108 and the Tronium PSSoC 106 that is formed within a packaged chip and is coupled to the printed circuit board 108. At least a portion of the electrical circuit 22 is included within the Tronium PSSoC 106. In addition, the digital control may be conducted by either a microprocessor, external or embedded on the chip or a state machine. In one embodiment, some or all of the electrical circuits and electrical components included in the electrical circuit 22 are included within the Tronium PSSoC 106. The Tronium PSSoC 106 may be configured for use in two primary power module applications including an Autonomous Power Module (shown in FIGS. 16 and 28) and a Universal Power Module (shown in FIGS. 17A, 17B, and 29). For example, as shown in FIG. 16, the Autonomous Power Module includes a Tronium PSSoC 106 that is configured to operate in an autonomous mode of operation that is based upon an analog feedback approach for reduced cost. The Universal Power Module, shown in FIGS. 17A and 17B, includes a Tronium PSSoC 106 that is configured to operate in a universal mode of operation and that utilizes a microprocessor (0) controller to provide feedback for regulation of the final output voltage.

In the illustrated embodiment, the Tronium PSSoC 106 is configured to meet predefined requirements for traceability, marking, solderability, and/or solvent resistance. The Tronium PSSoC 106 is marked to indicate a date code, plant identifier, and traceability/authenticity code. The authenticity code provides a means of identification and verification as a genuine part against "knock-offs". All production packaged components on a tape and reel include the same unique date code, plant identifier, and traceability/authenticity code. Lot segregation may exist in such a way as to prevent the mixing of date codes within the same lot of components. Packaged parts shall be marked to indicate the part number, date code and traceability code. Terminals are configured to meet the solderability requirements of IPC-J-STD-001 and IPC-J-STD-002 for the packaged Tronium PSSoC. The packaged Tronium PSSoC and its markings are configured to meet the requirements of the MIL-STD-202 test method 215.

The Tronium PSSoC 106 is an advanced power controller integrated circuit designed to provide output voltage regulation with high-efficiency and high accuracy. The Tronium PSSoC 106 provides the user with a multi-purpose device which can be used in a large variety of applications and because of the "Dial-a-Voltage" feature, the same chip can be configured to work in practically any electronic device. Likewise, programmable output voltages are possible with the Tronium PSSoC, with little or no loss of efficiency across a variety of current load conditions.

In the illustrated embodiment, the Tronium PSSoC 106 uses the switch capacitor circuit 32 and the switch-mode buck regulator 34 to maintain high-efficiency regardless of the load voltage or current. For example, when no current is being drawn by the load the electronic device 20, the Tronium PSSoC 106 enters a low-current mode of operation to minimize the traditional 'vampire' current required to stay awake. In the illustrated embodiment, the Tronium PSSoC 106 includes the single-stage switch capacitor circuit 32, a PID regulator control block 110 (shown in FIG. 20) for PWM control of the forward converter secondary transformer 102, a switch-mode buck regulator controller 112, a buck regulator switch driver 114, a current and temperature sense blocks 116, 12-bit Analog-to-Digital Converter (ADC) 118 for voltage and current monitoring, a 10-bit Digital-to-Analog Converter (DAC) 120 (shown in FIGS. 17A and 17B) for feedback control, a digital control block 122 for current monitoring state machine, serial input for opto-isolator communications interface, a I2C serial interface port, and power manager unit 124 for on-chip voltage and current generation. Other types of sensors, such as, sound, photo-detection, radiation and shock can also be added depending on the use case.

Figure 18:
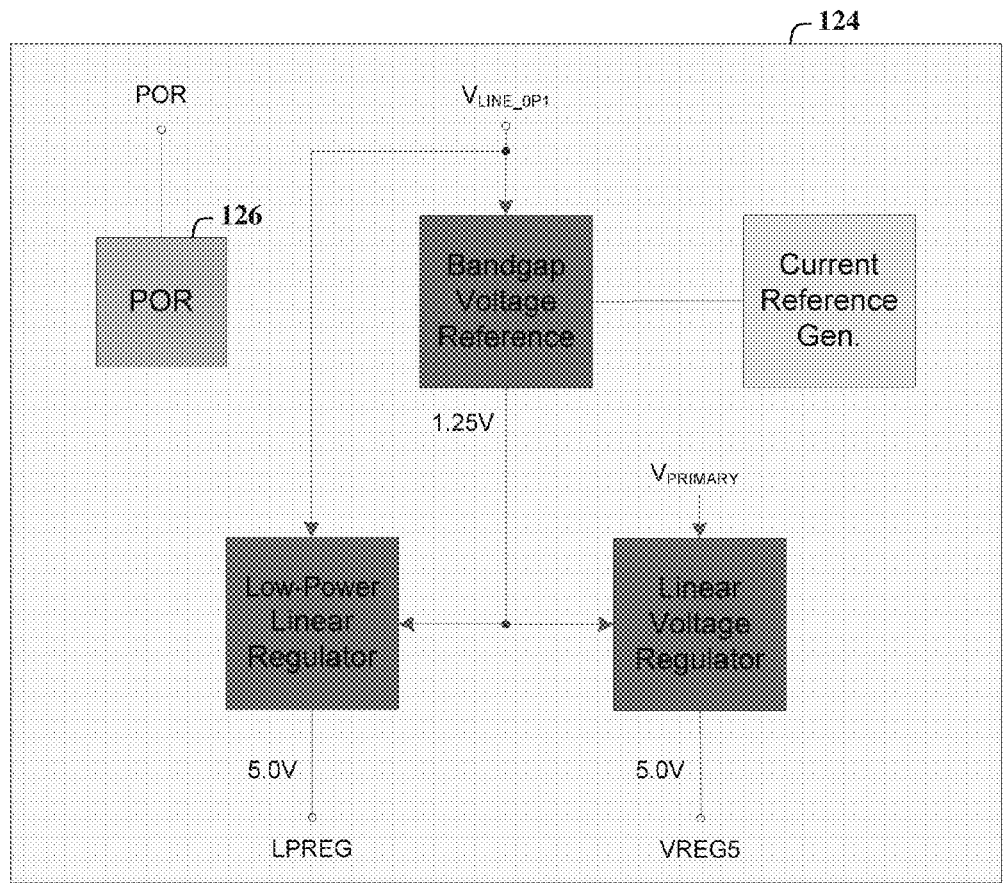
FIG. 18 is a block diagram of a power management unit that may be used with the power controller integrated circuit shown in FIGS. 16, 17A, and 17B, according to an embodiment of the present invention.

FIG. 18 is a block diagram of the Power Management Unit 124. In the illustrated embodiment, the power management unit (PMU) circuit block 124 generates and supervises the bias voltages and currents required for proper operation of the Tronium PSSoC. Two linear voltage regulators provide regulated 5.0V supplies for the low-voltage circuits of the IC, as well for external support devices such as the opto-isolators and an optional external microprocessor. In addition to providing proper initialization of the IC upon connection to the line voltage, the PMU 124 monitors the voltage supplies for fault conditions and provides a master power-on-reset (POR) 126. In the illustrated embodiment, the PMU 124 includes the bandgap voltage reference, current reference generator, a line-side low-power linear voltage regulator, a transformer primary-side linear voltage regulator, and power-on-reset. To reduce power dissipation, the line-side circuits are powered from the LINE_0P1 pin which supplies a voltage of approximately one-tenth of the LINE_IN voltage (Vline). This voltage is generated internally using an external resistor divider connected to the LINE_IN and LINE_RDIV pins of the IC. Initialization of the PMU 124 begins with the application of the rectified voltage at the LINE_IN pin.

The PMU 124 contains a low-power bandgap reference voltage and current generator for the Tronium PSSoC 106 which is powered from the line voltage. A high-precision temperature-compensated output voltage is provided for use as a reference by subsequent circuit blocks, along with multiple bandgap Proportional To Absolute Temperature (PTAT) current outputs. The bandgap output voltage can be trimmed at wafer probe to optimize the temperature coefficient with the bg_trim[7:0] register bits and stored in an one-time programmable (OTP) memory stored in a microprocessor. The bandgap cell is self-starting, requiring only the default trim value for initialization. The bandgap cell is not disabled during sleep mode, but is always powered on, and is designed for ultra-low power operation.

The PMU 124 also includes a low-power linear voltage regulator (LPREG) that is provided to convert the high-voltage present at the LINE_IN input of the PSSoC to a regulated voltage for the low-power voltage domain. The LPREG uses the bandgap reference voltage to generate a regulated output of 5.0V to drive the low power on-chip circuit blocks that are always powered on including the Low-Frequency Oscillator for the switch capacitor circuit 32, on-chip logic, etc. An external (off-chip) bypass capacitor may be used for noise filtering, connected to the LPREG pin. The regulator is not disabled during sleep mode, but is always powered on.

The PMU 124 may also include a primary-side low voltage regulator that is provided to supply the higher current requirements of off-chip opto-isolators, PWM gate drivers and other support circuits. An external 10 µF bypass capacitor is required for noise filtering, connected to the VREG5 pin. The voltage regulator may be disabled for test purposes with the use of the en_Xv signal. When the en_Xv input to the cell is 'low', all of the internal analog currents in the cell are disabled and the outputs are high impedance.

Figure 19:
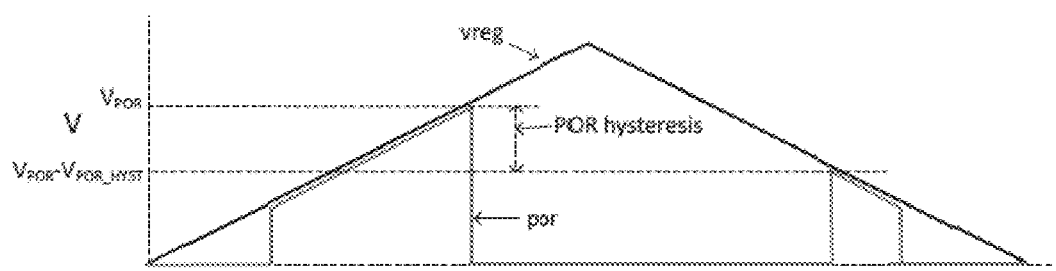
FIG. 19 is a graphic illustration of Power-On-Reset threshold voltages that may be used with the power controller integrated circuit shown in FIGS. 16, 17A, and 17B.

The POR 126 block monitors the internal supply voltage of the Tronium PSSoC as generated by the LPREG circuit block. For example, FIG. 19 illustrates POR threshold voltages that may be used with the POR 126. In one embodiment, for voltages at the LPREG pin less than the $V_{POR}$ threshold voltage, the POR output will be asserted 'high' indicating a reset condition. In addition, for voltages at the LPREG pin greater than the $V_{POR}$ threshold voltage, the POR output will be de-asserted 'low' for normal operation. Hysteresis is provided such that a reduction in the threshold voltage occurs once the $V_{POR}$ threshold is exceeded. The threshold derived from hysteresis is then equal to $V_{POR}$-$V_{HYS}$. An inverted version of the POR signal may also provided at POR_B.

Figure 38:
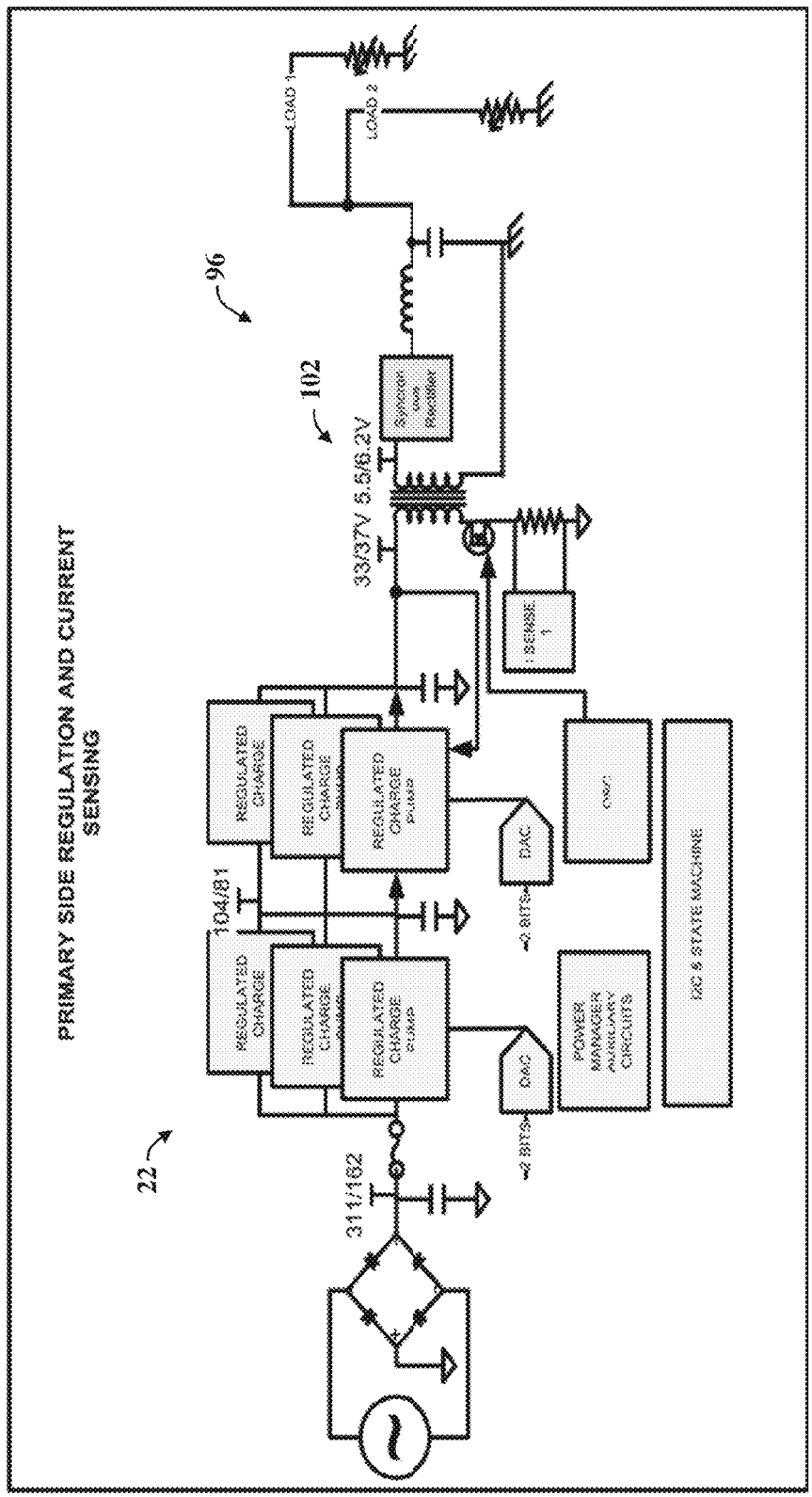
FIGS. 38 and 39 are additional schematic illustrations of the power circuit shown in FIG. 2, according to an embodiment of the present invention.
Figure 39:
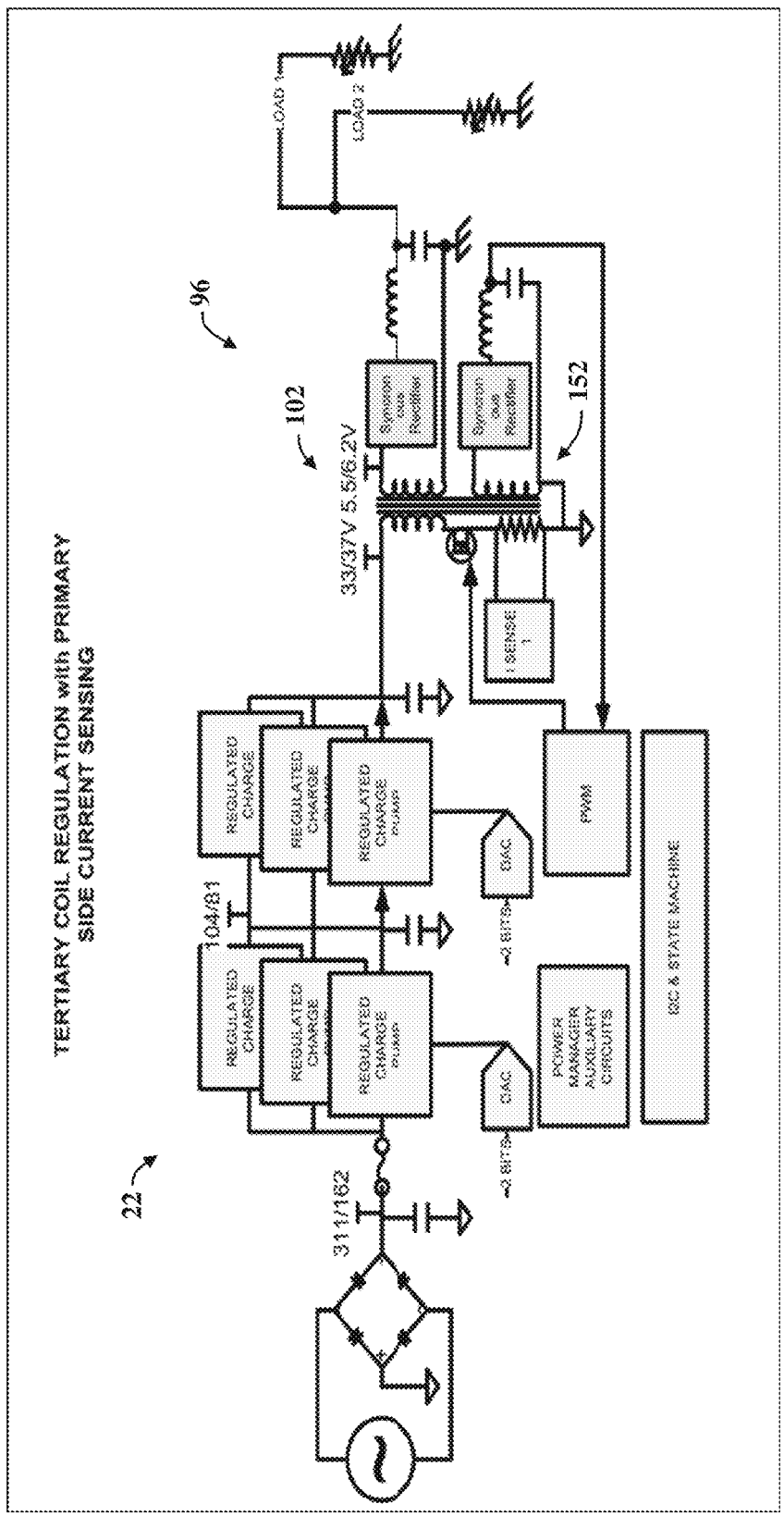

In the illustrated embodiment, the switch capacitor voltage breakdown circuit (SCVBC) 32 included in the Tronium PSSoC 106 is configured as a voltage divider through Capacitive Voltage Break Down techniques (CVBD). Through capacitors, it divides the rectified DC voltage present at the LINE_IN pin to a reduced voltage at the CP2_OUT pin for use by the external transformer 102 and secondary voltage control loop. The external transformer 102 then further reduces this voltage to the desired application voltage as a function of the primary-to-secondary windings ratio. In one embodiment, the SCVBC 32 is configured as a cascade of two identical stages, as shown in FIG. 17A. In another embodiment the SCVB 32 includes multiple switch capacitor stages, as shown in FIGS. 38-39. The SCVBC 32 is configured to deliver up to 50 mA per Capacitive Break Down block, which consists of Switch Capacitor blocks which provide the voltage breakdown by half or other divisionals. This provides and maintains ≥95% efficiency across the range of load currents from 50 mA to less than 1 mA under light load conditions on the primary side of the transformer 102. For example, assuming a ≥97% efficiency for the external transformer & rectifier, and overall module efficiency of ≥92-97% has been simulated and is achievable. In one embodiment, the SCVBC 32 may include on-chip fly-back capacitors to maximize power efficiency, external 2.2 µF bucket capacitors and two external 7.5 µF hold capacitors to minimize the voltage ripple. These capacitors are connected to the CP1_OUT and CP2_OUT pins, respectively, for the outputs of the 1st and 2nd stages of the switch capacitor circuit. Both stages are clocked at a rate of 1 KHz from a two-phase non-overlapping clock generator which is derived from an on-chip RC Oscillator.

Referring to FIGS. 17A and 17B, in one embodiment, for the Tronium PSSoC 106, the SCVBC 32 output voltage at CP2_OUT is programmable over the range of 120-90 Volts in steps of 0.117 Volts with the use of an 8-bit binary-weighted digital-to-analog converter. The SCVBC output is limited to this range to ensure that the forward converter transformer 102 provides most of the output current in the step-down process. The SCVBC is limited to an output current of 50 mA. If additional current is required for the application, the switch-mode buck regulator 34 may be enabled to provide up to 430 mA of current. Each stage of the SCVBC 32 may be programmed to produce a voltage conversion ratio. This programming is done automatically in the Course Gain Control where the rectified LINE_IN voltage is compared to the 8-bit DAC setting. The digital control of this DAC enables multiple voltages to be programmed to obtain the desired final output voltage required for the target application. An example of the load voltages which can be programmed with the DAC as a function of the transformer turns ratio.

Referring to FIG. 16, in one embodiment, the SCVBC 32 may include a single-stage switch capacitor circuit with a corresponding divider ratio of 1, 0.66 or 0.5. The output voltage present is then reduced by the external (off-chip) forward converter 96 to obtain the final application output voltage of 5.0V. All analog and digital signals for the SCVBC (and Buck Controller) are generated in the 5V domain. The SCVBC Error Voltage is scaled to be within the XV domain using a resistor divider. The LINE_IN voltage is also scaled so that processing can be done within the XV voltage domain.

In one embodiment, shown in FIG. 16, the SCVBC 32 includes a Gain Control block that uses the scaled LINE_IN voltage to determine the appropriate divider ratio for the SCVBC 32. The scaled LINE_IN voltage is compared to the Bandgap reference voltage to select one of three or more possible divider ratios as a function of the AC Mains voltage. Final regulation of the output voltage may performed in the switch capacitor regulator where the clock is turned on and off to control the amount of charge delivered to the hold capacitor.

Referring to FIGS. 17A and 17B, in one embodiment, the SCVBC Gain Control block may use the scaled LINE_IN voltage and Output Voltage DAC setting to determine the appropriate Course Divider ratio derived from the combined divider steps in CP1 and CP2. In this way, settings for the 120 and 90 Volt outputs as a function of world-wide AC input voltages can be achieved. Final regulation of the CP2 output voltage is performed in the switch capacitor regulator where the clock is turned on and off to control the amount of charge delivered to the CP1 and CP2 hold capacitors. The lowest divider ratio required for CP1 and CP2 should be programmed for the CP1 stage to minimize the voltage drop across the high-voltage NMOS switches.

The CP2 output feeds the primary winding of the Forward Regulator. The final output voltage of the system is set by the following equation:

$$(V_{SET}/XFMR_{RATIO})*dc=V_{OUT}$$

Where dc is the duty cycle for the Forward Regulator and should be maintained at 0.5 or less to ensure the system transformer does not saturate.

The SCVBC 32 includes a Dickson charge pump (DCP) 94 (shown in FIGS. 5 and 6) that may be used to provide a boosted voltage for the gates of the NMOS high-voltage switches. The DCP's may be clocked at a clock rate of 1.6 MHz and generate gate voltages equal to the voltage at the LINE_IN pin plus approximately 18V. In addition, each NMOS high-voltage switch 90 may include a corresponding level shifter to translate the drive signal from the low-voltage domain to the boosted voltage provided by the DCP's. In one embodiment, this requires dual level shifters, other requirements may only need one level shifter. The input to the levelshifter is 5V and is translated to the 20V domain for use by the SCVBC 32. This same type of level shifter, scaled for output current drive, may be used throughout the Tronium PSSoC 106.

In one embodiment, as shown in FIGS. 17A and 17B, the Tronium PSSoC 106 may include a Digital-to-Analog converter (DAC) that provides programmability for the output voltage of the switch capacitor circuit. An R2R current-mode DAC topology digitally scales the bandgap reference voltage to the control voltage required by the switch capacitor circuit to maintain the output voltage programmed by the user. The output voltage range of the DAC is from 120-90V programmed in steps of 118 mV by the CP_DAC[7:0] register bits.

The SCVBC 32 may also include a switch capacitor regulator that includes a comparator and an AND gate that are used to control the charging of the SCVBC. In one embodiment, the comparator's inputs may include the Output Voltage DAC and the scaled version of the CP2 output voltage. For example, if the scaled voltage from the CP2 output is greater than the DAC voltage, the comparator output is low and the 1 KHz CP clock is gated OFF. If the DAC Voltage is greater than the scaled CP2 output voltage, then the comparator output is asserted high and the AND gate enables the clock to charge up the output. In addition, the comparator may be designed with hysteresis to minimize the CP2 output voltage ripple. Moreover, the regulator may run both CP stages in the discontinuous mode; that is, the clock pulses are only present when charging of the 7.50 hold capacitors is required.

In the illustrated embodiment, if a stack of CVBD Modules are not used, then large current loads (up to 430 mA or more) are easily handled with the use of a hybrid topology which includes a Switch-Mode Buck Regulator (SWR) 34 and the CVBD Module. The Tronium PSSoC 106 contains the controller for the SWR 34, which makes use of an external (off chip) PMOS switch (which can be an internal to the Chip PMOS or NMOS [with additional Dickson Charge Pumps for gates]) to supply the high-current demands of the load. Since the high-current path is external to the PSSoC, the PSSoC is not required to dissipate the majority of the load current. This improves the overall system efficiency by eliminating the source of additional parasitic losses in the PSSoC due to the ON-resistance of the high-voltage devices. The SWR may be regulated at the same frequency as the CVBD Module, or run at higher (500 KHz-1 MHz) to very high frequencies, while the CVBD Module is running at lower frequencies in order to remain more efficient. (The CVBD Module can be run at higher frequencies, but with current devices offered in semiconductor platforms today, this increases gate openings/closings, which increases losses).

In one embodiment, the buck regulator 34 may include the following external (off chip) components: 1. Series High PMOS Switch. The PMOS Switch may be selected for low $RDS_{ON}$, low input capacitance and a $V_{DS}$ of >400V; 2. High Voltage Buck Diode with High Volt Breakdown, extremely low leakage and switching current; and 3. Buck Energy Storage Inductor. The inductor must have low ESR and be able to handle appropriate de-rated current. However, these parts, usually depending on the frequency which runs the Buck (the higher the frequency the smaller the value of the parts needed), may be internal devices/components on the chip, and not external. With the application of GaN and/or GaA and Deep Trench Capacitor technologies, as well as technologies which put transformers on the chip, all parts may exist on one chip.

The Tronium PSSoC 106 may also include a high-frequency oscillator that is divided down to produce a 100 KHz (nominal) clock for use by the Buck Regulator PWM controller. The 100 KHz clock is dithered with a pseudo random algorithm in the Digital Control block to ensure the suppression of harmonics in the EMI spectrum. This clock is then Pulse Width Modulated to control the on/off time of the external Buck Regulator PMOS/NMOS FET. The 100 kHz clock is converted to a saw-tooth ramp inside the Tronium PSSoC 106 where it is compared to the Error Amplifier output. The Pulse Width Modulated signal from the Comparator output is then applied to the level shifter input to control the on/off time of the external Buck Regulator PMOSFET. The Error Amplifier of the Buck regulator 34 receives feedback from the regulator by scaling the voltage at CP2_OUT with the use of a resistor divider. The voltage feedback signal is then conditioned using internal resistors and capacitors to control the response of the Buck Regulator under all conditions. The resulting transfer function for the regulation servo loop is comprised of multiple poles and zeros to ensure that the regulator output is stable for the full range of load conditions from 50 mA to 430 mA. The Error Amplifier and PWM Controller for the Buck Regulator are all located in the 5 Volt domain with the final control signal being level shifted to drive the external high-voltage PMOSFET switch.

The Tronium PSSoC 106 may also include a LDO Buck Regulator 128 that is used to create the high-side voltage necessary to drive the gate of the PMOS/NMOS FET for the Buck regulator 34. This voltage is then used to supply the gate voltage required to drive the external PMOS/NMOS FET. A capacitor is connected for filtering.

In the illustrated embodiment, the Tronium PSSoC 106 includes a Current Sense Amplifier of the Tronium PSSoC senses the voltage across the external current sense resistor at pins RCSP and RCSN. This voltage is sampled and held by a switched-capacitor difference amplifier and digitized by the on-chip general-purpose ADC. The digital word is then compared against programmed thresholds to enable or disable the Buck Regulator 34 as needed to optimize efficiency. The output of the Current Sense Amplifier is also monitored for possible fault or alarm conditions such as over current, allowing a digital state machine that controls the current sense feedback to disable the SCVBC 32 to prevent possible damage.

The Tronium PSSoC 106 may also contain at least two free-running RC oscillators which share a common trim controller including a 16 KHz RC Oscillator and a 9.6 MHz RC Oscillator. The oscillator frequencies can be trimmed using the osc_trim register bits.

The low-frequency (16 KHz) RC Oscillator is a line-side RC Oscillator that runs continuously after the application of the line voltage at LINE_IN. It is supplied by the LPREG regulator. This oscillator output frequency is divided down to a number, like 1 KHz to provide the clock for the SCVBC 32. The oscillator output, in that case, is also used as the reference clock for the Sleep mode Shut-down Timer. A high-frequency (9.6 MHz) RC Oscillator provides the master clock for the decoding of the single-wire serial data input. The oscillator 9.6 MHz output is divided by 6 to provide the 1.6 MHz clock required by the Dickson Charge Pumps in the switch capacitor circuit. It is further divided to provide the clock source for the Buck Regulator and Forward Converter PWM Control Blocks. These 100 KHz clocks are dithered with a pseudo random algorithm by the digital logic to ensure suppression of the harmonics in the EMI spectrum. The oscillator can be enabled with the osc_en register bit and is powered by the LPREG regulator on the line side.

In the illustrated embodiment, the Tronium PSSoC 106 includes an ultra-low power ADC 118 to digitize a temperature sensor and current sense amplifier analog voltages. These digitized voltages can then be compared by the Digital Control block to disable or restart the analog circuitry. The ADC uses a successive-approximation (SAR) topology for low-power and enhanced INL/DNL performance. The input to the ADC is provided by a multiplexer. The multiplexer can select each of the channels of interest for digitization by the ADC. The converted sample values are then stored in the ADC_SAMP register for use by the Control State Machine. The ADC uses a low voltage supply and will be disabled when the device is in sleep mode.

Figure 20:
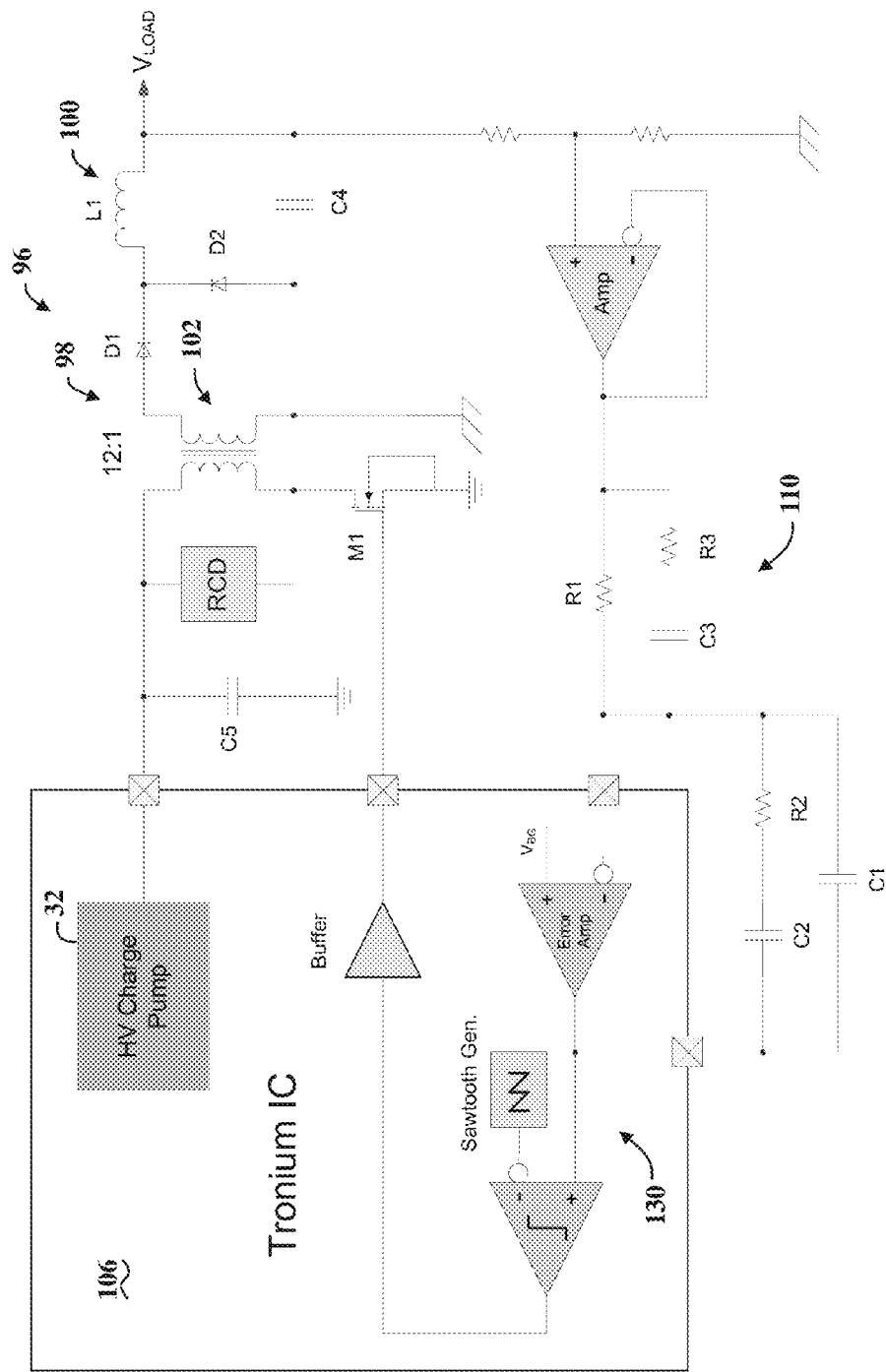
FIG. 20 is a schematic illustration of a Proportional to Integral and Differential Regulator Control circuit that may be used with the power controller integrated circuit shown in FIGS. 16, 17A, and 17B, according to an embodiment of the present invention.

FIG. 20 is a schematic illustration of a Proportional to Integral and Differential (PID) Regulator Control circuit 110 that may be used with the Tronium PSSoC 106. In the illustrated embodiment, the Tronium PSSoC 106 includes a PID servo loop 130 to regulate the voltage at the output of the forward converter 96 as load current is drawn from the secondary-side of the external transformer. The PID block includes an Error Amplifier, Saw-tooth Waveform Generator, Comparator and PWM Clock Control Block. The PID loop is designed to regulate the output voltage under heavy fluctuation of load current without triggering any instability.

A PID Buffer Amplifier receives the feedback to close the Forward regulation loop via the AUTO_ERR input. This is the output of the Opto-Isolator which provides a voltage to the PSSoC which represents the output voltage of the Forward Converter. This voltage is then scaled on the PSSoC with a resistor divider and buffered for the Error Amplifier.

The Error Amplifier for the Autonomous PID Loop is located on the Tronium PSSoC with the compensation resistors and capacitors on-chip. The Error Amplifier uses the bandgap voltage as the reference for the PID Servo Loop. A Saw-tooth, or other, Waveform Generator provides a clock-based means of pulse-width-modulation (PWM) for the PID Servo Loop. The circuit receives the 100 KHz clock from the digital logic and converts it to a saw-tooth waveform of the same frequency to be compared to the output of the Error Amplifier. The outputs of the Error Amplifier and Saw-tooth Waveform Generator are compared by the PID Comparator to generate the PWM clock required to drive the Forward Converter. A Duty Cycle Limiter is provided to ensure that the PWM output provided by the PID Comparator does not exceed 65%. This output is applied at the FWDOUT pin to drive the external transformer. In normal operation, the PWM duty cycle is limited to a range of 10-65% to avoid saturation of the transformer.

In one embodiment, the PID Servo Loop is designed to operate at low voltage and deliver a maximum of the required DC current to the load. The regulation can be controlled up to a high percentage of absolute accuracy by using an LC filter on the secondary side and by properly sizing the internal R's and C's of the $3^{rd}$ order compensation network. The LC filter double pole is given by the following equation: $FLC=1/2\pi\sqrt{L1C4}$.

The C1 capacitor has a certain ESR (series resistor) which produces a zero. This zero generates a +90 degree phase shift: $FESR=1/2\pi C1RESR$.

The compensation loop has a certain bandwidth (Fc) which is approximately 1/10th of the clock rate of the forward converter. The goal of the network is to maintain at least 45 degrees of phase margin at Fc: Phase Margin=180 degrees+ Phase of loop.

The PID loop has 2 zeroes and 2 poles. The 2 zeroes are necessary to provide 180 degree of phase boost in order to negate the 180 degree of phase loss due to the output LC filter. Both zeroes are placed at about ~50% of the LC filter pole frequency. Two poles are then located at the switching frequency of the converter (100 KHz). This allows us to calculate C1, C2, C3, R2 and R3. R1 is set to a reasonable value in order to start the calculation procedure.

In another embodiment, the PID Servo Loop is designed to operate for multiple output voltages which can be programmed by the user for the required application. The loop may deliver ny current, but in this illustrated case 4.5 A of DC current to the load with a regulation of up to 0.1% of absolute accuracy. Feedback for the Universal loop is provided by the external microprocessor and voltage sense support circuits, and is input to the Tronium pin as a serial data stream. A parallel-to-serial conversion is then performed on the digital word which is converted to an analog voltage for application to the error amplifier as shown in FIG. 20. Conversion to analog is performed with an on-chip DAC which is updated at the frequency of the incoming data rate. The reference voltage for the PID error amplifier is generated by a second DAC which is programmed by the microprocessor.

A Digital-to-Analog converter (DAC) generates the analog reference voltage for the PID Control Loop based upon the digital programmed input from the microprocessor. The Digital-to-Analog converter (DAC) as shown is a 10-bit scheme, but can be any number of bits. The DAC may also provide feedback for the PID Control Loop by converting the digital word received from the pin to an analog voltage for input to the loop. The DAC voltage is input to the error amplifier and compared to the analog reference voltage to produce the error voltage for the control loop. The DAC provides updates to the loop at the rate of the incoming data.

Referring to FIGS. 17A and 17B, in one embodiment, the Tronium PSSoC 106 may include an on-chip ΔV based temperature sensor that enables the IC to sense the temperature of the die or module. In this example, a general purpose 12-bit ADC is used to digitize the differential voltage. The digitized value is then compared to programmable thresholds in order to shut down or re-enable the Tronium PSSoC depending on temperature concerns.

In the illustrated embodiment, the Tronium PSSoC 106 provides two modes of operation and four wake-up states (W0-W3) applied upon powerup.

Figure 24:
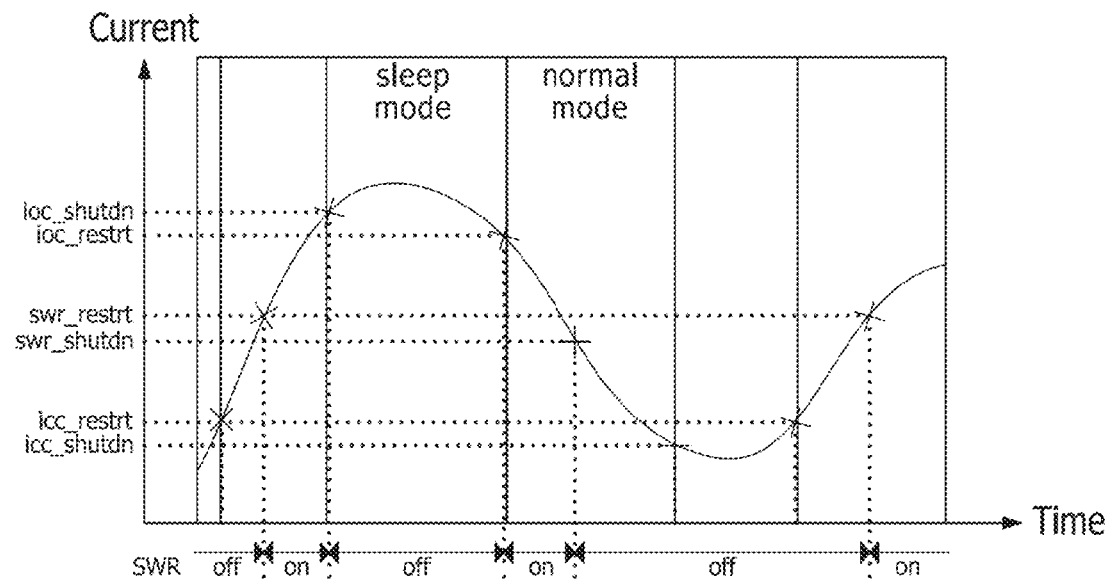
FIG. 24 is a graphic illustration of state transitions that may be used with the method shown in FIG. 23, according to an embodiment of the present invention.

Startup Mode. During Startup Mode, the Tronium PSSoC controls the startup behavior of the module when power is first applied or when a phone is plugged in (in the case of a charger). When power is first connected to the AC Mains, the rectified and filtered LINE voltage present at the LINE_IN pin of the IC increases until it reaches its final DC value. The basic support circuits of the Tronium PSSoC are consequently powered up to initiate the power management functions. A timing diagram of an exemplary startup sequence of events is shown in FIG. 24, beginning with the application of the LINE_IN voltage at t=0.

The line side has three circuit blocks that are always powered ON: 1. Low-Power Bandgap Reference; 2. Low-Power 5V Regulator (LPREG); and 3. Low-Frequency RC Oscillator. Other circuits may be powered, but in this example it has been reduced to three in this instance in order to draw extremely low stand-by power. These circuits draw power directly from the LINE_IN input with no transformer action to increase the available current. As a result, they are designed for ultra-low power consumption. Alternatively, the transformer could be enabled, but this would reduce efficiency.

Normal Mode. Following the application of power and the completion of the wake-up states, the Tronium PSSoC 106 will enter the Normal Mode of operation. The Normal Mode of operation is maintained until the voltage/current becomes extinct or passes a low current threshold where typically the microchip inside the battery system begins resisting the current to prevent overload. In the normal mode of operation, the Tronium PSSoC exits the Sleep Mode as a result of the detection of load current. Regulation of the load occurs as the Buck Regulator and SCVBC supply the necessary current. In this mode of operation all Tronium circuits are powered ON and responding to the external stimulus.

In one embodiment, combining the elements of Normal Mode, Start Up Mode and Sleep Mode the battery can be provided a "bump" charge. In this instance another mode, called Bump Charge Mode would be executed when it is determined by the logic in the chip that a full charge has been executed, meaning a drain from a higher current to lower current over a given period of time. This Bump Charge mode of operation can exist in the state machine or be enabled/disabled via the I2C interface and would instruct the circuit to "disconnect" several times and begin recharging up to a maximum threshold of approximately 150 milliamps with an interval in between. In this fashion, the battery would be prompted to receive an additional trickle charge to ensure that it is really full, not just stating "full" on the device battery indicator. This will solve the problem where cell phones only charge to about 80-90% of their batteries capacities, thus, over time, while the indicator still registers the battery at 100%, it is really a 100% of 80% of the battery's capacity, not 100% of 100% of the battery's capacity. Under the Bump Charge Mode, the Tronium PSSoC digital provides an additional current threshold which is higher than the sleep threshold so that the Sleep Mode function, set out below, is not compromised.

Sleep Mode. The Tronium PSSoC must use minimal power when connected to the AC Mains power and no charging or power supply function is required. This requires the electrical circuit 22 to have at least two distinct power domains: 1) the line side domain and 2) the primary side domain. The line input side is the domain that must be capable of being powered at all times. There is also a 1.6 MHz RC oscillator that is used for the Dickson Charge pumps. This oscillator remains OFF in the SLEEP mode. The 16 KHz oscillator is used as a countdown timer to wake the Tronium PSSoC when the programmed countdown time has been reached.

In the illustrated embodiment, the Tronium PSSoC 106 includes a Digital Control block 122 that provides the user the ability to manage numerous aspects of the Tronium application in setup, programmable, normal, test, or evaluation modes of operation. A microprocessor or state machines are provided to monitor the output voltage and current of the Switch capacitor circuit and include configurable registers which provide feature selection and programmability for both the normal mode of operation and the low-current or 'sleep' operating mode. Communication interfaces are also provided for external devices as required by the application.

Figure 21:
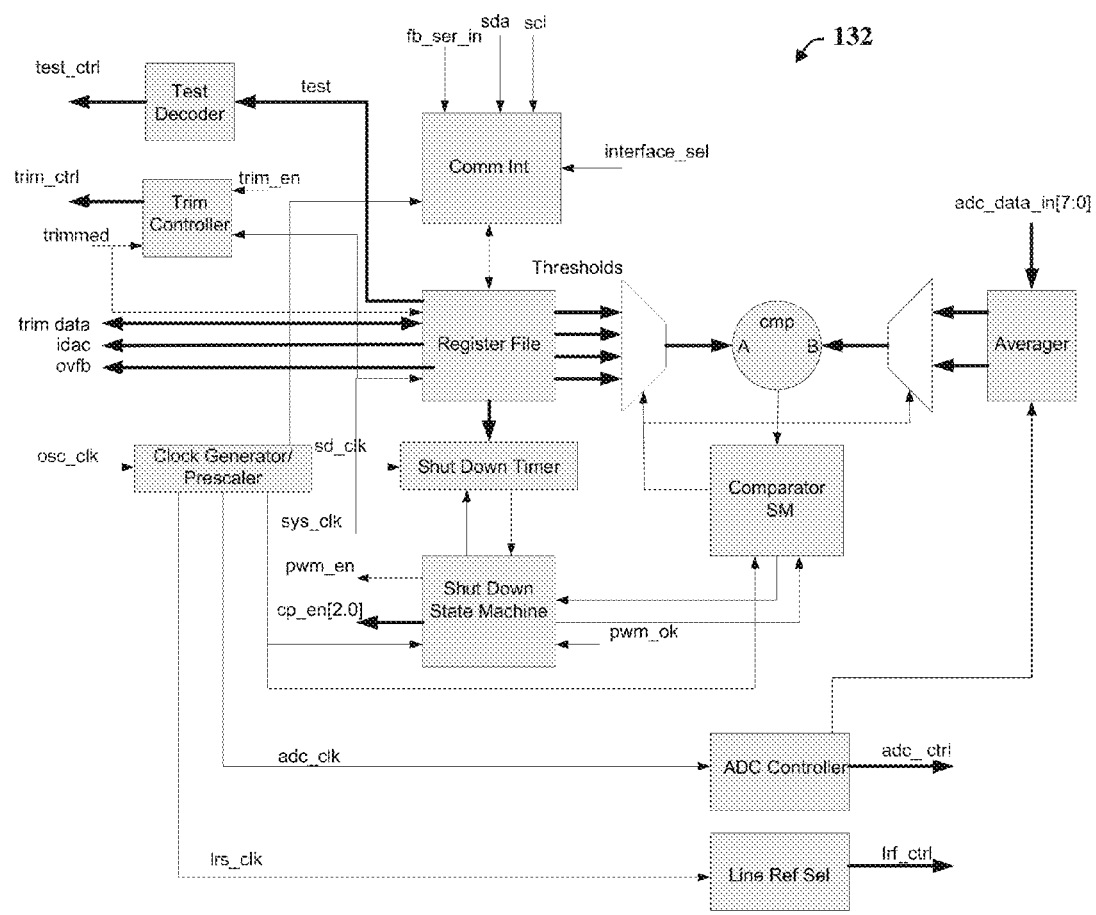
FIGS. 21 and 22 are block diagrams of a digital control block that may be used with the power controller integrated circuit shown in FIGS. 16, 17A, and 17B, according to embodiments of the present invention.
Figure 22:
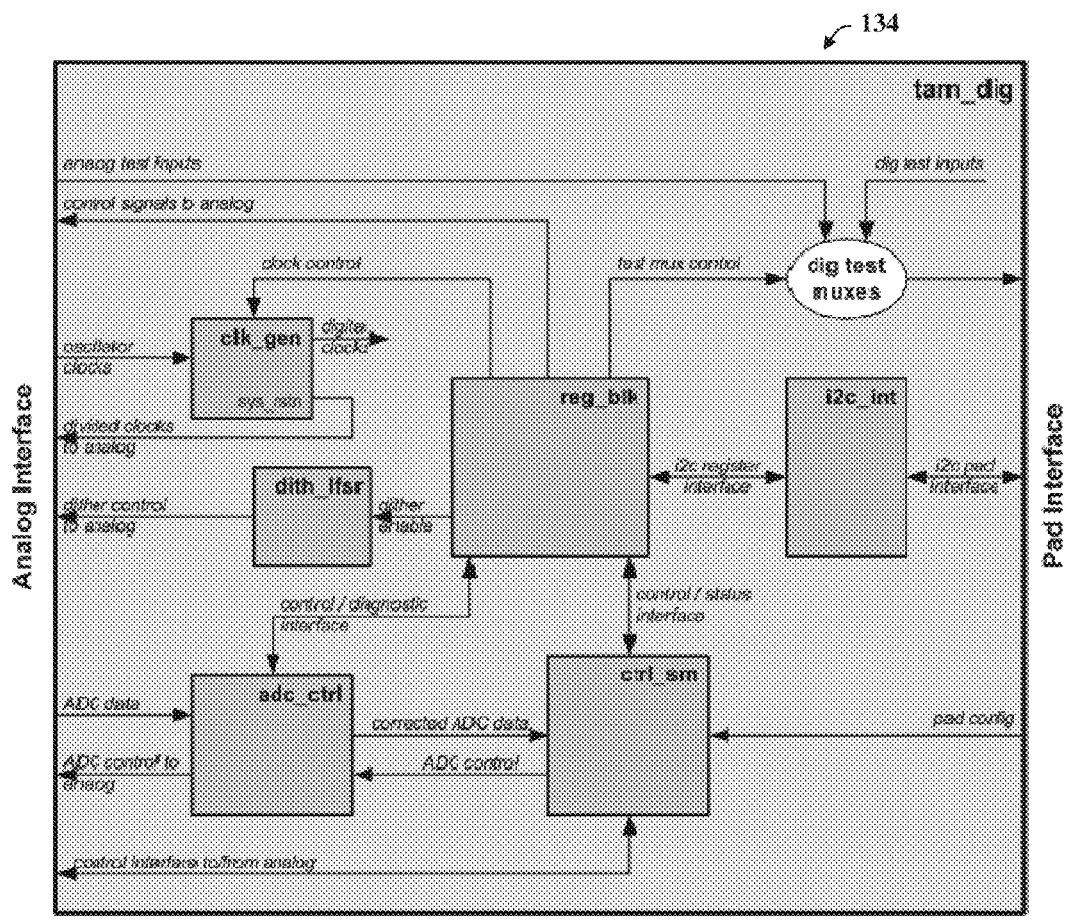
Figure 23:
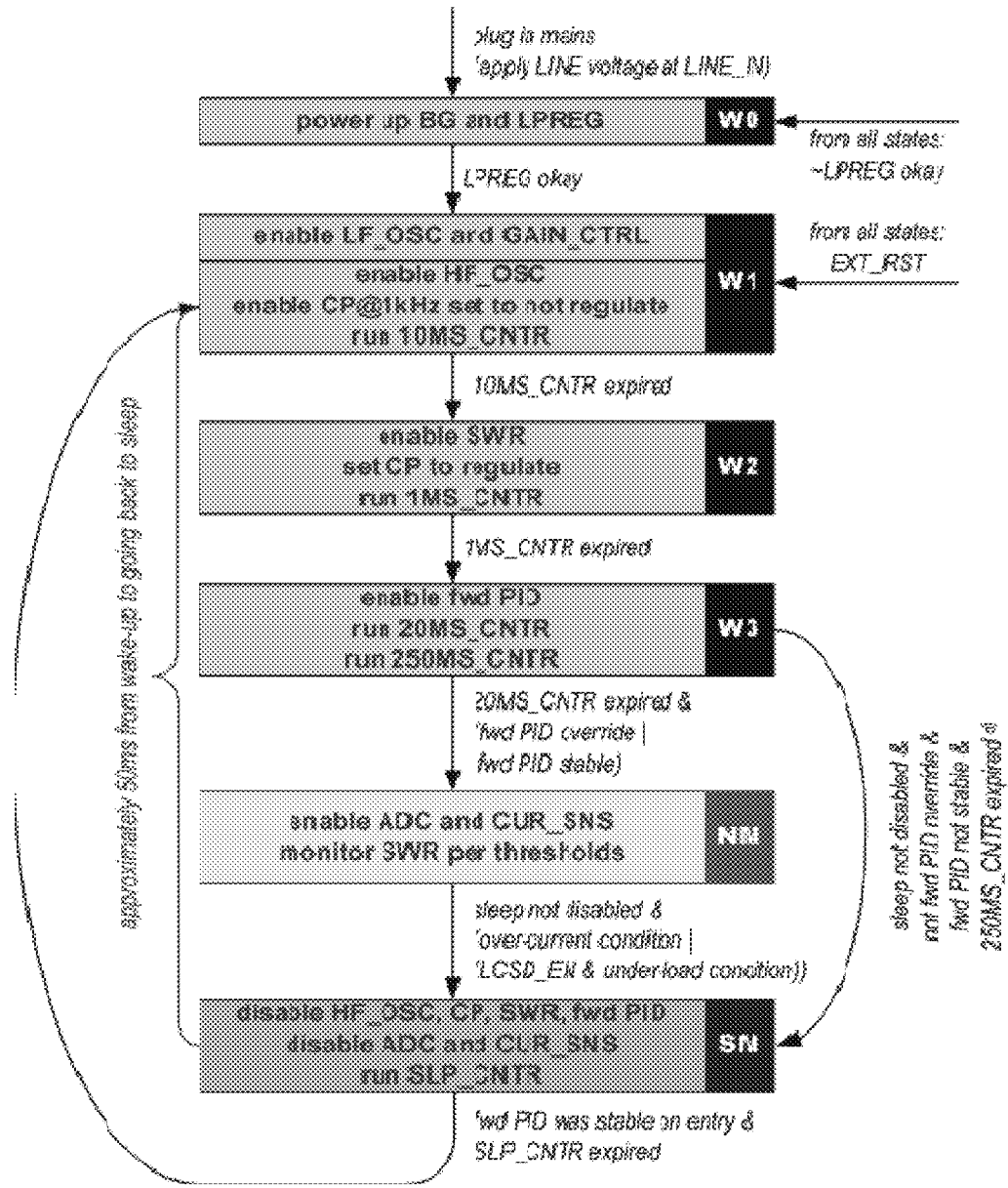
FIG. 23 is a flow chart illustrating a method of operating the power circuit shown in FIG. 2 for use in providing electrical power to electronic devices, according to an embodiment of the present invention.

FIG. 21 is a block diagram of a Tronium universal digital control block 132 that may be used with the Tronium PSSoC 106. FIG. 22 is a block diagram of a Tronium autonomous digital control block 134 that may be used with the Tronium PSSoC 106. FIG. 23 is a flow chart illustrating a method of operating the power circuit 22. FIG. 24 is a graphic illustration of a state transitions that may be implemented by the Tronium PSSoC 106.

Referring to FIG. 21, in one embodiment, the Tronium PSSoC 106 includes the universal digital control block 132. The Tronium universal digital control block 132 provides the following functions for control of the Universal Module: Control State Machine, Clock Generator, ADC Controller, Clock Dither LSFR, I2C Interface—Mono or Dual Communication Mode, Programmable Communication Mode, microprocessor Interface, Test/Eval Multiplexer, and/or Register File.

The Control State Machine or microcprocessor/microcontroller determines the proper operating mode of the Tronium Module by monitoring the output current of the switch capacitor circuit. At least two modes of operation are provided including a Sleep mode and a Normal regulation mode. The Control State Machine or microprocessor also provides four states to wake-up the PSSoC, plus the Bump Charge Mode, upon the first application of power, or when exiting from the Sleep mode. In addition, the state machine or microprocessor continually monitors the output voltage current for an over-or-under-current alarm condition.

Monitoring of the switch capacitor output current is achieved in the analog subsystem or in the microprocessor with the use of a Current Sense Amplifier and an Analog-to-Digital Converter (ADC). The Digital Control block provides control of the ADC and can perform periodic gain and offset correction for the ADC. The ADC samples are then compared to the programmed digital thresholds for switch capacitor current required by the Control State Machine.

A Clock Generator provides the clocks required for the analog and digital subsystems, and also enables clock gating to minimize power consumption in the Sleep mode of operation.

The Digital Control block provides a single-wire serial interface to support configurability of the PSSoC via an external microprocessor; or a multi-wire interface which will support two way communication between the Tronium PSSoC and the microprocessor or state machine. A Clock Dither Linear Feedback Shift Register (LSFR) is included to generate pseudo-random numbers for dithering of the Forward and Buck Regulator PWM clocks. The pseudo-random number is used by the analog subsystem to dither the high-frequency oscillator output. An I2C port is included for manufacturing settings, test, evaluation, updates, health-checks and debug. The Register File which contains configuration registers for device operation can be accessed using the I2C interface. A digital multiplexer is provided to selectively multiplex various internal digital signals to the DIGTST output pin for test purposes.

Referring to FIG. 22, in one embodiment, the Tronium PSSoC includes the autonomous digital control block 134 that provides the following functions for control of the Autonomous Module: the Control State Machine or microcontroller; Clock Generator; ADC Controller; Clock Dither LSFR; I2C Interface; Test Multiplexer; and Register File. The Control State Machine determines the proper operating mode of the Tronium PSSoC 106 by monitoring the output current of the switch capacitor circuit at the CP_OUT pin. Two modes of operation are provided including a Sleep mode and a Normal regulation mode. The Control State Machine or microcontroller also provides four states to wake-up the IC upon the first application of power, or when exiting from the Sleep mode. In addition, the state machine monitors the output current for an over-under-current alarm condition and Bump Charge Mode.

Monitoring of the switch capacitor output current is achieved in the analog subsystem with the use of a Current Sense Amplifier and an 12-bit Analog-to-Digital Converter (ADC) is used in this example. The Digital Control block provides control of the ADC and can perform periodic gain and offset correction for the ADC. The ADC samples are then compared to the programmed digital thresholds for switch capacitor current required by the Control State Machine and/or microcontroller.

A Clock Generator provides the clocks required for the analog and digital subsystems, and also enables clock gating to minimize power consumption in the Sleep mode of operation or Bump Charge Mode.

A Clock Dither Linear Feedback Shift Register (LSFR) is included to generate pseudo-random numbers for dithering of the Forward and Buck Regulator PWM clocks. The pseudo-random number is used by the analog subsystem to dither the high-frequency oscillator output.

An I2C port is included for manufacturing settings, evaluation, upgrades, resets, chip health-checks, test and debug. The Register File which contains configuration registers for device operation can be accessed using the I2C interface.

A digital multiplexer is provided to selectively multiplex various internal digital signals to the DIGTST output pin for test purposes.

In the illustrated embodiment, the Tronium autonomous digital control block 134 includes a State Machine to determine the proper mode of operation for the Autonomous Module based upon the load current.

As shown in FIGS. 23 and 24, the Control State Machine provides four wake-up states (W0, W1, W2 and W3) and two operating modes; a Normal Mode and a Sleep Mode.

Wake-Up 0 (W0)—When power is applied, the line-side circuits wake up: the bandgap (BG) and the low-power regulator (LPREG) power up. After the LPREG is stable, por_b is released and the system transitions to Wake-Up 1 (W1).

Wake-Up 1 (W1)—The low-frequency oscillator (LF_OSC) and the gain_control (GAIN_CTRL) get enabled. At the same time, the high-frequency oscillator (HF_OSC) and the charge_pump (CP) get enabled. The CP is set to not regulate. When the LF_OSC is stable, the lf_clk to the digital block is released at which point (a) the 10 mS counter starts up and (b) the 1 kHz clock to the switch capacitor becomes active. When the 10 ms counter expires, the system transitions to Wake-Up 2 (W2).

Wake-Up 2 (W2)—The switch-regulator (SWR) gets enabled, the CP is set to regulate and the 1 mS counter starts. When the 1 mS counter expires, the system transitions to Wake-Up 3 (W3).

Wake-Up 3 (W3)—The forward PID gets enabled and two counters start up: the 20 mS counter and the 250 mS counter. The following scenarios provoke transitions from this state: a. The 20 mS counter expires and the forward PID override option is on: The system transitions to normal mode (NM); b. The 20 mS counter expires, the forward PID override option is off and the forward PID stabilizes before the 250 mS counter expires: The system transitions to normal mode (NM); c. Sleep mode is not disabled, the forward PID override option is off and when the 250 mS counter expires, the forward PID has not stabilized yet: The system transitions to sleep mode.

Normal Mode (NM)—The current sense block (CUR_SNS) and the ADC get enabled. If self-calibration is not disabled, the ADC uses the first two samples for gain and offset calibration and signals that the ADC data is okay when the third sample is ready. If self-calibration is disabled, the ADC performs gain and offset correction with the values programmed in the designated registers and signals that the ADC data is okay when the third sample is ready. When the ADC data is okay, the system monitors the current load. The following mutually exclusive conditions, the thresholds for which are programmable, can occur: 1. Over-current condition: The system sets the over-current status bit. If sleep mode is not disabled, the system transitions to sleep mode (SM); and 2. Under-load condition: If the LCSD_EN pin is high and sleep mode is not disabled, the system transitions to sleep mode (SM); and 3. Low-load condition: The system shuts down the SWR when it detects a low-load condition and turns the SWR back when the low-load conditions subsides.

Sleep Mode (SM)—The system disables the HF_OSC, the CP, the SWR, the forward PID, the CUR_SNS) and the ADC. It also starts the sleep counter, the duration of which is programmable. The default sleep time is approximately 5 seconds, which may be adjusted depending on use application. The system stays in sleep mode if the forward PID previously hadn't stabilized on entry to sleep mode. In this case, the system can be restarted in W1 by triggering the EXT_RST pin or in W0 by removing power. If the forward PID was okay on entry to sleep mode, the system transitions to the W1 state when the sleep counter expires.

In the illustrated embodiment, the transition between the Normal and Sleep modes of operation is achieved by monitoring the output current of the switch capacitor circuit via the Current Sense Amplifier and the ADC. In addition, the Control State Machine can disable the SWR Buck Regulator if the load current decreases to the programmed digital threshold. Monitoring of the current and the corresponding mode transitions is illustrated in the diagram of FIG. 24.

Referring to FIGS. 21 and 22, the digital control block 122 may include a clock generator which generates all the clocks required by the digital subsystem. Three clock domains are provided which are asynchronous to each other, a low-frequency clock domain, a high-frequency clock domain, and a I2C clock domain.

The Low-Frequency Oscillator in the analog subsystem provides a clock, in the illustrated example, a 16 kHz clock for the digital subsystem (lf_clk). In addition to the clock used by the Register File, the Clock Generator derives the following clocks from lf_clk: 1. sys_clk—An 8 kHz clock with a 50% duty cycle which clocks the control state machine. 2. adc_g-clk—A gated version of sys_clk which clocks the ADC controller. This clock is gated off in sleep mode. 3. lfdiv_clk—A divided clock with a programmable frequency of 1, 2 or 4 kHz with a 50% duty cycle to be used in the analog block. This clock is gated off in sleep mode.

The oscillator can be bypassed in the analog subsystem via the TSTMD0 input to enable the application of a 16 kHz clock from the EXT_CLK pin.

The High-Frequency Oscillator in the analog subsystem provides a 1.6 MHz, 50% duty-cycle clock which is further divided by the Clock Generator to create the hfdiv_clk. The hfdiv_clk is programmable via the Register File to provide frequencies of 100, 200, and 400 kHz. The hfdiv_clk is also used in the digital for the Clock Dither LFSR and in the analog for the Buck Regulator and Forward PID loops. The clock shuts off in sleep mode when the HF Oscillator is disabled in the analog.

The I2C Interface uses the clock input at the SCLK pin to control operation of the I2C port. Data rates of up to 100 Kbps are supported.

In the illustrated embodiment, the digital control block 122 also includes an ADC controller which generates the control signals for the general purpose 12-bit ADC in the analog subsystem. It also controls selection of the input to the ADC for conversion via the ADC multiplexer and the ADC_MUX_SEL registers in the CONTROL0 register. The ADC output format is magnitude. The Digital Control block performs a self-calibration routine once when the ADC is first enabled. The Digital Control block can configurably use the gain and offset correction values calculated during the self-calibration, or use the gain and offset correction values written to the ADC_GAIN and ADC_OFFS registers.

During the self-calibration routine the offset and gain correction values are determined as described below.

The Offset is determined first as follows: Set the ADC input mux to select the Reflo reference voltage. Do one ADC conversion. The Ideal value would be 0. Load the ADC Conversion data into the local ADC Offset Correction Register.

The Gain is determined next as follows: Set the ADC input mux to select the Refhi reference voltage. Do one ADC conversion. The Ideal value would be 4095. Load the local ADC Gain Correction register with the results of (ADC Conversion data−Offset Correction)/4095.

Following the self-calibration phase, the ADC Conversion values are corrected as follows: ADC Corrected data=(ADC Conversion data−Offset Correction)/4095.

The Clock Dither LFSR provides pseudo-random number values to implement dithering on the 1.6 MHz clock to mitigate EMI. The LFSR is a 12-bit, maximum-sequence, Galois-type LFSR with the polynomial of $\times 12+\times 6+\times 4+x+1$. The dither value is generated as shown in the table below. The Clock Dither LFSR can be selectively enabled or disabled with the dith_en register bit in the Control register.

In one embodiment, the Tronium PSSoC digital control block 122 may include a configurable down counter with a range of 0.512 Sec to 16.384 Sec, to implement the Sleep Timer function. The Step size is 512 mS. The counter receives its clock from the Clock Generator block where it is divided down from the LF Oscillator clock. The counter is loaded with the sleep_time value programmed in the SLEEP_CTRL register. The counter will count down from this value until it reaches zero at which time it notifies the Control State Machine that the Sleep Timer has expired.

Figure 25:
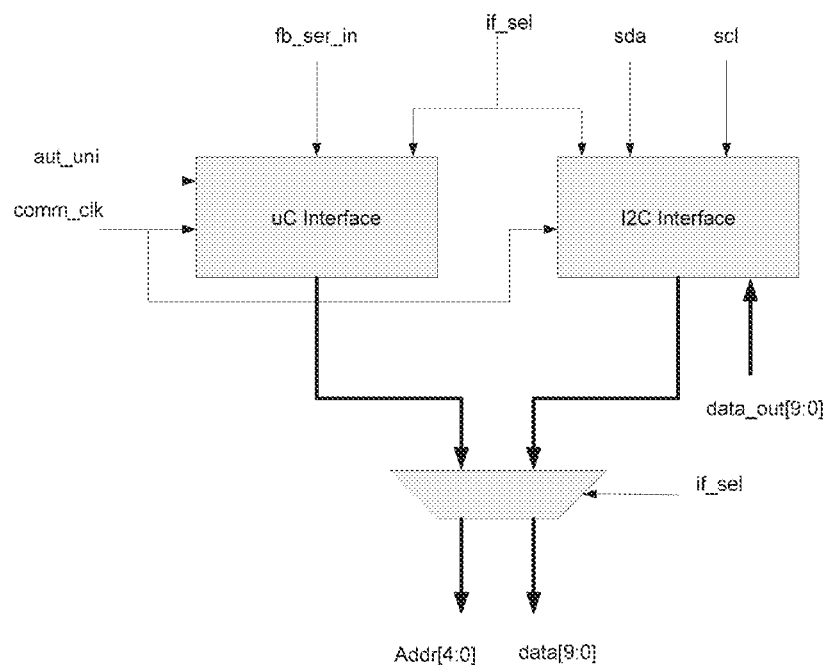
FIG. 25 is a schematic illustration of a communication interface that may be used with the power controller integrated circuit shown in FIGS. 16, 17A, and 17B, according to an embodiment of the present invention.
Figure 26:
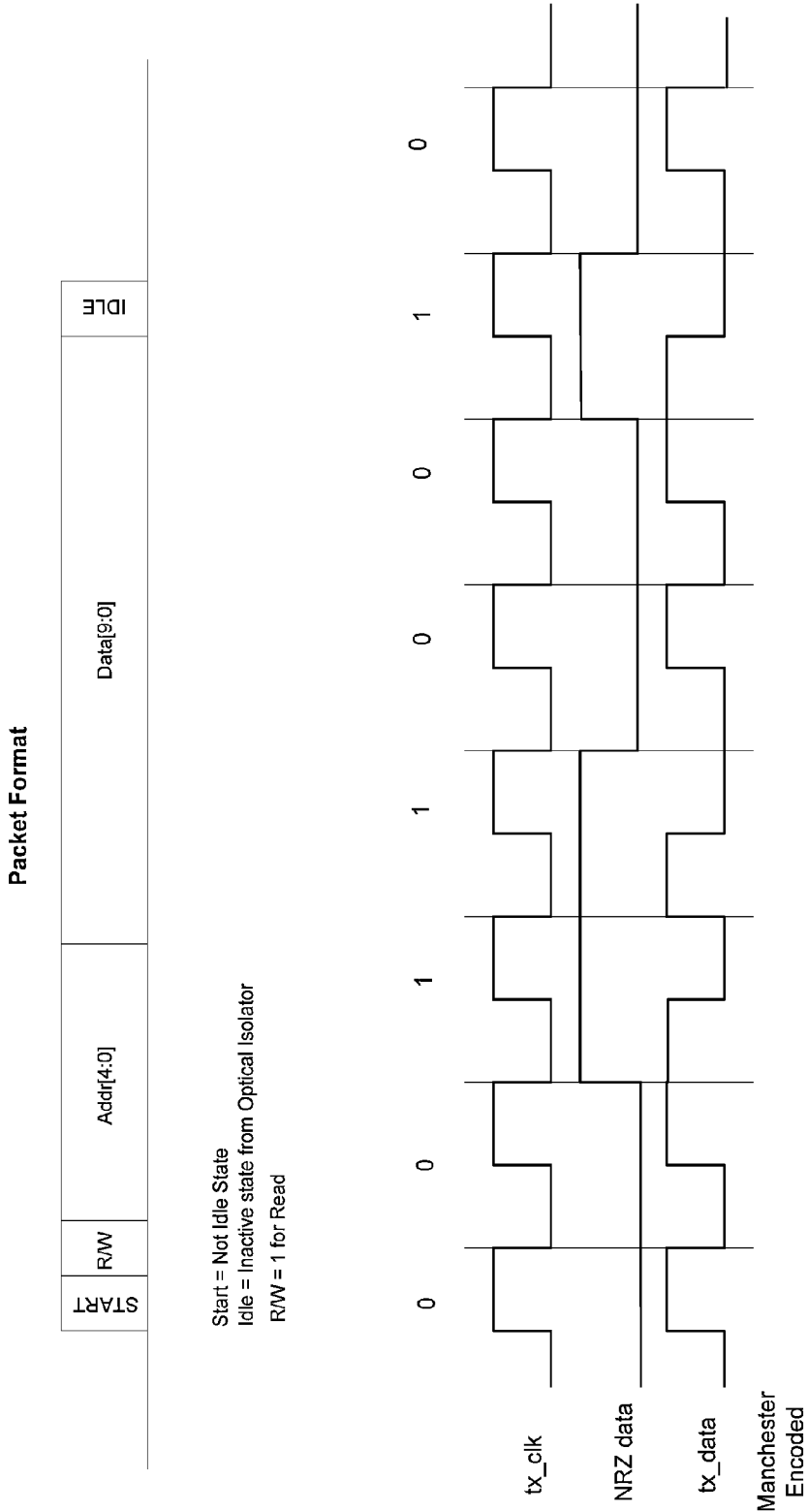
FIG. 26 is a schematic illustration of a microprocessor communication protocol that may be used with the power controller integrated circuit shown in FIGS. 16, 17A, and 17B, according to an embodiment of the present invention.

FIG. 25 is a schematic illustration of a communication interface that may be used with the Tronium PSSoC 106. FIG. 26 is a schematic illustration of a microprocessor communication protocol that may be used with the Tronium PSSoC 106. In the illustrated embodiment, the communication may be uni-directional or bi-directional. The Tronium PSSoC 106 contains one or more communication interfaces, here described as three interfaces: 1) a microprocessor interface, 2) a single or dual communications/update interface for programming values or returning information to the state machine/micro, and 3) a test/eval interface. The microprocessor interface will be used to communicate with an external microprocessor for certain products, the communications/update interface may update the micro or any of the values internal in the chip. This allows for product configurability and for implementation of a control loop for the Tronium charger. For the Tronium PSSoC, this can be either a read/write or a write only interface, i.e. the microprocessor will or will not be able to read from the PSSoC depending on the type of communication determined: one way or multilateral.

The test/eval interface will be used in the manufacturing test environment, and for bench evaluation of the Tronium PSSoC. It will allow for write and read access to the on-chip registers. The upgrade, eval, health-check and reset interface will be used to reprograma chip, change its voltage/current output, or change other reprogrammable portions of the control logic, including thresholds, as well as run scans to help determine if anything is wrong with the chip (health-check).

Typically, only one interface can be selected at a time, but this can be changed based on the state machine or micro settings. The IF_SEL input pin selects the I2C when '1' and the microprocessor interface when '0'.

Microprocessor Communication Interface. The Tronium PSSoC may also provide a single-wire serial interface to support configurability of the PSSoC. The interface consists of uni- or multi-directional data input/output. The protocol is shown in FIG. 26. All packets will be homogenous in structure and length unless otherwise necessary. Each packet will be a certain number of bits. The packet fields are described below. By adding another wire, a dual communication interface may be had so that the information is multi-directional.

To support reliable communication, the data may be Manchester Encoded per the IEEE 802.3 Communication Standard. The receiver will then use an over-sampling clock to maintain bit synchronization over the packet. The bit rate will be 600 Kbps. The incoming data will be oversampled by a factor of 16 times the bit rate. The oversampling clock is therefore 9.6 MHz, and is sourced from an on-chip RC oscillator.

Start: A single bit whose value is the non-idle state of the signal line. This will be '1' for this application. R/W: A single bit to indicate a read or write request. When '0', the data is written to the selected Tronium register. Note that Tronium only supports write accesses. Addr[4:0]: 5 bits used to address the Tronium configuration registers. Data[9:0]: 10 bits to be written to the selected Tronium register. For cases where the target register is less than 10 bits, data will be right justified. For example when writing to an eight bit register, Data[7:0] will be written to the addressed register location. Idle: A single bit whose value is the idle state of the signal line. This will be '0' for this application.

Data is transferred MSB first. For example, Addr[4] is transmitted first in time by the host. The Tronium implementation will or will not support read operations of the ASIC registers by the host depending on the programming. The R/W bit is included for future expansion.

Figure 27:
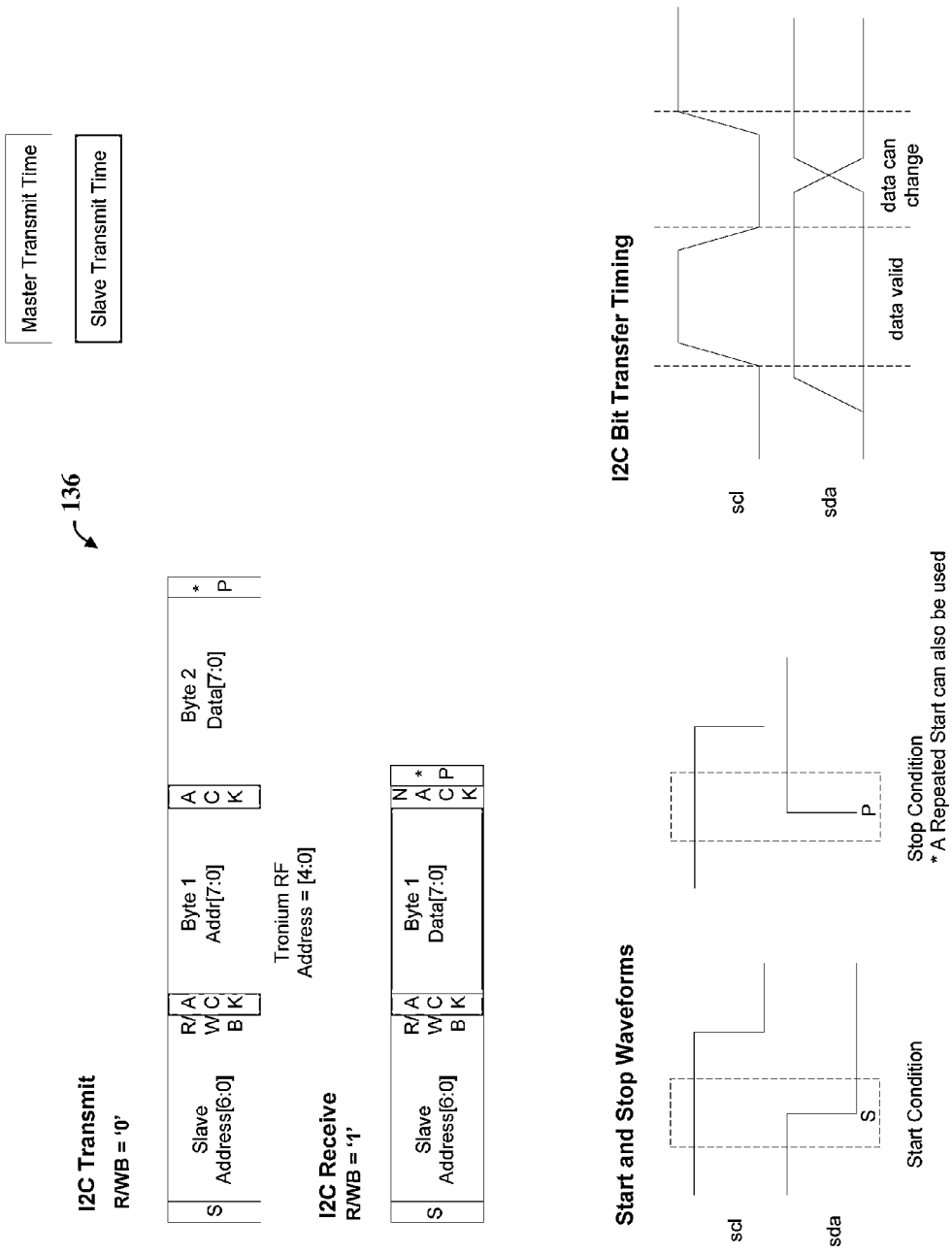
FIG. 27 is a schematic illustration of an Inter-Integrated Circuit that may be used with the power controller integrated circuit shown in FIGS. 16, 17A, and 17B, according to an embodiment of the present invention.

FIG. 27 is a schematic illustration of an Inter-Integrated Circuit 136 that may be included in the Tronium PSSoC 106. In the illustrated embodiment, the Tronium PSSoC 106 contains an I2C slave port to support testing of the device. The I2C address is configurable using the I2C_ADDR pins. The I2C_ADDR inputs are compared to the I2C Slave Address bits. The Tronium I2C Bus protocol is shown FIG. 27. The I2C Interface supports bit transfer rates up to 100 Kbs. The I2C interface runs entirely off the I2C SCLK clock input.

I2C Write Operations: The Tronium PSSoC supports writes to the Tronium Memory Mapped registers over the I2C Slave port. After receiving an I2C slave address which matches the Tronium I2C address, the next byte, shown as byte1 in FIG. 27, will contain the 5 bit address field for the Tronium Register File addresses. The Tronium PSSoC only supports access of one register per command.

I2C Read Operations: The Tronium PSSoC supports reads from the Tronium Memory Mapped registers over the I2C Slave port. The read operation requires two I2C operations. First, an I2C write to the RDREQ register where the data in byte2 is the Tronium Memory Map address of the register to read. Then an I2C read command will read the requested register. The Tronium only supports accessing one register per command.

Note that there is a delay between the I2C Write operation and the time at which the RDREQ register is updated. This means that following the I2C Write operation, the I2C Master must wait 400 μsec before issuing the I2C Read operation. This wait time only applies to the first I2C read following the I2C Write to update the RDREQ register.

In one embodiment of the Tronium PSSoC the digital memory has intelligence where if the Tronium PSSoC is powering a television, if a television has not been used from a certain time period to another, such as midnight to 7:00 o'clock A.M. for a fixed number of days, the Tronium would always put itself into Sleep Mode during these times to conserve energy and not re-engage in the current sensing routine of the wake-up sequencing.

In another embodiment of the invention, the Tronium PSSoC is connected through its I2C interface to wireless (like BlueTooth®) or power-line type communication protocols and devices, either external, on-chip or on-module, in order to receive instructions to the state machine or microprocessor. In this fashion there could be "real-time" instructions given to the Tronium about when to go to Sleep Mode, when to wake up, and reset, upgrade or change other preconditions, like over-voltage or PWM regulation. In this fashion, the Tronium PSSoC can have "real-time" sensing and switching of its control mechanism to achieve different levels of frequency, speed, or adapt to low power situations, like in some countries, where the grid typically runs under-voltage during significant portions of the time. In this case the Tronium PSSoC can get real-time information about resets, operation, or shutdowns/restarts, including real-time commands from its owner, even from a cell phone or tablet through the use of cell system to inside the home communication technologies. In this case a person may want to shut down power to certain electronic equipment or electronic devices powered by the Tronium PSSoC while away, and this could be accomplished through the communication interface over wireless or wire communication technologies giving specific instructions through the I2C interface in the Tronium PSSoC, instructing it to shut down the device, and even pre-setting the time it should wake up.

In another embodiment of the invention, and when used as a charger or constant supply power, the Tronium PSSoC is small enough to fit into a wall plug attached to the cord, therefore eliminating the need for a charger "box" or laptop "brick".

In one embodiment, the Tronium PSSoC 106 has several test structures to support manufacturing, programming, eval, upgrading, health-check, communication, test and bench evaluation. The Tronium PSSoC provides two test registers for controllability and observability of key internal functions and control signals. The TEST_CTRL0 register provides the user with the ability to selectively enable, disable, or override the control of individual analog circuit functions in the Tronium PSSoC to provide an alternate method of control should the Control State Machine need to be bypassed. The TEST_CTRL1 register provides the ability to multiplex internal analog and digital signals to the ANATST and DIGTST output pins for test purposes.

Many modifications and variations of the present invention are possible in light of the above teachings. The invention may be practiced otherwise than as specifically described within the scope of the appended claim.

Figure 30:
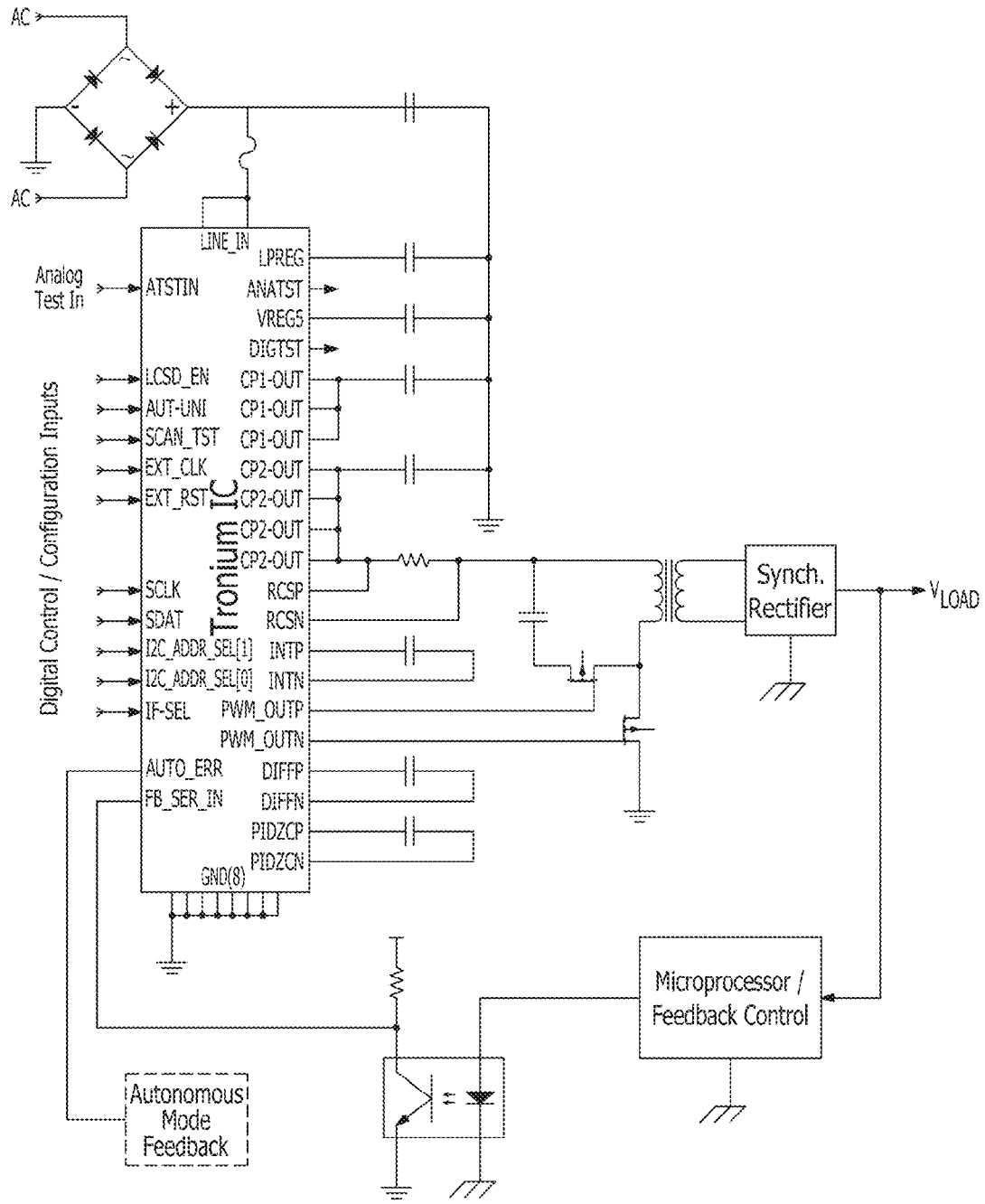
FIG. 30 is a connection diagram that may be used with the power controller integrated circuit shown in FIGS. 16, 17A, and 17B, according to an embodiment of the present invention.
Figure 31:
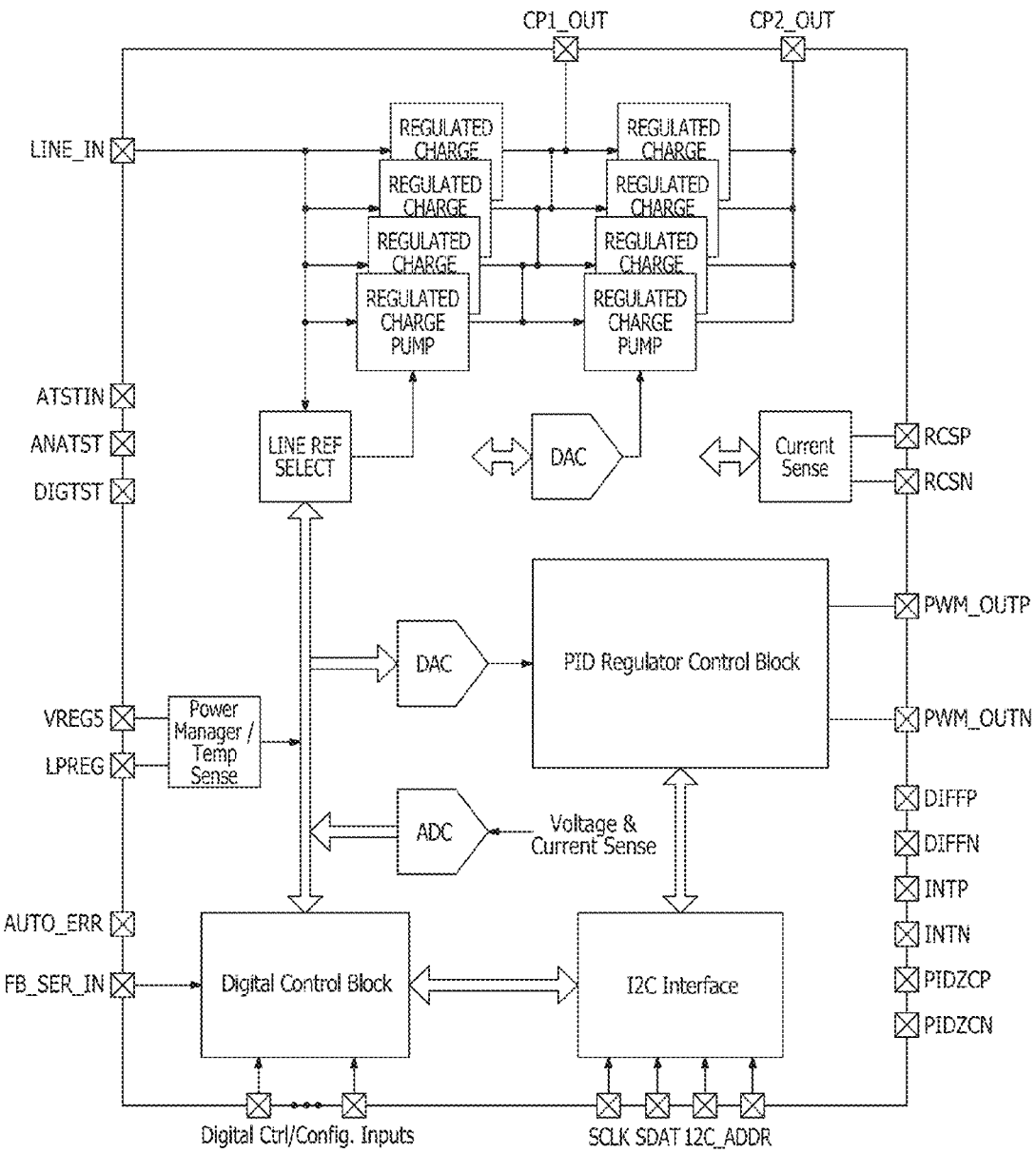
FIGS. 31 and 32 are additional schematic illustrations of the power controller integrated circuit shown in FIGS. 16, 17A, and 17B, according to embodiments of the present invention.
Figure 32:
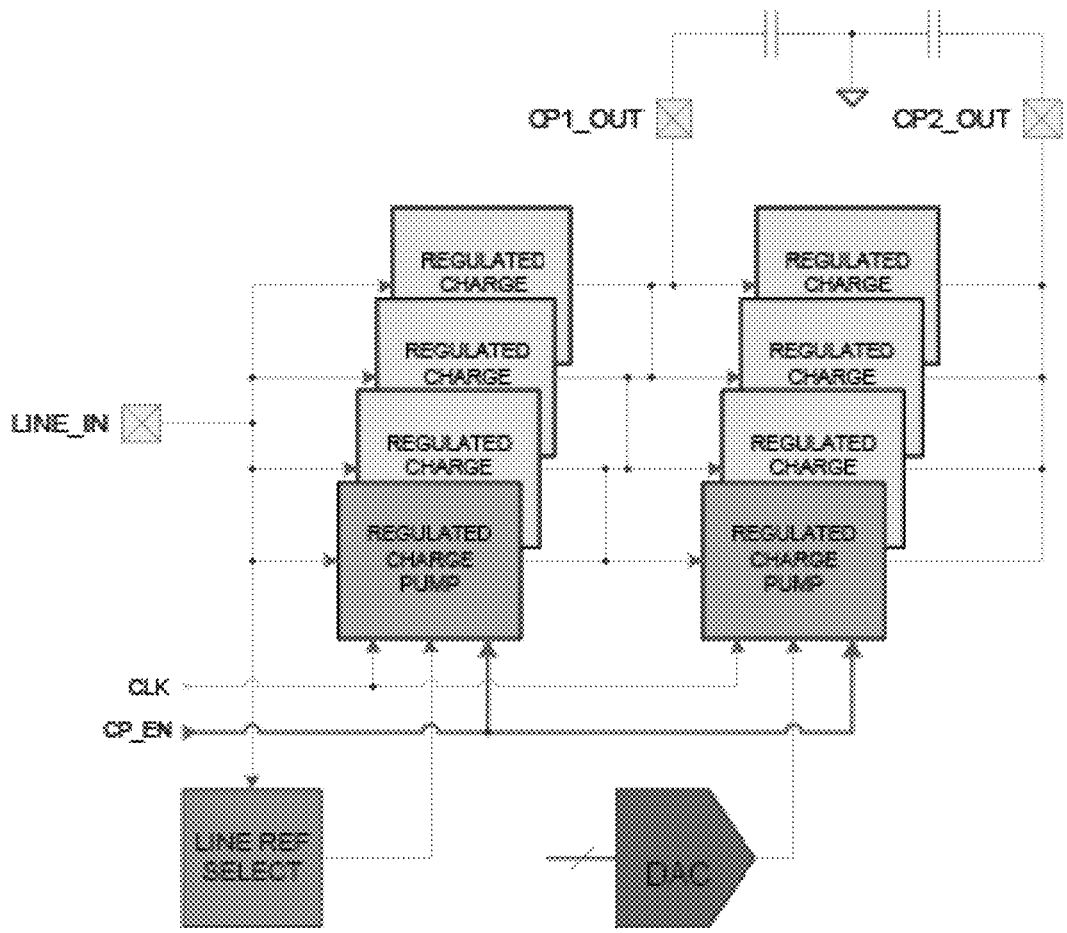
Figure 33:
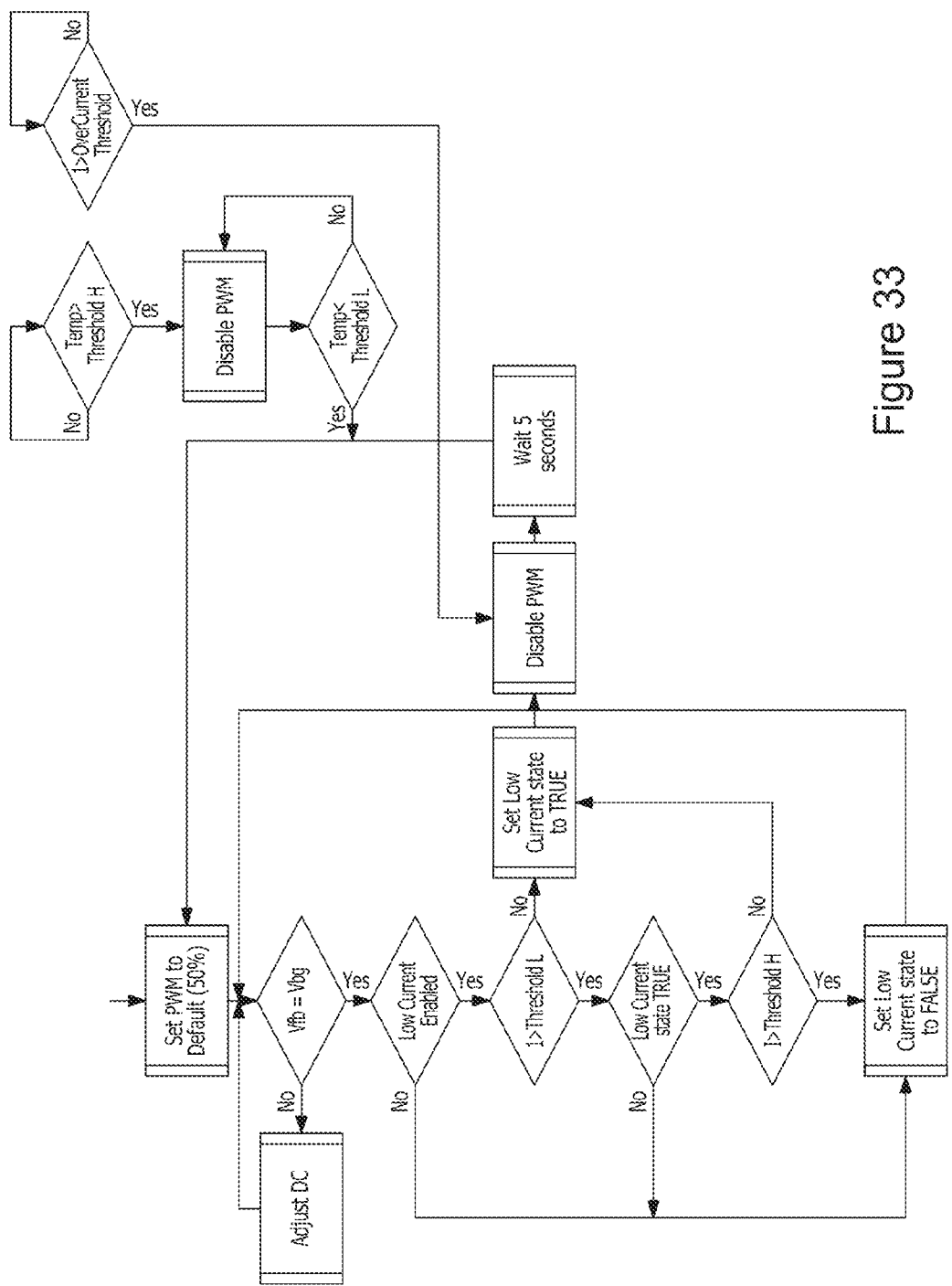
FIG. 33 is a flow chart of an algorithm for a low-current detection and an error detection that may be used with the power controller integrated circuit shown in FIGS. 16, 17A, and 17B, according to an embodiment of the present invention.
Figure 34:
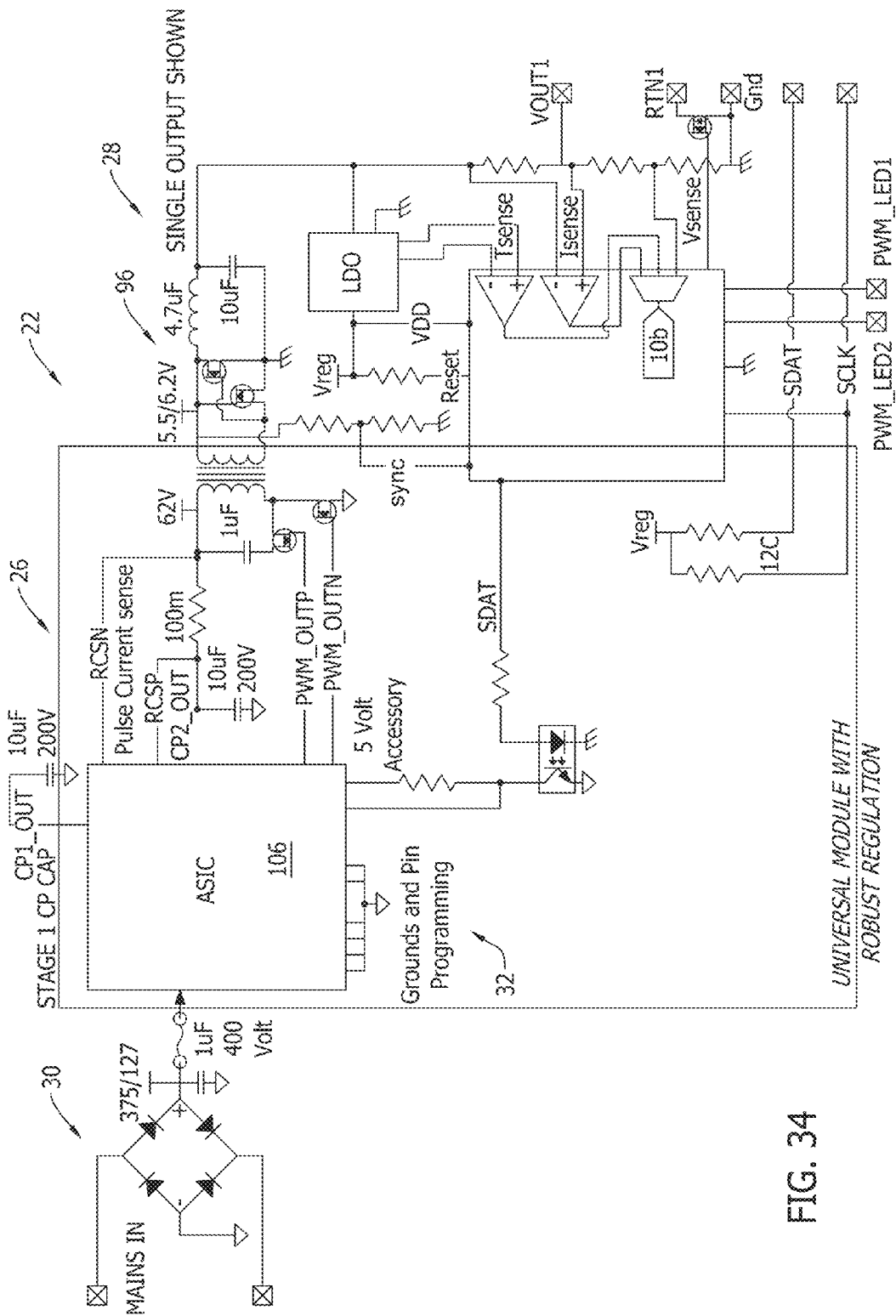
FIGS. 34 and 35 are schematic illustrations of the power circuit shown in FIG. 2, according to an embodiment of the present invention.
Figure 35:
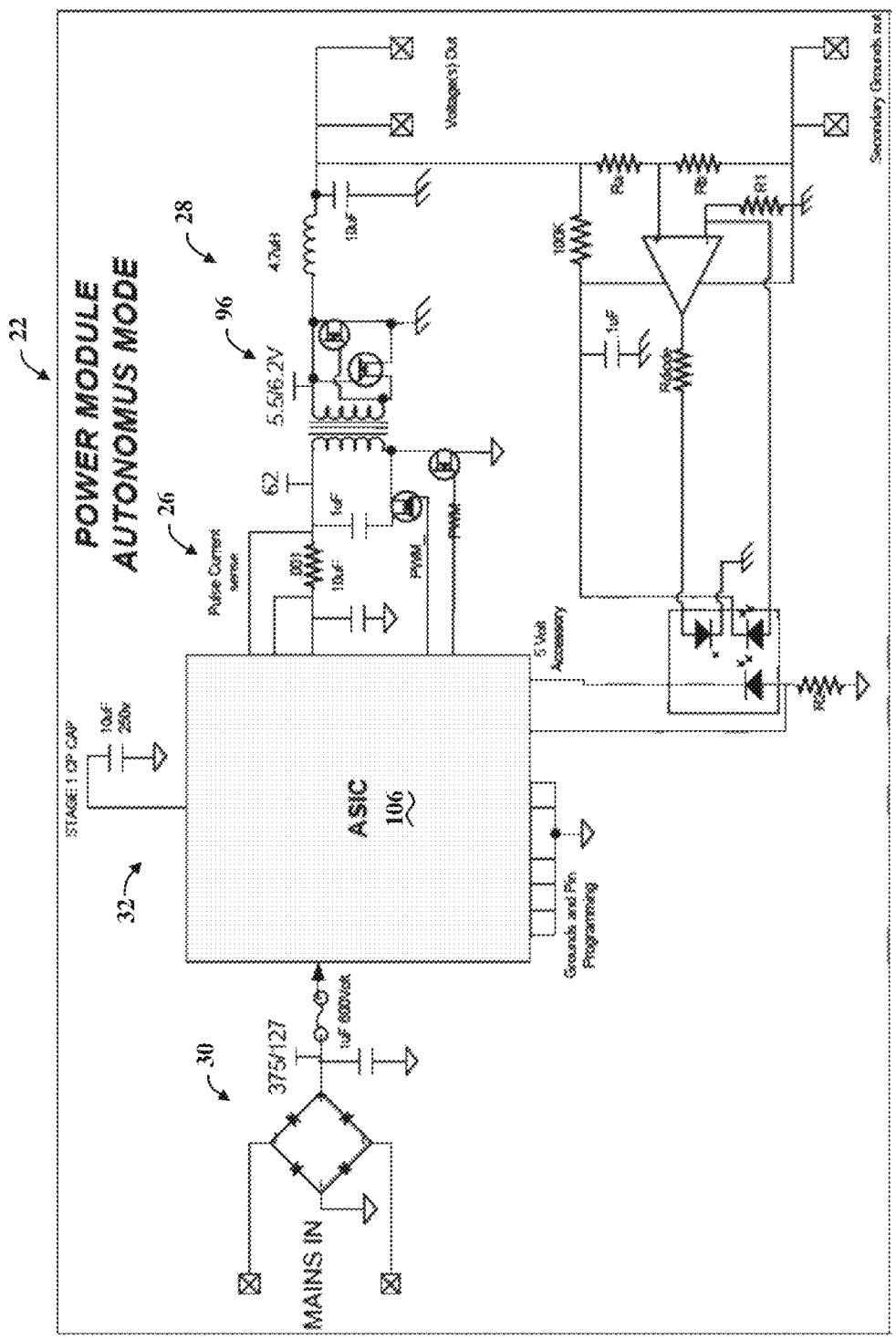

FIG. 30 is a connection diagram that may be used with the Tronium PSSoC 106. FIGS. 31 and 32 are additional schematic illustrations of the Tronium PSSoC 106. FIG. 33 is a flow chart of an algorithm for a low-current detection and an error detection that may be used with the Tronium PSSoC 106. FIGS. 34 and 35 are schematic illustrations of the power circuit 22 including the Tronium PSSoC 106. In the illustrated embodiment, the Tronium PSSoC 106 is an advanced power controller integrated circuit (IC). The Tronium PSSoC 106 and corresponding integrated Module provide a low-cost, highly efficient means to convert the AC line voltage present at a typical home or business electrical outlet to a reduced regulated DC voltage for consumer electronic applications. Typical applications include, but are not limited to, charging systems for cell-phones, tablets or other handheld devices, USB power conversion, power supplies for consumer, medical and industrial devices, and many other possible uses.

The Tronium PSSoC provides high efficiency, low noise, and low EMI with the configurations and features as set out above. In addition, the AC-DC, DC-DC converter has high power density, low cost, and electric isolation. These advantages are achieved from integrating otherwise discrete parts onto the chip, utilization of the Switch Capacitors Voltage Breakdown scheme and primary side sense/control. Thus, the key features of the Tronium PSSoC are as follows: Support for wide range of available AC input voltages and frequencies; Programmable Output Voltage and auto-detect of input voltage with automatic setting to configure to the input voltage for proper operation; High-Efficiency switch capacitor circuit for AC-DC, DC-DC Conversion; PID (or similar) Regulation Control Loop for High Accuracy; Digital State Machines for Current and Temperature Monitoring; Ultra-Low Power Dissipation for Idle (Vampire) Mode of Operation; Opto-Isolated Microprocessor Interface for Configuration and Control; and Communications Port for Manufacturing Test.

The analog and digital interfaces, inputs, and outputs of the Tronium PSSoC are able to withstand Voltages and Currents that are outside of the typical operating range. The unit is also operable over a wide temperature range and provide ample ESD immunity.

The Tronium PSSoC provides inputs and outputs to interface to the outside world and external circuitry. These include but are not limited to: power inputs, power outputs, low current shutdown enable inputs, mode selection input, intermediary connections for which external circuitry is required, test connections, communications connections, power outputs, regulator outputs, connections for PID based PWM, FET drive outputs, and feedback inputs.

The Tronium PSSoC is an advanced power controller integrated circuit designed to provide output voltage regulation with high-efficiency and high accuracy. The advanced features of the Tronium PSSoC provide the user with a multipurpose device which can be used in a large variety of applications. Programmable output voltages are possible with the Tronium PSSoC, with little or no loss of efficiency across a variety of current load conditions.

The Tronium PSSoC uses a proprietary switch capacitor circuit system to maintain high-efficiency regardless of the load voltage or current. When no current is being drawn by the load, the device will enter a low-current mode of operation to minimize the traditional 'vampire' current required to stay awake as well as scale the number of active subsystems to the load in order provide high efficiencies across a wide loading range.

A top-level block diagram of the Tronium PSSoC is shown below, and is comprised of the following major circuit blocks: High-Voltage Multi-Stage/Multi-Branch switch capacitor voltage breakdown circuit; PID (or other switched mode control scheme), Regulator Control Block for PWM Control of Secondary Transformer; Current and Temperature Sense Blocks; ADC or Comparator for Voltage and Current Monitoring; DAC, PWM, or other signal for Feedback Control; Digital Control Block for Voltage & Current Monitoring State Machines; Communications Interfaces; and Power Management for On-Chip Voltage and Current Generation and other power requirements.

Power Management. The power management block provides necessary power rails and references to the rest of the IC. It is comprised of voltage regulators, current references and voltage references. It also includes all necessary buffering and amplification needed for IC usage. The power management system also contains a reset controller which manages the shut down and start up of the system on power cycle.

Switch Capacitor Voltage Breakdown Circuit. The switch capacitor voltage breakdown circuit of the Tronium PSSoC works as a near lossless voltage divider. It divides the rectified DC voltage present at the LINE_IN pin to a reduced voltage at the CP2_OUT pin for use by the external transformer and secondary voltage control loop. An external transformer can then further reduce this voltage to the desired application voltage as a function of the primary-to-secondary windings ratio, as well as provide isolation if desired.

The switch capacitor circuit is configured as a cascade of multiple identical stages with multiple parallel branches as shown below. The parallel branches are switched in or out of the circuit based upon the load current that is sensed by the current sense amplifier. This enables the switch capacitor circuit to maintain high efficiency across the wide range of load currents. In the diagram below, the number of parallel subsystems is 4 comprising two stages. The number of parallel systems and conversion stages may change so that the system is best optimized for a particular input/output voltage ratio or power requirement.

The switch capacitor circuit uses on-chip or off-chip flyback capacitors to maximize power efficiency and external hold capacitors to minimize the voltage ripple. These capacitors are connected to the CP1_OUT and CP2_OUT pins, respectively, for the outputs of the 1st and 2nd stages of the switch capacitor circuit. All stages are clocked by an oscillator, or each stage may have its own dedicated oscillator. Each branch of the switch capacitor circuit may have an independent enable.

The output voltage is programmable over the range of voltages for a given range of applications with high resolution with the use of a digital-to-analog converter (DAC). The digital control of this DAC enables multiple voltages to be programmed at the CP2_OUT pin to obtain the desired final output voltage required for the target application.

The switch capacitor circuit output settings of the other switch capacitor circuit stages can be determined by the user or derived from the measured AC line Vin, so that an optimum ratio between Vin and Vout can be realized.

Regulation of each switch capacitor circuit stage is obtained with the use of an Operational Trans-conductance Amplifier (OTA). The OTA regulates the current applied to the fly-back capacitors in each stage as a function of the difference between the output voltage and the input reference voltage. The input reference voltage may be programmed, derived, or fixed depending on application.

Voltage measurement of the incoming line may be taken in order to optimize the switch capacitor circuit settings. This setting calculation can be performed on-chip, off-chip, or on the fly through appropriate on chip circuitry, so that the outputs of each switch capacitor circuit stage are in the most optimized ratios.

Current Sense Amplifier. The current sense amplifier in the Tronium PSSoC allows the device to measure current as part of the feedback loop as well as error reporting. The current can be measured by an ADC or through a series of comparators with varying thresholds.

PID Control Loop. The Tronium PSSoC provides a Proportional-to-Integral-and-Differential, PID, loop or alternative PWM control circuit in order to drive the primary side of the isolation transformer, a buck, a boost, or a buck-boost circuit. This circuit is to provide post regulation and isolation if necessary.

Feedback to the PID loop can be from either a digital source for example, but not limited to, a serialized ADC stream or an analog signal, both of which are dependent on the output of the circuit. This feedback can provide information relating regulated output current or voltage.

Temperature Sensor. An on-board temperature sensor may be realized so that ample protection from over temperature situations exists. Actions taken to protect against thermal damage may include de-rating of output power and complete shut-down of output.

Control Circuitry. The Tronium PSSoC provides for control whether through digital means or through analog circuitry. Through this control circuitry, the IC is able to set and change existing control thresholds and control points as well as enable/disable specific functionality. This can be done through registers or fuses in a digital interface situation or through applied voltages to analog pins should analog setting be desired.

If the feature is enabled, the Tronium PSSoC allows the output of the system to be disabled or de-rated. This can take place by turning off the PWM, switch capacitor circuit, or through de-ration of either or both subsystems. The output can be disabled as a result of error detection or as a result of a low output current or output power situation such as arises when a connected device that includes a battery is done charging the battery and the Tronium PSSoC is only providing power to the non-battery charging functionality. Once the Tronium PSSoC has entered into a low current shut-down state, it will intermittently re-apply output power to the end device in order to check whether or not it now requires power above certain threshold indicating that the battery now needs further charge. The time spent in the off state may be adjusted for varying applications. FIG. 33 illustrates an example of the algorithm for low-current detection and error detection.

The Tronium PSSoC provides multiple interfaces to external circuitry so that devices may control and configure the IC. These interfaces can include, but are not limited to, SPI, I2C, UART or other synchronous/asynchronous serial stream. Alternate encoding to NRZ formats can also be realized to optimize the size and part count of external circuitry. Likewise these communications interfaces can be connected to isolation devices in order to enable communications from an isolated region should this be desired.

Clock Generator. The Tronium PSSoC may have the ability to generate its own internal clocks which may also include frequency controlling circuits including, but not limited to: internal RC oscillators, PLLs, FLLs, clock dividers, VCOs, and trimming circuitry. Additionally the clocking tree may implement intentional clock jitter or other means to vary the clock edge placement in order to minimize the effects of the clocking on radiated and conducted EMI.

Module Description. The Tronium PSSoC is intended for use as a power supply device which is to be incorporated into a module which accepts AC power in, converts this power to a DC Voltage, and supplies this power external devices. The module can take many forms, which can include either analog or digital feedback of the output to the ASIC, or the ASIC can operate in open loop mode with no feedback. Additionally, module circuitry can be constructed so that individual outputs (should there be a plurality of connected outputs) can be discretely monitored and controlled. The sensing capabilities within the module are meant to supplement or replace the measurements taken by ASIC depending on the application and regulation requirements.

FIG. 34 is a schematic of the power circuit 22 including Digital Feedback module with isolation and discrete output sensing. FIG. 35 is a schematic illustration of the power circuit 22 including Analog Feedback module with linearization of feedback isolation. These represent an analog feedback version and a digital feedback version. Both of these diagrams also indicate an isolation transformer as part of the design. This component may or may not be included in the module depending on the requirements of the application. Both examples describe a synchronous rectification scheme, however an asynchronous system could also be realized.

Digital Feedback Description. The digital feedback module includes a microcontroller, standalone ADC, or secondary ASIC in order to monitor the output voltage and to allow very precise measurements to be taken at the output connection. This allows the module to compensate for component losses, temperature, and other variables that may cause variance in the output voltage. This data is then formatted and sent back to the ASIC to provide the digital feedback stream. Current sensing and output enable transistors are also shown so that should a multitude of outputs be connected to the module with individual sensing at each. In this manner the low power shut-off functionality described in the ASIC description could be applied to individual loads even though the power is shared.

Analog Feedback Description. If for cost or other reasons it is desired to use an analog feedback system, the Tronium PSSoC allows this to be realized through the analog feedback input. In the embodiment shown, the current through an opto-isolation LED is proportional to the output voltage. The circuit is designed so that the voltage at the analog feedback pin on the IC is at nominal voltage when the output voltage is at the target output. Current monitoring is performed by the IC at the primary side of the transformer, and the measurements are scaled by the turns ration of the transformer.

Figure 36:
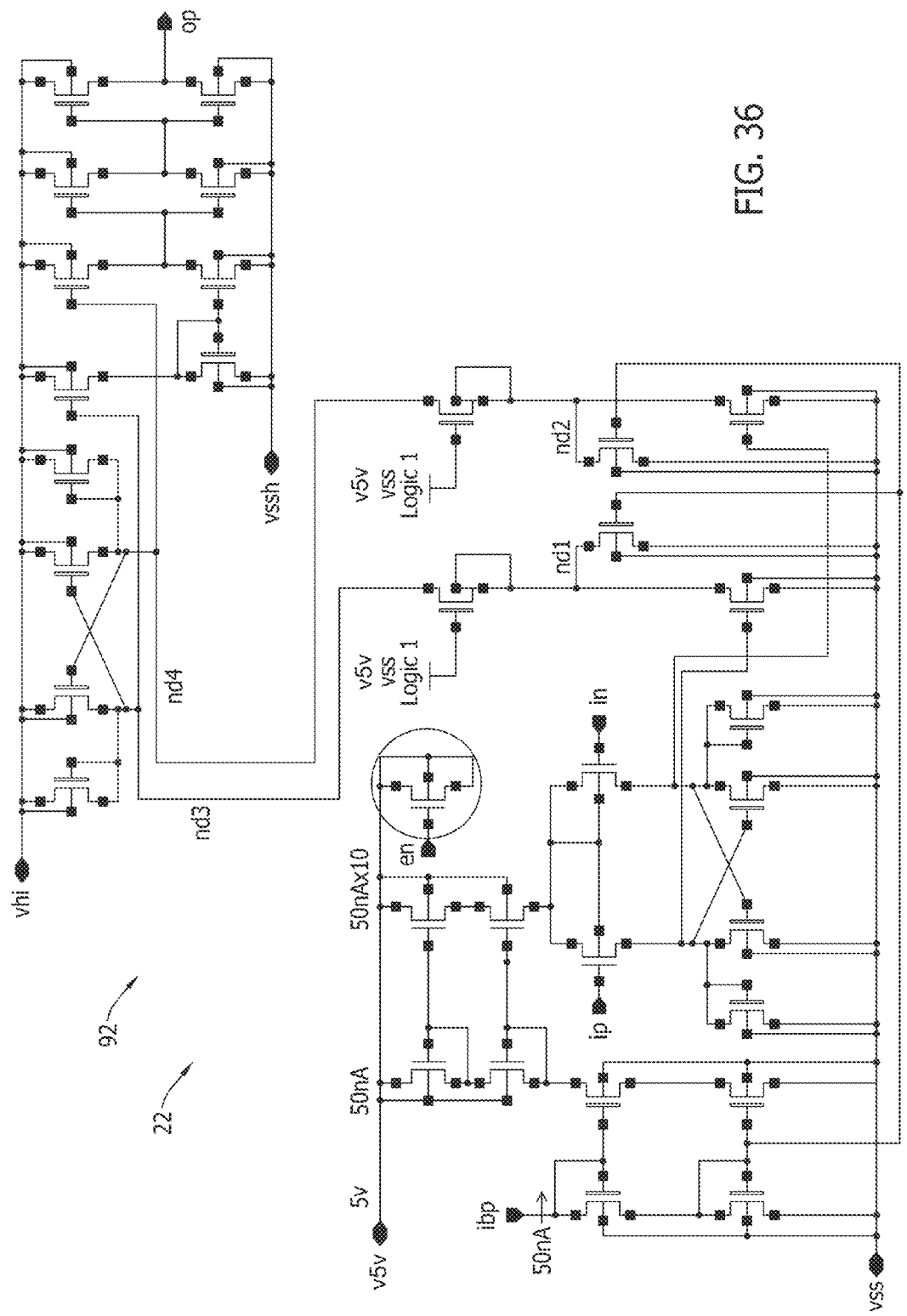
FIG. 36 is a schematic illustration of Level Shifter that may be used with the power circuit shown in FIG. 2, according to an embodiment of the present invention.

FIG. 36 is a schematic illustration of a Level Shifter circuit that may be used with the power circuit 22. In one embodiment, the switch capacitor voltage breakdown circuit 32 and the buck regulator 34 relies on a level shifter that can take a static CMOS level digital signal and voltage shift the signal to various levels. This is done to properly drive the gates of high voltage switches both off and on Tronium PSSoC chip. The level shifter is comprised of a differential pair with a static dc current bias current. The diff pair amplifies the CMOS level signal and then shifts to a higher rail. There are cascodes used in the signal path to avoid any transistor breakdown. The level shifter can be disabled via a p-channel switch to avoid any static current drain. Once the signal is shifted to another rail, it is further amplified converted to single ended and then converted back to static CMOS levels to drive high voltage switches.

Figure 40:
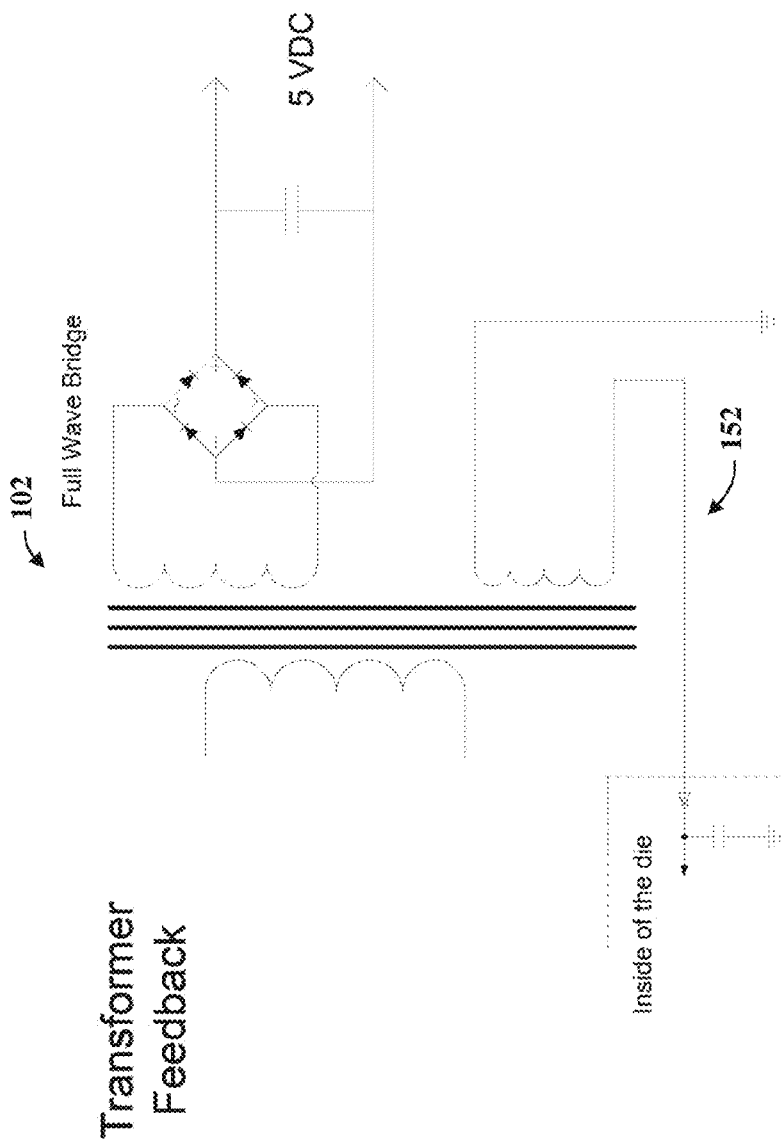
FIG. 40 is a schematic illustration of a portion of the power circuit shown in FIG. 2, according to an embodiment of the present invention; and, FIG. 41 is another schematic illustrations of the power circuit shown in FIG. 2, according to an embodiment of the present invention.

FIGS. 38 and 39 are additional schematic illustrations of the power circuit 22. In one embodiment, the forward converter transformer 102 may include a tertiary winding 152 (shown in FIGS. 39 and 40) that may be used as a replica of the secondary side for current sensing. For example, some Tronium PSSoC applications can run at low voltages and a self driven synchronous rectifier may not be a reliable solution. More gate voltage would ensure a robust system. For example there will be an application for a 1.8 Volt DC output. Assume a 12:1 transformer and a 43 Volts CP_DAC2 setting, 3.6 VDC is the peak voltage on the secondary winding. A 12:2 auxiliary winding can be used to produce 7.2 Volts of gate drive for the synchronous rectifier FETs. The transformer design may include the auxiliary winding 152 on the secondary side to support this requirement.

Figure 41:
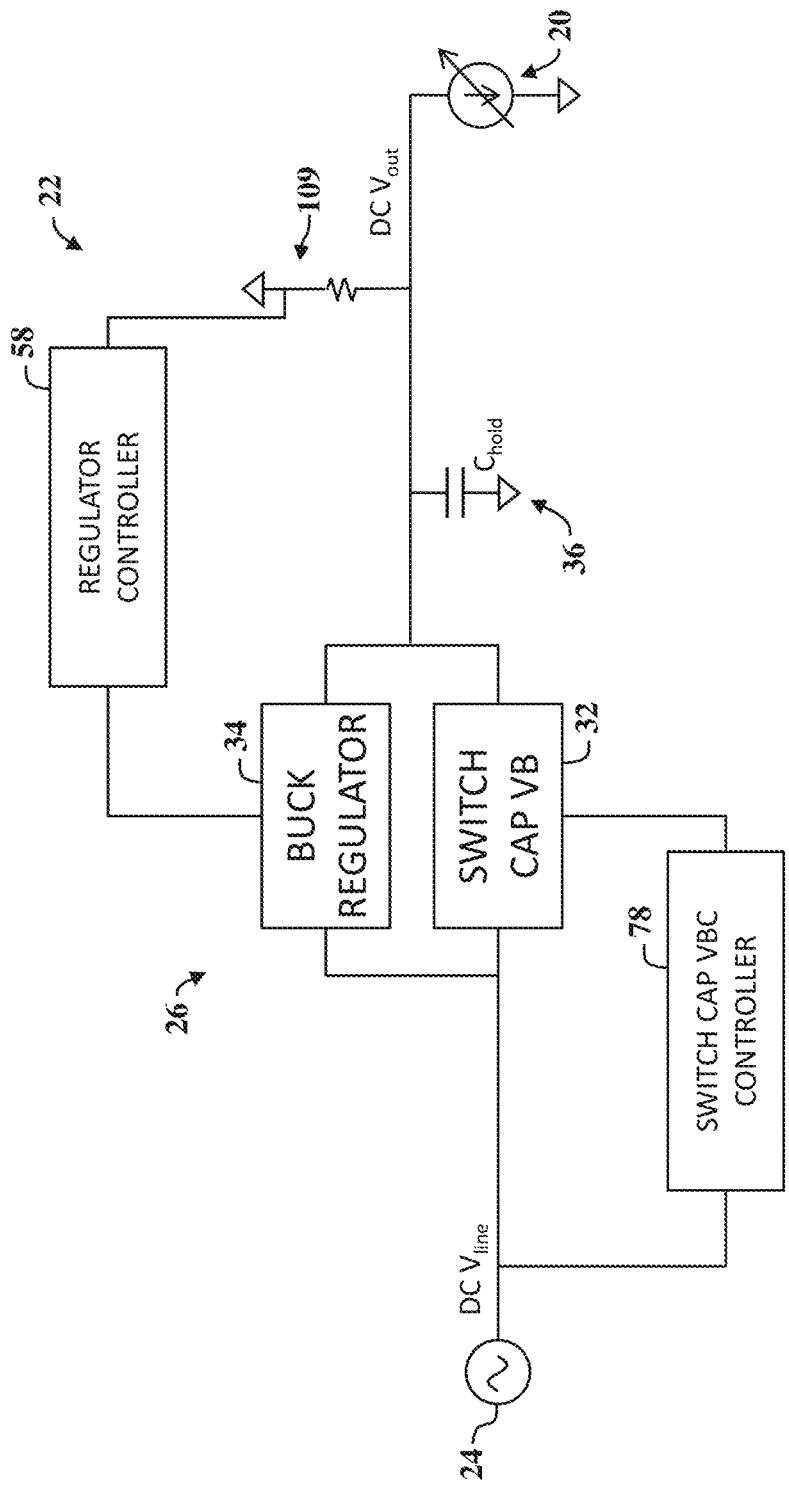

FIG. 41 is a schematic diagram of the power circuit 22 including a DC-DC conversion circuit. In the illustrated embodiment the power circuit 22 includes the switch capacitor voltage breakdown circuit 32 for receiving a DC input power signal and generating a DC output power signal having a lower voltage level. In one embodiment, the power circuit 22 may also include the switch-mode buck regulator 34 coupled in parallel with the SCVBC 32. The high-efficiency switch capacitor voltage breakdown circuit 32 includes a pair of flyback capacitors electrically coupled in parallel, and a plurality of switch assemblies that are electrically coupled to each of the pair of flyback capacitors. In one embodiment, the gates between the capacitors are shared. The switch assemblies may be operated to selectively deliver an input DC power signal to each of the pair of flyback capacitors during a charge phase, and to selectively deliver an output DC power signal to an electronic device during a discharge phase that has a lower voltage level than the input DC power signal. At least one switch assembly may include an N-channel MOSFET switch and a level shifter for delivering a control signal to the N-channel MOSFET switch. In addition, a dickson charge pump may be coupled to the level shifter to receive the input DC power signal and generate an output power signal having a higher voltage level than the input DC signal. The output power signal is delivered to the level shifter for use in operating N-channel MOSFET switch (or closing for other types of MOSFETs). In addition, the switch capacitor voltage breakdown circuit may include a control circuit that includes a voltage sensing circuit for sensing a voltage level of the input DC power signal and a gain controller configured to select a gain setting of the switch capacitor voltage breakdown circuit as a function of the sensed voltage level and operate each of the plurality of switch assemblies as a function of the selected gain setting.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Other aspects and features of the invention can be obtained from a study of the drawings, the disclosure, and the appended claims. The invention may be practiced otherwise than as specifically described within the scope of the appended claims. It should also be noted, that the steps and/or functions listed within the appended claims, notwithstanding the order of which steps and/or functions are listed therein, are not limited to any specific order of operation.

Although specific features of various embodiments of the invention may be shown in some drawings and not in others, this is for convenience only. In accordance with the principles of the invention, any feature of a drawing may be referenced and/or claimed in combination with any feature of any other drawing.

What is claimed is:
1. An electrical circuit for providing electrical power for use in powering electronic devices, comprising:
a primary power circuit adapted to be electrically coupled to an electrical power source, the primary power circuit configured to receive an alternating current (AC) input power signal from the electrical power source and generate an intermediate direct current (DC) power signal, the intermediate DC power signal being generated at a first voltage level that is less than a voltage level of the AC input power signal, the primary power circuit including:
a rectifier circuit configured to receive the AC power input signal from the electrical power source and generate a rectified DC power signal, the rectified DC power signal having a voltage level that is not reduced from the voltage level of the AC input power signal;

a switch capacitor voltage breakdown circuit coupled to the rectifier circuit for receiving the rectified DC power signal from the rectifier circuit and generating the intermediate DC power signal, the switch capacitor voltage breakdown circuit including:
a pair of flyback capacitors;
a plurality of switch assemblies electrically coupled to each of the pair of flyback capacitors, the plurality of switch assemblies being operated between a charge phase and a discharge phase, at least one of the plurality of switch assemblies including:
a MOSFET switch;
at least one level shifter coupled to the MOSFET switch for receiving a CMOS logic signal and delivering a control signal to the MOSFET switch as a function of the CMOS logic signal; and
a dickson charge pump coupled to the level shifter, the dickson charge pump configured to receive the rectified DC power signal and generate an output power signal having a voltage level that is greater than the voltage level of the rectified DC power signal, the output power signal being delivered to the level shifter for use in operating the MOSFET switch; and
a hold capacitor electrically coupled to each of the pair of flyback capacitors, the plurality of switch assemblies being operated to selectively deliver the rectified DC power signal to each of the flyback capacitors during the charge phase and to selectively deliver the intermediate DC power signal to the hold capacitor during the discharge phase;
a buck regulator circuit electrically coupled in parallel with the switch capacitor voltage breakdown circuit; and
a controller programmed to regulate the switch capacitor voltage breakdown circuit at a different frequency than the buck regulator circuit; and
a secondary power circuit electrically coupled to the primary power circuit, the secondary power circuit configured to receive the intermediate DC power signal from the primary power circuit and deliver an output DC power signal to an electronic device, the output DC power signal being delivered at an output voltage level that is less than the first voltage level of the intermediate DC power signal.

2. The electrical circuit in accordance with claim 1, the controller configured to sense the voltage level of the AC input power signal and transmit control signals to the switch capacitor voltage breakdown circuit for regulating the switch assemblies as a function of the sensed voltage level.

3. The electrical circuit in accordance with claim 2, including a vampire load elimination subsystem including a current sensor for sensing a current level of the output DC power signal, the controller configured to shut-off input power to the primary power circuit if the sensed current level is different from a predefined current level.

4. The electrical circuit in accordance with claim 2, including a communications controller coupled to the controller for transmitting control signals to the controller to enable remote operation of the electrical circuit.

5. The electrical circuit in accordance with claim 1, the controller configured to regulate the switch capacitor voltage breakdown circuit to facilitate capacitive isolation.

6. The electrical circuit in accordance with claim 1, the primary power circuit including a second switch capacitor voltage breakdown circuit.

7. The electrical circuit in accordance with claim 1, including a switch capacitor control circuit including:
a voltage sensing circuit for sensing a voltage level of the rectified DC power signal; and
a gain controller configured to select a gain setting of the switch capacitor voltage breakdown circuit as a function of the sensed voltage level and operating each of the plurality of switch assemblies as a function of the selected gain setting.

8. The electrical circuit in accordance with claim 1, the primary power circuit including a buck regulator circuit for receiving the rectified DC power signal from the rectifier circuit and generating a second intermediate DC power signal.

9. The electrical circuit in accordance with claim 1, the secondary power circuit including a forward converter circuit including a primary voltage reduction circuit and a secondary voltage reduction circuit, the primary voltage reduction circuit configured to receive the intermediate DC power signal from the primary power circuit and deliver a secondary DC power signal to the secondary voltage reduction circuit, the secondary DC power signal having a voltage level that is less than the voltage level of the intermediate DC power signal, the secondary voltage reduction circuit configured to receive the secondary DC power signal and generate the output DC power signal being delivered to the electronic device.

10. The electrical circuit in accordance with claim 9, the primary voltage reduction circuit including a transformer, a primary side of the transformer being coupled to the primary power circuit and a secondary side of the transformer being coupled to the secondary voltage reduction circuit.

11. The electrical circuit in accordance with claim 10, including a primary side current sense circuit that is connected to the primary side of the transformer to sense a load current and a load voltage to facilitate regulating the DC output signal.

12. The electrical circuit in accordance with claim 1, the flyback capacitors and the switch assemblies being formed on a semiconductor chip.

13. An electrical circuit for providing electrical power for use in powering electronic devices, comprising:
a primary power circuit adapted to be electrically coupled to an electrical power source, the primary power circuit configured to receive an alternating current (AC) input power signal from the electrical power source and generate an intermediate direct current (DC) power signal, the intermediate DC power signal being generated at a first voltage level that is less than a voltage level of the AC input power signal, the primary power circuit including:
a rectifier circuit configured to receive the AC power input signal from the electrical power source and generate a rectified DC power signal, the rectified DC power signal having a voltage level that is not reduced from the voltage level of the AC input power signal;
a switch capacitor voltage breakdown circuit coupled to the rectifier circuit for receiving the rectified DC power signal from the rectifier circuit and generating a first intermediate DC power signal, the switch capacitor voltage breakdown circuit including:
a pair of flyback capacitors;
a plurality of switch assemblies electrically coupled to each of the pair of flyback capacitors, the plurality of switch assemblies being operated between a charge phase and a discharge phase; and
a hold capacitor electrically coupled to each of the pair of flyback capacitors, the plurality of switch assemblies being operated to selectively deliver the rectified DC power signal to each of the flyback capacitors during the charge phase and to selectively deliver the intermediate DC power signal to the hold capacitor during the discharge phase;

a buck regulator circuit for receiving the rectified DC power signal from the rectifier circuit and generating a second intermediate DC power signal, the buck regulator circuit including a regulator switch assembly coupled to a voltage reduction circuit, the voltage reduction circuit including at least one diode, an inductor, and a capacitor, the regulator switch assembly being operated to selectively deliver the rectified DC power signal to the voltage reduction circuit; and a controller configured to regulate the switch capacitor voltage breakdown circuit at a different frequency than the buck regulator circuit; and a secondary power circuit electrically coupled to the primary power circuit, the secondary power circuit configured to receive the intermediate DC power signal from the primary power circuit and deliver an output DC power signal to an electronic device, the output DC power signal being delivered at an output voltage level that is less than the first voltage level of the intermediate DC power signal.

14. The electrical circuit in accordance with claim 13, the controller including a buck regulator control circuit for providing a pulse-width modulated control signal to the regulator switch assembly to selectively deliver the rectified DC power signal to the voltage reduction circuit, the buck regulator control circuit including:

a voltage sensing circuit for sensing the first voltage level of the intermediate DC power signal; and a regulator controller for generating the pulse-width modulated control signal as a function of the sensed first voltage level, the regulator controller configured to adjust a duty cycle of the control signal being delivered to maintain the voltage level of the intermediate DC power signal at a predefined voltage level.

15. A power module for providing electrical power for use in powering electronic devices, comprising:

at least one switch capacitor voltage breakdown circuit for receiving a power input signal from an electrical power source and generate an intermediate power signal, the at least one switch capacitor voltage breakdown circuit including:
a pair of flyback capacitors; and
a plurality of switch assemblies electrically coupled to each of the pair of flyback capacitors;

a buck regulator circuit electrically coupled in parallel with the switch capacitor voltage breakdown circuit;

an integrated circuit controller programmed to regulate the switch capacitor voltage breakdown circuit at a different frequency than the buck regulator circuit; and a forward converter circuit coupled to at least one switch capacitor voltage breakdown circuit, the forward converter circuit including a transformer coupled to the switch capacitor voltage breakdown circuit for receiving the intermediate power signal and delivering an output power signal to an electronic device.

16. The power module in accordance with claim 15, including the buck regulator circuit including a voltage reduction circuit including at least one diode, an inductor, and a capacitor.

17. The power module in accordance with claim 16, the buck regulator circuit including a regulator switch assembly coupled to the voltage reduction circuit and being operated to selectively deliver the power input signal to the voltage reduction circuit.

18. The power module in accordance with claim 17, including a communications controller coupled to the integrated circuit controller for transmitting control signals to the integrated circuit controller to enable remote operation of the power module.

19. A power module in accordance with claim 15, the at least one switch capacitor voltage breakdown circuit including a hold capacitor electrically coupled to each of the pair of flyback capacitors, the plurality of switch assemblies being operated to selectively deliver the input power signal to each of the flyback capacitors during a charge phase and to selectively deliver the output power signal to the hold capacitor during a discharge phase.

20. The power module in accordance with claim 15, including a semiconductor chip, the flyback capacitors and the switch assemblies being formed on the semiconductor chip.

21. The power module in accordance with claim 15, at least one of the switch assemblies including:
a MOSFET switch; and
a dickson charge pump coupled to the MOSFET switch.

22. The power module in accordance with claim 21, wherein the MOSFET switch includes a high voltage MOSFET formed on a low voltage integrated circuit.

23. The power module in accordance with claim 15, including a vampire load elimination subsystem including a current sensor for sensing a current level of the output power signal and to disconnect input power if the sensed current level is different from a predefined current level.

24. The power module in accordance with claim 12, the semiconductor chip include substrata including at least one of Ohmic silicon, polysilicon, gallium nitride, gallium arsenide, silicon germanium, silicon carbide, and indium phosphide.

25. A power module for providing electrical power for use in powering electronic devices, comprising:

a switch capacitor voltage breakdown circuit for receiving a power input signal from an electrical power source and generate an output power signal, the switch capacitor voltage breakdown circuit including:
a pair of flyback capacitors; and
a plurality of switch assemblies electrically coupled to each of the pair of flyback capacitors;

a buck regulator circuit electrically coupled in parallel with the switch capacitor voltage breakdown circuit; and an integrated circuit controller programmed to regulate the switch capacitor voltage breakdown circuit at a different frequency than the buck regulator circuit.

26. An electrical circuit for providing electrical power for use in powering electronic devices, comprising:

a primary power circuit adapted to be electrically coupled to an electrical power source, the primary power circuit configured to receive an alternating current (AC) input power signal from the electrical power source and generate an intermediate direct current (DC) power signal, the intermediate DC power signal being generated at a first voltage level that is less than a voltage level of the AC input power signal, the primary power circuit including:

a rectifier circuit configured to receive the AC power input signal from the electrical power source and generate a rectified DC power signal, the rectified DC power signal having a voltage level that is not reduced from the voltage level of the AC input power signal;

a switch capacitor voltage breakdown circuit coupled to the rectifier circuit for receiving the rectified DC power signal from the rectifier circuit and generating the intermediate DC power signal, the switch capacitor voltage breakdown circuit including:
a pair of flyback capacitors;
a plurality of switch assemblies electrically coupled to each of the pair of flyback capacitors, the plurality of switch assemblies being operated between a charge phase and a discharge phase; and
a hold capacitor electrically coupled to each of the pair of flyback capacitors, the plurality of switch assemblies being operated to selectively deliver the rectified DC power signal to each of the flyback capacitors during the charge phase and to selectively deliver the intermediate DC power signal to the hold capacitor during the discharge phase; and
a buck regulator circuit for receiving the rectified DC power signal from the rectifier circuit and generating a second intermediate DC power signal;
a secondary power circuit electrically coupled to the primary power circuit, the secondary power circuit configured to receive the intermediate DC power signal from the primary power circuit and deliver an output DC power signal to an electronic device, the output DC power signal being delivered at an output voltage level that is less than the first voltage level of the intermediate DC power signal; and
a controller configured to regulate the switch capacitor voltage breakdown circuit at a different frequency than the buck regulator circuit.

27. A method of assembling a voltage reduction apparatus, including the steps of:
providing a semiconductor chip;
forming a switch capacitor voltage breakdown circuit on the semiconductor chip, the switch capacitor voltage breakdown circuit configured to receive an input DC power signal having an input voltage level from a power source and discharge an output DC power signal having an output voltage level that is less than the input voltage level, the switch capacitor voltage breakdown circuit including a pair of flyback capacitors and a plurality of switch assemblies electrically coupled to each of the pair of flyback capacitors, at least one of the switch assemblies including a MOSFET switch, at least one level shifter coupled to the MOSFET switch for receiving a CMOS logic signal and delivering a control signal to the MOSFET switch as a function of the CMOS logic signal, and a dickson charge pump coupled to the level shifter, the dickson charge pump configured to receive the rectified DC power signal and generate an output power signal having a voltage level that is greater than the voltage level of the rectified DC power signal, the output power signal being delivered to the level shifter for use in operating MOSFET switch forming a buck regulator circuit on the semiconductor chip, the buck regulator circuit electrically coupled in parallel with the switch capacitor voltage breakdown circuit; and forming an integrated circuit controller on the semiconductor chip, the integrated circuit controller programmed to sense the voltage level of input DC power signal and adjust the gain of the switch capacitor voltage breakdown circuit as a function of the sensed voltage level to generate the output DC power signal, and to regulate the switch capacitor voltage breakdown circuit at a different frequency than the buck regulator circuit.

* * * * *